(12) United States Patent
Won Cheol

(10) Patent No.: US 10,580,929 B2
(45) Date of Patent: Mar. 3, 2020

(54) UV LIGHT EMITTING DIODE PACKAGE AND LIGHT EMITTING DIODE MODULE HAVING THE SAME

(71) Applicant: SEOUL VIOSYS CO., LTD., Gyeonggi-do (KR)

(72) Inventor: Seo Won Cheol, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/469,443

(22) Filed: Mar. 24, 2017

(65) Prior Publication Data
US 2017/0288088 A1 Oct. 5, 2017

(30) Foreign Application Priority Data
Mar. 30, 2016 (CN) .................... 2016 2 0257376 U

(51) Int. Cl.
*H01L 33/00* (2010.01)
*H01L 33/38* (2010.01)
(Continued)

(52) U.S. Cl.
CPC ...... *H01L 33/0025* (2013.01); *H01L 33/0075* (2013.01); *H01L 33/06* (2013.01);
(Continued)

(58) Field of Classification Search
CPC .. H01L 33/025; H01L 33/0025; H01L 33/385
See application file for complete search history.

(56) References Cited

U.S. PATENT DOCUMENTS 3,954,534 A  5/1976  Scifres et al.
3,974,514 A  8/1976  Kressel et al.
(Continued)

FOREIGN PATENT DOCUMENTS

CN  1332502 A  1/2002
CN  1497745 A  5/2004
(Continued)

OTHER PUBLICATIONS

US 7,282,743 B2, 10/2007, Sakai et al. (withdrawn)
(Continued)

*Primary Examiner* — Grant S Withers
(74) *Attorney, Agent, or Firm* — Perkins Coie LLP

(57) ABSTRACT

A UV LED package and an LED module including the same. The UV LED package includes an upper semiconductor layer; a mesa disposed under the upper semiconductor layer, having an inclined side surface, and comprising an active layer and a lower semiconductor layer; a first insulation layer covering the mesa and having an opening exposing the upper semiconductor layer; a first contact layer contacting the upper semiconductor layer through the opening of the first insulation layer; a second contact layer formed between the mesa and the first insulation layer and contacting the lower semiconductor layer; a first electrode pad and a second electrode pad disposed under the first contact layer and electrically connected to the first contact layer and second contact layer, respectively; and a second insulation layer located between the first contact layer and the first and second electrode pads, wherein the active layer emits UV light having a wavelength of 405 nm or less. With this structure, the LED package has high efficiency and high heat dissipation characteristics.

57 Claims, 37 Drawing Sheets

(51) Int. Cl.
*H01L 33/06* (2010.01)
*H01L 33/20* (2010.01)
*H01L 33/22* (2010.01)
*H01L 33/32* (2010.01)
*H01L 33/40* (2010.01)
*H01L 33/44* (2010.01)
*H01L 33/46* (2010.01)
*H01L 33/50* (2010.01)
*H01L 33/58* (2010.01)
*H01L 33/62* (2010.01)

(52) U.S. Cl.
CPC .............. *H01L 33/20* (2013.01); *H01L 33/22* (2013.01); *H01L 33/32* (2013.01); *H01L 33/382* (2013.01); *H01L 33/405* (2013.01); *H01L 33/44* (2013.01); *H01L 33/465* (2013.01); *H01L 33/507* (2013.01); *H01L 33/58* (2013.01); *H01L 33/62* (2013.01); *H01L 2933/0016* (2013.01); *H01L 2933/0025* (2013.01); *H01L 2933/0041* (2013.01); *H01L 2933/0058* (2013.01); *H01L 2933/0066* (2013.01)

(56) References Cited

U.S. PATENT DOCUMENTS

| | | |
|---|---|---|
| 4,329,625 A | 5/1982 | Nishizawa et al. |
| 4,499,655 A | 2/1985 | Anthony |
| 4,612,083 A | 9/1986 | Yasumoto et al. |
| 4,712,721 A | 12/1987 | Noel et al. |
| 4,774,632 A | 9/1988 | Neugebauer |
| 4,807,021 A | 2/1989 | Okumura |
| 4,824,767 A | 4/1989 | Chambers et al. |
| 4,978,639 A | 12/1990 | Hua et al. |
| 5,003,359 A | 3/1991 | Abeles |
| 5,016,138 A | 5/1991 | Woodman |
| 5,115,441 A | 5/1992 | Kopf et al. |
| 5,166,097 A | 11/1992 | Tanielian |
| 5,192,987 A | 3/1993 | Khan et al. |
| 5,212,115 A | 5/1993 | Cho et al. |
| 5,229,647 A | 7/1993 | Gnadinger |
| 5,256,596 A | 10/1993 | Ackley et al. |
| 5,260,169 A | 11/1993 | Nakano |
| 5,268,326 A | 12/1993 | Lesk et al. |
| 5,270,261 A | 12/1993 | Bertin et al. |
| 5,393,990 A | 2/1995 | Kohn |
| 5,394,010 A | 2/1995 | Tazawa et al. |
| 5,399,898 A | 3/1995 | Rostoker |
| 5,408,123 A | 4/1995 | Murai |
| 5,411,918 A | 5/1995 | Keible et al. |
| 5,414,281 A | 5/1995 | Watabe et al. |
| 5,419,806 A | 5/1995 | Huebner |
| 5,420,064 A | 5/1995 | Okonogi et al. |
| 5,463,280 A | 10/1995 | Johnson |
| 5,487,999 A | 1/1996 | Farnworth |
| 5,491,350 A | 2/1996 | Unno et al. |
| 5,528,057 A | 6/1996 | Yanagase et al. |
| 5,557,115 A | 9/1996 | Shakuda |
| 5,563,079 A | 10/1996 | Shin et al. |
| 5,587,342 A | 12/1996 | Lin et al. |
| 5,608,264 A | 3/1997 | Gaul |
| 5,618,752 A | 4/1997 | Gaul |
| 5,627,106 A | 5/1997 | Hsu |
| 5,646,067 A | 7/1997 | Gaul |
| 5,648,684 A | 7/1997 | Bertin et al. |
| 5,682,062 A | 10/1997 | Gaul |
| 5,696,389 A | 12/1997 | Ishikawa et al. |
| 5,712,175 A | 1/1998 | Yoshida |
| 5,744,828 A | 4/1998 | Nozaki et al. |
| 5,751,013 A | 5/1998 | Kidoguchi et al. |
| 5,756,395 A | 5/1998 | Rostoker et al. |
| 5,757,445 A | 5/1998 | Vu et al. |
| 5,767,001 A | 6/1998 | Bertagnolli et al. |
| 5,779,924 A | 7/1998 | Krames et al. |
| 5,793,062 A | 8/1998 | Kish et al. |
| 5,793,105 A | 8/1998 | Pace |
| 5,795,619 A | 8/1998 | Lin et al. |
| 5,814,889 A | 9/1998 | Gaul |
| 5,846,879 A | 12/1998 | Winnerl et al. |
| 5,851,894 A | 12/1998 | Ramm |
| 5,886,401 A | 3/1999 | Liu |
| 5,898,185 A | 4/1999 | Bojarczuk et al. |
| 5,903,056 A | 5/1999 | Canning et al. |
| 5,930,596 A | 7/1999 | Klose et al. |
| 5,943,597 A | 8/1999 | Kleffner et al. |
| 5,959,316 A | 9/1999 | Lowery |
| 5,973,396 A | 10/1999 | Farnworth |
| 5,976,769 A | 11/1999 | Chapman |
| 5,986,324 A | 11/1999 | Adlerstein et al. |
| 5,998,232 A | 12/1999 | Maruska |
| 6,004,881 A | 12/1999 | Bozada et al. |
| 6,018,167 A | 1/2000 | Oota |
| 6,046,464 A | 4/2000 | Schetzina |
| 6,066,861 A | 5/2000 | Hoehn et al. |
| RE36,747 E | 6/2000 | Manabe et al. |
| 6,071,780 A | 6/2000 | Okamoto et al. |
| 6,075,710 A | 6/2000 | Lau |
| 6,091,085 A | 7/2000 | Lester |
| 6,114,716 A | 9/2000 | Boles et al. |
| 6,150,197 A | 11/2000 | Boles et al. |
| 6,153,503 A | 11/2000 | Lin et al. |
| 6,177,685 B1 | 1/2001 | Teraguchi et al. |
| 6,185,241 B1 | 2/2001 | Sun |
| 6,194,743 B1 | 2/2001 | Kondoh et al. |
| 6,197,609 B1 | 3/2001 | Tsutsui et al. |
| 6,208,680 B1 | 3/2001 | Chirovsky et al. |
| 6,222,207 B1 | 4/2001 | Carter-coman et al. |
| 6,268,114 B1 | 7/2001 | Wen et al. |
| 6,274,924 B1 | 8/2001 | Carey et al. |
| 6,278,136 B1 | 8/2001 | Nitta |
| 6,307,218 B1 | 10/2001 | Steigerwald et al. |
| 6,316,820 B1 | 11/2001 | Schmitz et al. |
| 6,326,701 B1 | 12/2001 | Shinogi et al. |
| 6,331,450 B1 | 12/2001 | Uemura |
| 6,345,902 B2 | 2/2002 | Ohkohdo et al. |
| 6,362,069 B1 | 3/2002 | Forrest et al. |
| 6,369,448 B1 | 4/2002 | McCormick |
| 6,375,340 B1 | 4/2002 | Biebl et al. |
| 6,407,448 B2 | 6/2002 | Chun |
| 6,410,942 B1 | 6/2002 | Thibeault et al. |
| 6,424,031 B1 | 7/2002 | Glenn |
| 6,440,836 B1 | 8/2002 | Lu et al. |
| 6,451,875 B1 | 9/2002 | Suga et al. |
| 6,462,358 B1 | 10/2002 | Lin et al. |
| 6,463,088 B1 | 10/2002 | Baillargeon et al. |
| 6,468,821 B2 | 10/2002 | Maeda et al. |
| 6,469,393 B2 | 10/2002 | Oya |
| 6,472,688 B2 | 10/2002 | Miyata |
| 6,472,718 B2 | 10/2002 | Lell |
| 6,480,389 B1 | 11/2002 | Shie et al. |
| 6,486,499 B1 | 11/2002 | Krames et al. |
| 6,489,637 B1 | 12/2002 | Sakamoto et al. |
| 6,495,862 B1 | 12/2002 | Okazaki et al. |
| 6,504,301 B1 | 1/2003 | Lowery |
| 6,514,782 B1 | 2/2003 | Wierer et al. |
| 6,517,218 B2 | 2/2003 | Hochstein |
| 6,518,079 B2 | 2/2003 | Imler |
| 6,518,598 B1 | 2/2003 | Chen |
| 6,518,665 B1 | 2/2003 | Westby et al. |
| 6,521,914 B2 | 2/2003 | Krames et al. |
| 6,547,249 B2 | 4/2003 | Collins et al. |
| 6,555,917 B1 | 4/2003 | Heo |
| 6,562,643 B2 | 5/2003 | Chen |
| 6,573,537 B1 | 6/2003 | Steigerwald et al. |
| 6,576,488 B2 | 6/2003 | Collins et al. |
| 6,580,096 B2 | 6/2003 | Chen et al. |
| 6,580,152 B2 | 6/2003 | Hasegawa |
| 6,593,160 B2 | 7/2003 | Carter-Coman et al. |
| 6,614,172 B2 | 9/2003 | Chiu et al. |
| 6,630,689 B2 | 10/2003 | Bhat et al. |
| 6,630,691 B1 | 10/2003 | Mueller-Mach et al. |
| 6,635,508 B2 | 10/2003 | Arai et al. |

(56) References Cited

U.S. PATENT DOCUMENTS

| | | |
|---|---|---|
| 6,635,902 B1 | 10/2003 | Lin |
| 6,638,792 B2 | 10/2003 | Hui et al. |
| 6,642,072 B2 | 11/2003 | Inoue et al. |
| 6,642,618 B2 | 11/2003 | Yagi et al. |
| 6,642,652 B2 | 11/2003 | Collins et al. |
| 6,653,216 B1 | 11/2003 | Shimomaki et al. |
| 6,656,828 B1 | 12/2003 | Maitani et al. |
| 6,657,236 B1 | 12/2003 | Thibeault et al. |
| 6,658,040 B1 | 12/2003 | Hu et al. |
| 6,661,029 B1 | 12/2003 | Duggal |
| 6,686,676 B2 | 2/2004 | Mcnulty et al. |
| 6,693,306 B2 | 2/2004 | Chen et al. |
| 6,696,703 B2 | 2/2004 | Mueller-mach et al. |
| 6,730,940 B1 | 5/2004 | Steranka et al. |
| 6,740,906 B2 | 5/2004 | Slater et al. |
| 6,741,029 B2 | 5/2004 | Matsubara et al. |
| 6,751,245 B1 | 6/2004 | Wasserbauer et al. |
| 6,753,599 B2 | 6/2004 | Kim |
| 6,756,731 B1 | 6/2004 | Sano |
| 6,759,752 B2 | 7/2004 | Camenforte et al. |
| 6,768,190 B2 | 7/2004 | Yang et al. |
| 6,775,310 B2 | 8/2004 | Sai et al. |
| 6,791,119 B2 | 9/2004 | Slater et al. |
| 6,791,259 B1 | 9/2004 | Stokes et al. |
| 6,798,806 B1 | 9/2004 | Johnson et al. |
| 6,800,500 B2 | 10/2004 | Coman et al. |
| 6,812,502 B1 | 11/2004 | Chien et al. |
| 6,815,254 B2 | 11/2004 | Mistry et al. |
| 6,818,532 B2 | 11/2004 | Yeom et al. |
| 6,818,545 B2 | 11/2004 | Lee et al. |
| 6,822,993 B2 | 11/2004 | Lee et al. |
| 6,828,596 B2 | 12/2004 | Steigerwald et al. |
| 6,828,665 B2 | 12/2004 | Pu et al. |
| 6,833,564 B2 | 12/2004 | Shen et al. |
| 6,838,702 B1 | 1/2005 | Ho |
| 6,849,472 B2 | 2/2005 | Krames et al. |
| 6,852,558 B2 | 2/2005 | Lee et al. |
| 6,858,880 B2 | 2/2005 | Horiuchi et al. |
| 6,861,761 B2 | 3/2005 | Yang et al. |
| 6,867,505 B2 | 3/2005 | Lee et al. |
| 6,869,812 B1 | 3/2005 | Liu |
| 6,870,311 B2 | 3/2005 | Mueller et al. |
| 6,871,982 B2 | 3/2005 | Holman et al. |
| 6,876,008 B2 | 4/2005 | Bhat et al. |
| 6,885,035 B2 | 4/2005 | Bhat et al. |
| 6,885,690 B2 | 4/2005 | Aggerstam et al. |
| 6,888,171 B2 | 5/2005 | Liu et al. |
| 6,891,197 B2 | 5/2005 | Bhat et al. |
| 6,906,416 B2 | 6/2005 | Kamezos |
| 6,917,057 B2 | 7/2005 | Stokes et al. |
| 6,924,160 B2 | 8/2005 | Wei et al. |
| 6,924,437 B1 | 8/2005 | Creekmore et al. |
| 6,924,514 B2 | 8/2005 | Suenaga |
| 6,943,433 B2 | 9/2005 | Kamada |
| 6,946,309 B2 | 9/2005 | Camras et al. |
| 6,949,771 B2 | 9/2005 | Yoganandan et al. |
| 6,953,255 B2 | 10/2005 | Horiuchi et al. |
| 6,953,952 B2 | 10/2005 | Asakawa |
| 6,956,245 B2 | 10/2005 | Senda et al. |
| 6,957,899 B2 | 10/2005 | Jiang et al. |
| 6,959,856 B2 | 11/2005 | Oh et al. |
| 6,960,485 B2 | 11/2005 | Uemura et al. |
| 6,964,877 B2 | 11/2005 | Chen et al. |
| 6,969,626 B2 | 11/2005 | Guo et al. |
| 6,969,946 B2 | 11/2005 | Steranka et al. |
| 6,972,438 B2 | 12/2005 | Li et al. |
| 6,977,396 B2 | 12/2005 | Shen et al. |
| 6,995,401 B2 | 2/2006 | Yamada et al. |
| 6,995,402 B2 | 2/2006 | Ludowise et al. |
| 6,995,474 B1 | 2/2006 | Ho et al. |
| 7,005,324 B2 | 2/2006 | Imai |
| 7,005,679 B2 | 2/2006 | Tarsa et al. |
| 7,009,199 B2 | 3/2006 | Hall |
| 7,023,022 B2 | 4/2006 | Eliashevich et al. |
| 7,026,181 B2 | 4/2006 | Guo et al. |
| 7,026,659 B2 | 4/2006 | Slater et al. |
| 7,026,709 B2 | 4/2006 | Tsai et al. |
| 7,034,340 B2 | 4/2006 | Yukimoto |
| 7,045,828 B2 | 5/2006 | Shimizu et al. |
| 7,048,361 B2 | 5/2006 | Schmachtenberg et al. |
| 7,049,635 B2 | 5/2006 | Sano et al. |
| 7,054,345 B2 | 5/2006 | Ryou et al. |
| 7,067,361 B2 | 6/2006 | Allen et al. |
| 7,067,849 B2 | 6/2006 | Yoo |
| 7,078,252 B2 | 7/2006 | Uemura |
| 7,080,932 B2 | 7/2006 | Keuper |
| 7,095,061 B2 | 8/2006 | Steigerwald et al. |
| 7,105,860 B2 | 9/2006 | Shei et al. |
| 7,115,998 B2 | 10/2006 | Hiatt et al. |
| 7,119,003 B2 | 10/2006 | Bernier et al. |
| 7,119,422 B2 | 10/2006 | Chin |
| 7,125,734 B2 | 10/2006 | Sackrison et al. |
| 7,132,691 B1 | 11/2006 | Tanabe et al. |
| 7,138,660 B2 | 11/2006 | Ota |
| 7,141,825 B2 | 11/2006 | Horio et al. |
| 7,148,517 B2 | 12/2006 | Tu et al. |
| 7,154,125 B2 | 12/2006 | Koide et al. |
| 7,157,294 B2 | 1/2007 | Uemura et al. |
| 7,157,746 B2 | 1/2007 | Ota |
| 7,170,111 B2 | 1/2007 | Saxler |
| 7,170,151 B2 | 1/2007 | Elpedes et al. |
| 7,173,277 B2 | 2/2007 | Tamura et al. |
| 7,179,670 B2 | 2/2007 | Shelton et al. |
| 7,183,586 B2 | 2/2007 | Ichihara et al. |
| 7,186,302 B2 | 3/2007 | Chakraborty et al. |
| 7,186,580 B2 | 3/2007 | Tran et al. |
| 7,190,005 B2 | 3/2007 | Gibb et al. |
| 7,208,772 B2 | 4/2007 | Lee et al. |
| 7,210,819 B2 | 5/2007 | Jiang et al. |
| 7,211,832 B2 | 5/2007 | Hirose |
| 7,213,942 B2 | 5/2007 | Jiang et al. |
| 7,217,583 B2 | 5/2007 | Negley et al. |
| 7,221,044 B2 | 5/2007 | Fan et al. |
| 7,265,374 B2 | 9/2007 | Lee et al. |
| 7,271,421 B2 | 9/2007 | Yukimoto et al. |
| 7,276,739 B2 | 10/2007 | Chen et al. |
| 7,279,350 B2 | 10/2007 | Wu et al. |
| 7,279,783 B1 | 10/2007 | Fjelstad et al. |
| 7,285,801 B2 | 10/2007 | Eliashevich et al. |
| 7,285,850 B2 | 10/2007 | Poo et al. |
| 7,298,033 B2 | 11/2007 | Yoo |
| 7,310,458 B2 | 12/2007 | Wehrly |
| 7,317,211 B2 | 1/2008 | Watanabe et al. |
| 7,321,161 B2 | 1/2008 | Teixeira et al. |
| 7,335,517 B2 | 2/2008 | Hayasaka et al. |
| 7,335,920 B2 | 2/2008 | Denbaars et al. |
| 7,338,169 B2 | 3/2008 | Somani |
| 7,342,357 B2 | 3/2008 | Sakano et al. |
| 7,348,212 B2 | 3/2008 | Schiaffino et al. |
| 7,355,274 B2 | 4/2008 | Lim |
| 7,361,938 B2 | 4/2008 | Mueller et al. |
| 7,361,940 B2 | 4/2008 | Kim et al. |
| 7,364,982 B2 | 4/2008 | Furukawa et al. |
| 7,365,374 B2 | 4/2008 | Piner et al. |
| 7,365,427 B2 | 4/2008 | Lu et al. |
| 7,372,082 B2 | 5/2008 | Kim et al. |
| 7,375,380 B2 | 5/2008 | Asahara et al. |
| 7,391,105 B2 | 6/2008 | Yeom |
| 7,391,153 B2 | 6/2008 | Suehiro et al. |
| 7,405,433 B2 | 7/2008 | Chew |
| 7,413,918 B2 | 8/2008 | Tran et al. |
| 7,417,259 B2 | 8/2008 | Sakai et al. |
| 7,419,894 B2 | 9/2008 | Makiyama et al. |
| 7,420,814 B2 | 9/2008 | Kim et al. |
| 7,432,142 B2 | 10/2008 | Saxler et al. |
| 7,436,000 B2 | 10/2008 | Kim et al. |
| 7,439,166 B1 | 10/2008 | Milosavljevic et al. |
| 7,446,028 B2 | 11/2008 | Hiatt et al. |
| 7,446,341 B2 | 11/2008 | Bader et al. |
| 7,456,035 B2 | 11/2008 | Eliashevich et al. |
| 7,456,495 B2 | 11/2008 | Pohl et al. |
| 7,470,938 B2 | 12/2008 | Lee et al. |
| 7,473,934 B2 | 1/2009 | Nagai et al. |
| 7,474,681 B2 | 1/2009 | Lin et al. |

(56) References Cited

U.S. PATENT DOCUMENTS

| | | |
|---|---|---|
| 7,486,867 B2 | 2/2009 | Wang |
| 7,488,988 B2 | 2/2009 | Lin et al. |
| 7,488,989 B2 | 2/2009 | Nitta et al. |
| 7,489,086 B2 | 2/2009 | Miskin et al. |
| 7,491,976 B2 | 2/2009 | Takeuchi et al. |
| 7,501,662 B2 | 3/2009 | Sonobe et al. |
| 7,511,311 B2 | 3/2009 | Kususe et al. |
| 7,524,686 B2 | 4/2009 | Chu et al. |
| 7,525,248 B1 | 4/2009 | Fan |
| 7,530,712 B2 | 5/2009 | Lin et al. |
| 7,531,843 B2 | 5/2009 | Lin et al. |
| 7,535,028 B2 | 5/2009 | Fan et al. |
| 7,544,524 B2 | 6/2009 | Lin et al. |
| 7,554,126 B2 | 6/2009 | Higashi et al. |
| 7,557,443 B2 | 7/2009 | Ye et al. |
| 7,564,887 B2 | 7/2009 | Wang et al. |
| 7,566,639 B2 | 7/2009 | Kohda |
| 7,566,910 B2 | 7/2009 | Kim et al. |
| 7,573,074 B2 | 8/2009 | Shum et al. |
| 7,589,355 B2 | 9/2009 | Tomoda et al. |
| 7,589,408 B2 | 9/2009 | Weng et al. |
| 7,592,194 B2 | 9/2009 | Jonda et al. |
| 7,592,633 B2 | 9/2009 | Shakuda |
| 7,592,637 B2 | 9/2009 | Zimmerman et al. |
| 7,601,989 B2 | 10/2009 | Epler et al. |
| 7,608,921 B2 | 10/2009 | Pendse |
| 7,622,746 B1 | 11/2009 | Lester et al. |
| 7,626,210 B2 | 12/2009 | Shchekin et al. |
| 7,626,211 B2 | 12/2009 | Sugiura et al. |
| 7,635,643 B2 | 12/2009 | Daubenspeck et al. |
| 7,635,874 B2 | 12/2009 | Miller et al. |
| 7,645,688 B2 | 1/2010 | Lee et al. |
| 7,646,036 B2 | 1/2010 | Kozawa et al. |
| 7,648,849 B2 | 1/2010 | Lee et al. |
| 7,652,298 B2 | 1/2010 | Chen et al. |
| 7,652,304 B2 | 1/2010 | Steigerwald et al. |
| 7,671,374 B2 | 3/2010 | Wang et al. |
| 7,705,370 B2 | 4/2010 | Fitzgerald |
| 7,709,282 B2 | 5/2010 | Fukshima et al. |
| 7,709,849 B1 | 5/2010 | Kal et al. |
| 7,714,342 B2 | 5/2010 | Lee et al. |
| 7,714,348 B2 | 5/2010 | Fan et al. |
| 7,719,120 B2 | 5/2010 | Hiatt et al. |
| 7,723,735 B2 | 5/2010 | Matsuda |
| 7,723,736 B2 | 5/2010 | Lee et al. |
| 7,732,825 B2 | 6/2010 | Kim et al. |
| 7,750,469 B2 | 7/2010 | Cho et al. |
| 7,750,485 B2 | 7/2010 | Takahashi et al. |
| 7,759,804 B2 | 7/2010 | Kanaoka et al. |
| 7,763,900 B2 | 7/2010 | Lee |
| 7,768,020 B2 | 8/2010 | Kim et al. |
| 7,786,498 B2 | 8/2010 | Choi et al. |
| 7,791,103 B2 | 9/2010 | Oshima |
| 7,795,623 B2 | 9/2010 | Emerson et al. |
| 7,824,937 B2 | 11/2010 | Suehiro et al. |
| 7,834,364 B2 | 11/2010 | Lee |
| 7,838,315 B2 | 11/2010 | Yang et al. |
| 7,838,891 B2 | 11/2010 | Lee et al. |
| 7,842,959 B2 | 11/2010 | Lee et al. |
| 7,843,074 B2 | 11/2010 | Gao et al. |
| 7,846,755 B2 | 12/2010 | Kal et al. |
| 7,868,343 B2 | 1/2011 | Negley et al. |
| 7,868,354 B2 | 1/2011 | Garcia et al. |
| 7,880,181 B2 | 2/2011 | Yoon et al. |
| 7,893,547 B2 | 2/2011 | Huang et al. |
| 7,902,572 B2 | 3/2011 | Ahn et al. |
| 7,906,788 B2 | 3/2011 | Nagai |
| 7,923,198 B2 | 4/2011 | Sawada |
| 7,943,286 B2 | 5/2011 | Xu et al. |
| 7,951,625 B2 | 5/2011 | Kamei |
| 7,968,897 B2 | 6/2011 | Hata et al. |
| 7,998,761 B2 | 8/2011 | Kim et al. |
| 7,999,271 B2 | 8/2011 | Kim et al. |
| 8,021,904 B2 | 9/2011 | Chitnis |
| 8,049,330 B2 | 11/2011 | Tain et al. |
| 8,076,212 B2 | 12/2011 | Takahashi et al. |
| 8,076,680 B2 | 12/2011 | Lee et al. |
| 8,097,937 B2 | 1/2012 | Bogner et al. |
| 8,118,451 B2 | 2/2012 | Householder et al. |
| 8,129,917 B2 | 3/2012 | Kim et al. |
| 8,148,905 B2 | 4/2012 | Miskin et al. |
| 8,149,509 B2 | 4/2012 | Howes |
| 8,159,000 B2 | 4/2012 | Lee et al. |
| 8,163,582 B2 | 4/2012 | Zimmerman et al. |
| 8,179,938 B2 | 5/2012 | Kim |
| 8,183,072 B2 | 5/2012 | Seo et al. |
| 8,183,691 B2 | 5/2012 | Kanaoka et al. |
| 8,188,488 B2 | 5/2012 | Andrews et al. |
| 8,207,543 B2 | 6/2012 | Hasnain |
| 8,211,724 B2 | 7/2012 | Kim et al. |
| 8,222,672 B2 | 7/2012 | Kanamura et al. |
| 8,227,272 B2 | 7/2012 | Lee et al. |
| 8,237,173 B2 | 8/2012 | Nagai |
| 8,268,715 B2 | 9/2012 | Hiatt et al. |
| 8,269,228 B2 | 9/2012 | Lee et al. |
| 8,269,238 B2 | 9/2012 | Kim et al. |
| 8,288,781 B2 | 10/2012 | Seo et al. |
| 8,299,476 B2 | 10/2012 | Lee et al. |
| 8,319,246 B2 | 11/2012 | Sugizaki |
| 8,334,091 B2 | 12/2012 | Nozaki et al. |
| 8,334,155 B2 | 12/2012 | Krames et al. |
| 8,337,071 B2 | 12/2012 | Negley et al. |
| 8,338,844 B2 | 12/2012 | Katsuno et al. |
| 8,350,279 B2 | 1/2013 | Lee et al. |
| 8,368,100 B2 | 2/2013 | Donofrio et al. |
| 8,368,190 B2 | 2/2013 | Lee et al. |
| 8,445,933 B2 | 5/2013 | Lee et al. |
| 8,450,751 B2 | 5/2013 | Engl et al. |
| 8,476,648 B2 | 7/2013 | Lee et al. |
| 8,536,612 B2 | 9/2013 | Lee et al. |
| 8,581,291 B2 | 11/2013 | Shimokawa et al. |
| 8,643,029 B2 | 2/2014 | Lee et al. |
| 8,648,369 B2 | 2/2014 | Seo et al. |
| 8,716,727 B2 | 5/2014 | Lee et al. |
| 8,809,893 B2 | 8/2014 | Choi |
| 8,821,961 B2 | 9/2014 | Bondoux et al. |
| 8,835,937 B2 | 9/2014 | Wirth et al. |
| 8,846,521 B2 | 9/2014 | Sugizaki |
| 8,847,254 B2 | 9/2014 | Roth et al. |
| 8,847,266 B2 | 9/2014 | Choi et al. |
| 8,878,245 B2 | 11/2014 | Parikh et al. |
| 8,896,011 B2 | 11/2014 | Yoon et al. |
| 8,928,052 B2 | 1/2015 | Engl et al. |
| 8,937,326 B2 | 1/2015 | Lee et al. |
| 8,964,020 B2 | 2/2015 | Hersee |
| 8,981,395 B2 | 3/2015 | Choi |
| 9,070,851 B2 | 6/2015 | Seo et al. |
| 9,219,196 B2 | 12/2015 | Seo et al. |
| 9,293,664 B2 | 3/2016 | Seo et al. |
| 9,543,490 B2 | 1/2017 | Seo et al. |
| 10,069,048 B2 | 9/2018 | Seo et al. |
| 2002/0040982 A1 | 4/2002 | Uemura |
| 2002/0063258 A1 | 5/2002 | Motoki |
| 2002/0068373 A1 | 6/2002 | Lo et al. |
| 2002/0070387 A1 | 6/2002 | Wang et al. |
| 2003/0010989 A1 | 1/2003 | Yukimoto |
| 2003/0025212 A1 | 2/2003 | Bhat et al. |
| 2003/0067082 A1 | 4/2003 | Moshayedi |
| 2003/0222270 A1 | 12/2003 | Uemura |
| 2003/0230606 A1 | 12/2003 | Devinie |
| 2004/0012958 A1 | 1/2004 | Hashimoto et al. |
| 2004/0026708 A1 | 2/2004 | Chen |
| 2004/0206970 A1 | 10/2004 | Martin |
| 2004/0211972 A1 | 10/2004 | Du et al. |
| 2005/0001225 A1 | 1/2005 | Yoshimura et al. |
| 2005/0006659 A1 | 1/2005 | Ng et al. |
| 2005/0056855 A1 | 3/2005 | Lin et al. |
| 2005/0077531 A1 | 4/2005 | Kim |
| 2005/0104225 A1 | 5/2005 | Huang |
| 2005/0110032 A1 | 5/2005 | Saito et al. |
| 2005/0194605 A1 | 9/2005 | Shelton et al. |
| 2005/0208751 A1 | 9/2005 | Oh et al. |
| 2005/0248259 A1 | 11/2005 | Chang |
| 2005/0274970 A1 | 12/2005 | Ludowise |

(56) References Cited

U.S. PATENT DOCUMENTS

| | | |
|---|---|---|
| 2006/0001035 A1 | 1/2006 | Suehiro et al. |
| 2006/0043433 A1 | 3/2006 | Matsushita |
| 2006/0081858 A1 | 4/2006 | Lin et al. |
| 2006/0081869 A1 | 4/2006 | Lu et al. |
| 2006/0115927 A1 | 6/2006 | Yeo et al. |
| 2006/0131599 A1 | 6/2006 | Slater et al. |
| 2006/0138443 A1 | 6/2006 | Fan et al. |
| 2006/0183625 A1 | 8/2006 | Miyahara |
| 2006/0202225 A1 | 9/2006 | Kim et al. |
| 2006/0202272 A1 | 9/2006 | Wu et al. |
| 2006/0214173 A1 | 9/2006 | Beeson et al. |
| 2007/0114563 A1 | 5/2007 | Paek et al. |
| 2007/0145392 A1 | 6/2007 | Haberern et al. |
| 2007/0257901 A1 | 11/2007 | Gotou et al. |
| 2007/0284598 A1 | 12/2007 | Shakuda et al. |
| 2008/0029761 A1 | 2/2008 | Peng |
| 2008/0087902 A1 | 4/2008 | Lee et al. |
| 2008/0090329 A1 | 4/2008 | Wehrly |
| 2008/0099890 A1 | 5/2008 | Chen et al. |
| 2008/0111224 A1 | 5/2008 | Byun et al. |
| 2008/0179602 A1 | 7/2008 | Negley et al. |
| 2008/0182369 A1 | 7/2008 | Jeong et al. |
| 2008/0261340 A1 | 10/2008 | Matsuo et al. |
| 2008/0290364 A1 | 11/2008 | Kamiya et al. |
| 2009/0039359 A1 | 2/2009 | Yoon et al. |
| 2009/0050907 A1 | 2/2009 | Yuan et al. |
| 2009/0085048 A1 | 4/2009 | Lee et al. |
| 2009/0140272 A1 | 6/2009 | Beeson et al. |
| 2009/0140279 A1 | 6/2009 | Zimmerman et al. |
| 2009/0152740 A1 | 6/2009 | Park et al. |
| 2009/0267085 A1 | 10/2009 | Lee et al. |
| 2009/0283787 A1 | 11/2009 | Donofrio et al. |
| 2010/0059785 A1 | 3/2010 | Lin et al. |
| 2010/0078656 A1 | 4/2010 | Seo et al. |
| 2010/0117111 A1 | 5/2010 | Illek et al. |
| 2010/0117188 A1 | 5/2010 | Waldrab et al. |
| 2010/0127397 A1 | 5/2010 | Chen et al. |
| 2010/0148190 A1 | 6/2010 | Kim et al. |
| 2010/0148198 A1 | 6/2010 | Sugizaki et al. |
| 2010/0155941 A1 | 6/2010 | Matsuki et al. |
| 2010/0163887 A1 | 7/2010 | Kim et al. |
| 2010/0163900 A1 | 7/2010 | Seo et al. |
| 2010/0176405 A1 | 7/2010 | Villard |
| 2010/0244060 A1 | 9/2010 | Lee et al. |
| 2011/0101414 A1 | 5/2011 | Thompson et al. |
| 2011/0140135 A1 | 6/2011 | Lee et al. |
| 2011/0169040 A1 | 7/2011 | Seo et al. |
| 2011/0175129 A1 | 7/2011 | Lee et al. |
| 2011/0220931 A1 | 9/2011 | Kojima |
| 2011/0297965 A1 | 12/2011 | Akimoto et al. |
| 2012/0025214 A1 | 2/2012 | Ruan et al. |
| 2012/0032218 A1 | 2/2012 | Choi et al. |
| 2012/0074441 A1* | 3/2012 | Seo ................... H01L 27/153 257/91 |
| 2012/0286240 A1* | 11/2012 | Yu .................... H01L 25/0753 257/13 |
| 2013/0099141 A1* | 4/2013 | Chua ................. H01L 33/06 250/504 R |
| 2013/0234173 A1* | 9/2013 | Lee .................... H01L 27/153 257/88 |
| 2014/0103289 A1* | 4/2014 | Liao ................... H01L 21/0237 257/13 |
| 2015/0243844 A1 | 8/2015 | Seo et al. |
| 2015/0340579 A1 | 11/2015 | Seo et al. |
| 2016/0064598 A1* | 3/2016 | Choi ................... H01L 33/06 257/13 |
| 2016/0079471 A1* | 3/2016 | Liao ................... C23C 14/0036 257/13 |
| 2016/0163941 A1 | 6/2016 | Seo et al. |
| 2016/0240721 A1* | 8/2016 | Chu ................... A61B 5/14552 |
| 2016/0254414 A1* | 9/2016 | Jung ................... H01L 33/42 257/98 |
| 2016/0268478 A1* | 9/2016 | Tomizawa ............ H01L 33/40 |
| 2017/0104139 A1 | 4/2017 | Seo et al. |
| 2017/0365739 A1* | 12/2017 | Park ................... H01L 33/22 |
| 2018/0277719 A1* | 9/2018 | Lee .................... H01L 33/06 |

FOREIGN PATENT DOCUMENTS

| | | |
|---|---|---|
| CN | 1734797 | 2/2006 |
| CN | 1947222 A | 4/2007 |
| CN | 101026212 A | 8/2007 |
| CN | 101752399 | 6/2010 |
| CN | 101764183 A | 6/2010 |
| CN | 101937962 A | 1/2011 |
| CN | 102132424 A | 7/2011 |
| JP | 118414 | 1/1999 |
| JP | 2002319704 | 10/2002 |
| JP | 2004006582 | 1/2004 |
| JP | 2008130656 | 6/2008 |
| JP | 2008141015 | 6/2008 |
| JP | 4151284 | 7/2008 |
| KR | 100599012 | 7/2006 |
| KR | 100610650 | 8/2006 |
| KR | 100838197 | 6/2008 |
| KR | 1020100016631 | 2/2010 |
| KR | 1020100036617 | 4/2010 |
| KR | 1020100079843 | 7/2010 |
| TW | 201025556 A1 | 7/2010 |
| WO | 2004023568 | 3/2004 |
| WO | 2007001124 | 1/2007 |
| WO | 2009106063 A1 | 9/2009 |

OTHER PUBLICATIONS

US 8,314,430 B2, 11/2012, Illek et al. (withdrawn)
Nishida, T. "GaN-free Transparent ultraviolet light-emitting diodes" App. Phys. Lett. vol. 82 No. 1 Jun. 1, 2003 pp. 1-3.*
Weyers, M. "Substrates for GaN Technology" slides/presentation available online at http://crysta.physik.hu-berlin.de/as2005/pdf/as2005_talk_08_Weyers.pdf as of Jun. 12, 2007 pp. 1-24.*
English Translation of Chinese Office Action from related Chinese Patent Application No. 201610133009.9 dated May 17, 2019 (16 pages).
International Search Report and Written Opinion dated May 1, 2012, PCT/KR2011/006544.
Office Action in Chinese Application No. 201610132992.2, dated May 31, 2018.
Office Action in Chinese Patent Application No. 201610131814.8, dated Apr. 4, 2018.
First Office Action in Chinese Patent Application No. 201610131393.9, dated Jan. 19, 2018.
First Office Action in Chinese Application No. 201610133009, dated Nov. 17, 2017.
English Translation of Chinese Office Action from related Chinese Patent Application No. 201610131814.8 dated Dec. 24, 2018 (7 pages).
English Translation of Chinese Office Action from related Chinese Application No. 201610133009.9 dated Nov. 26, 2019 (29 pages).

* cited by examiner

FIG. 3
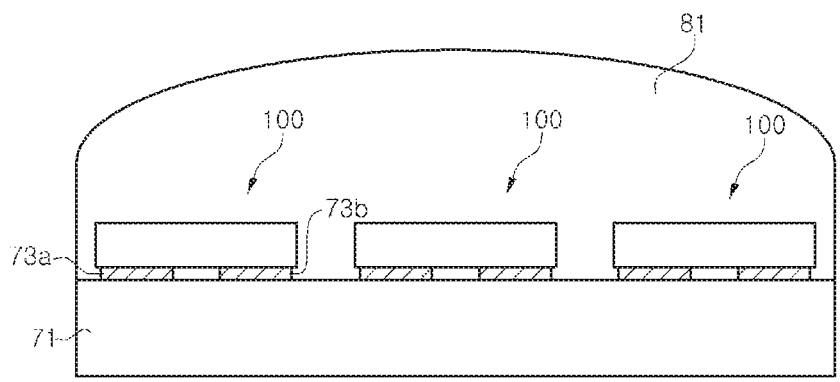
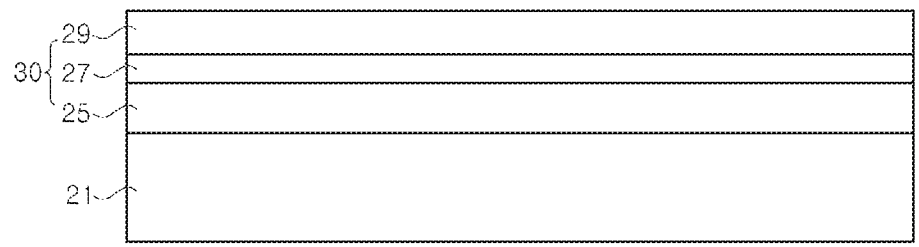
FIG. 4

FIG. 5A
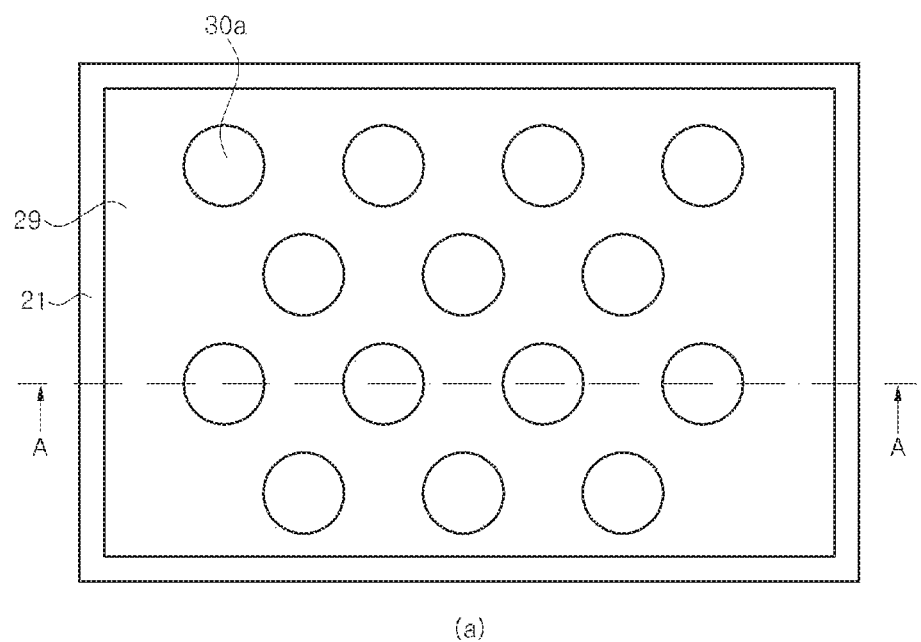
(a)
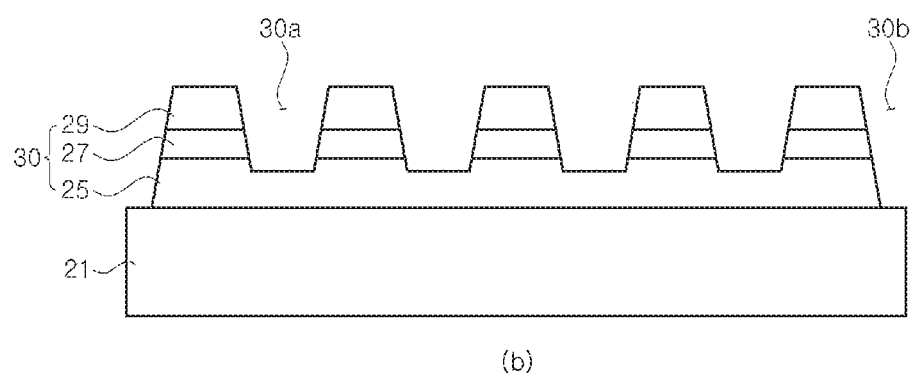
(b)
FIG. 5B

FIG. 6A
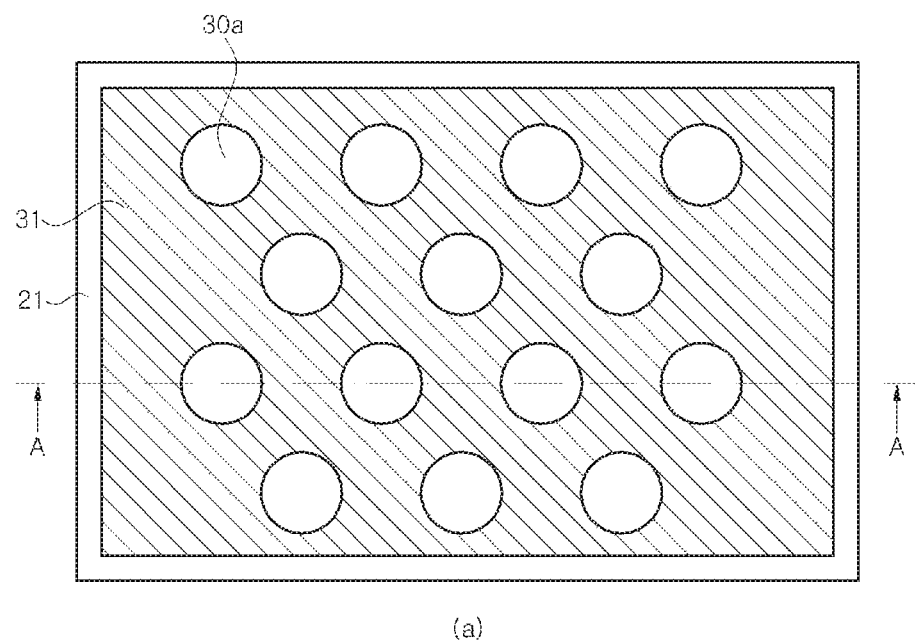
(a)
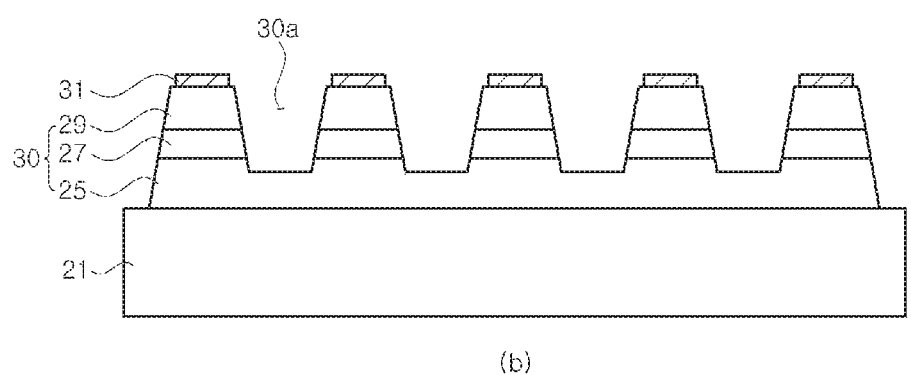
(b)
FIG. 6B

FIG. 7A
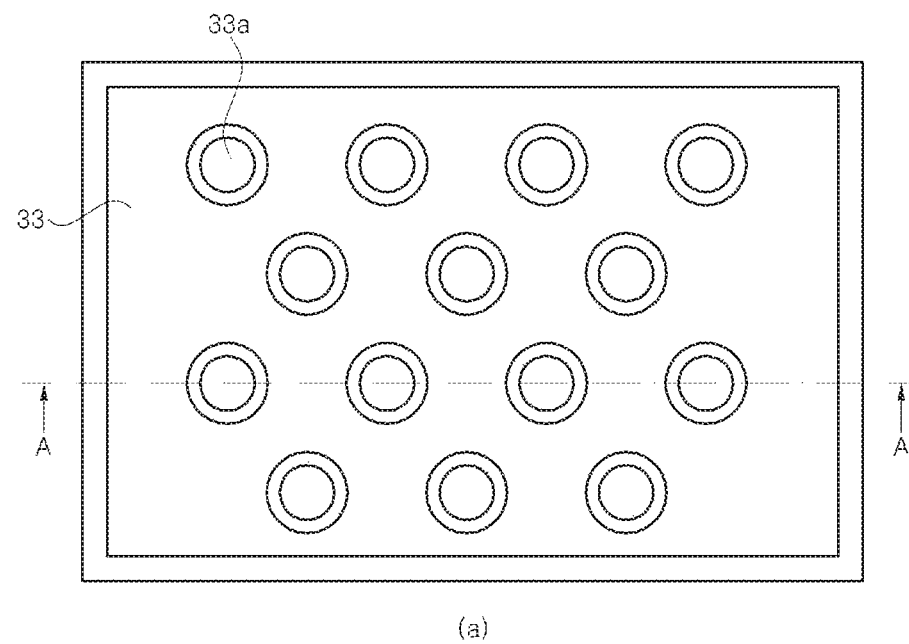
(a)
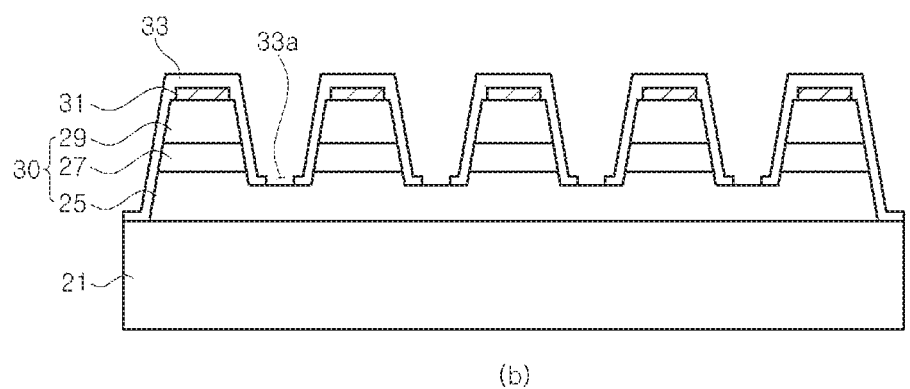
(b)
FIG. 7B

FIG. 8A
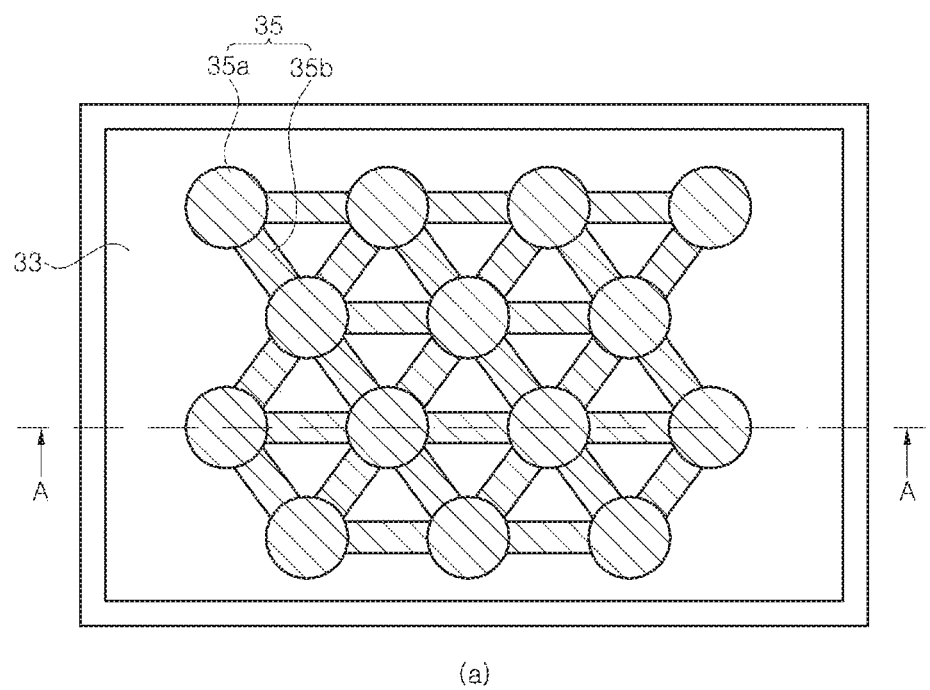
(a)
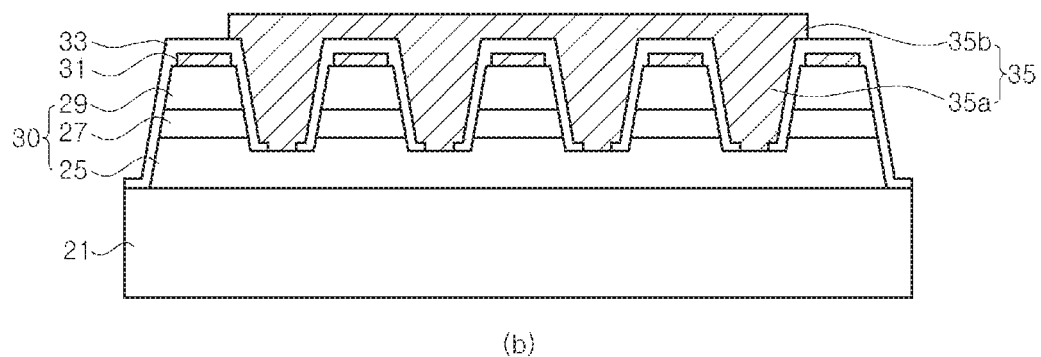
(b)
FIG. 8B

FIG. 9A
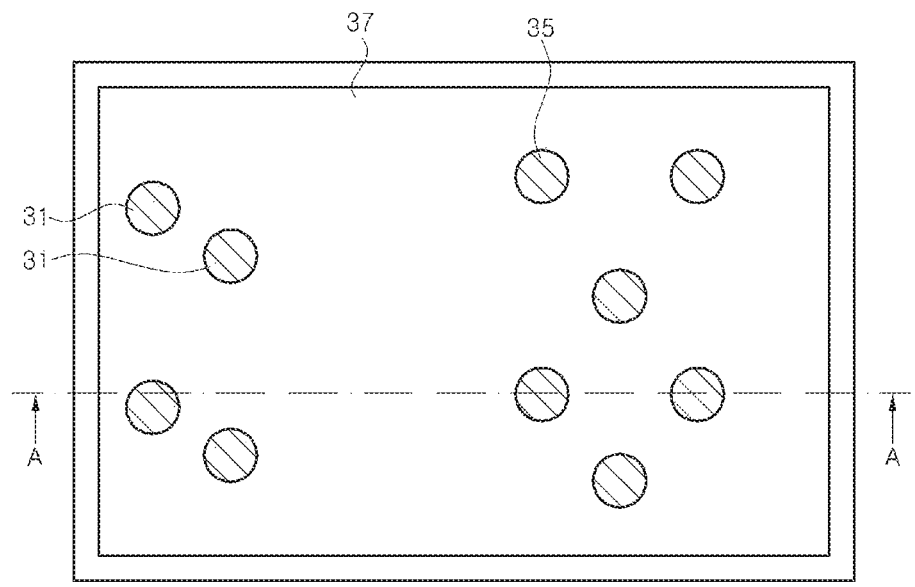
(a)
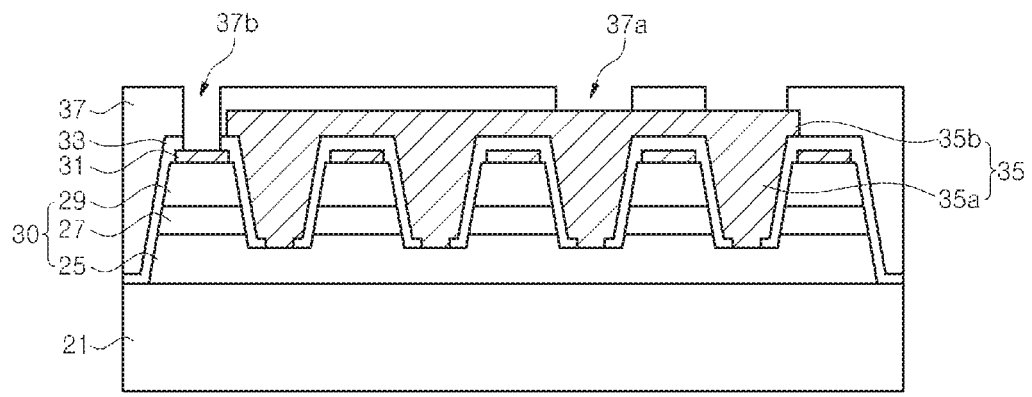
(b)
FIG. 9B

FIG. 10A
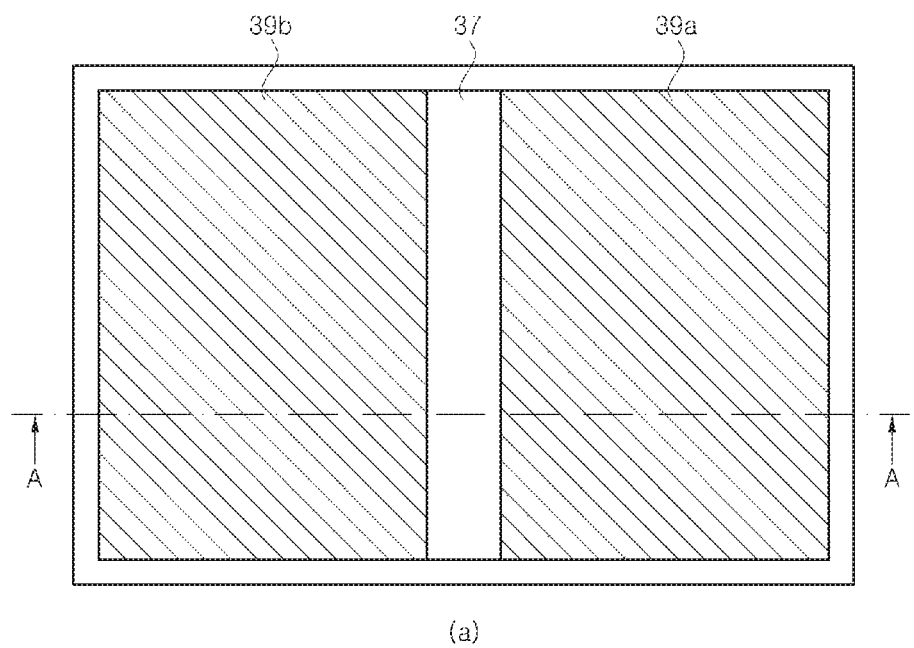
(a)
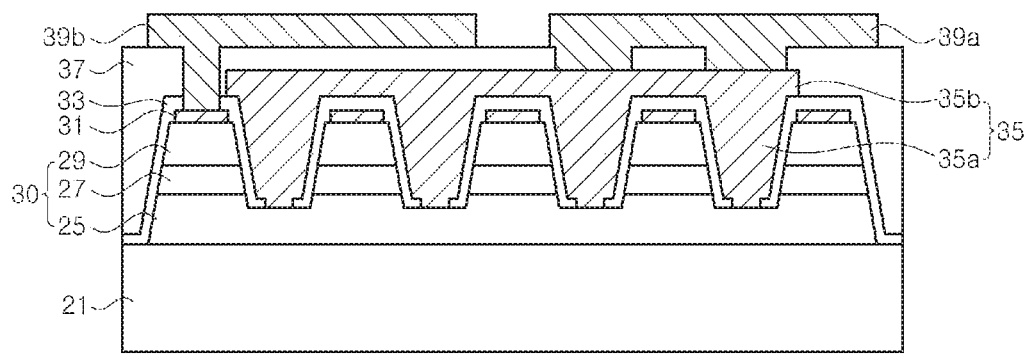
(b)
FIG. 10B

FIG. 12
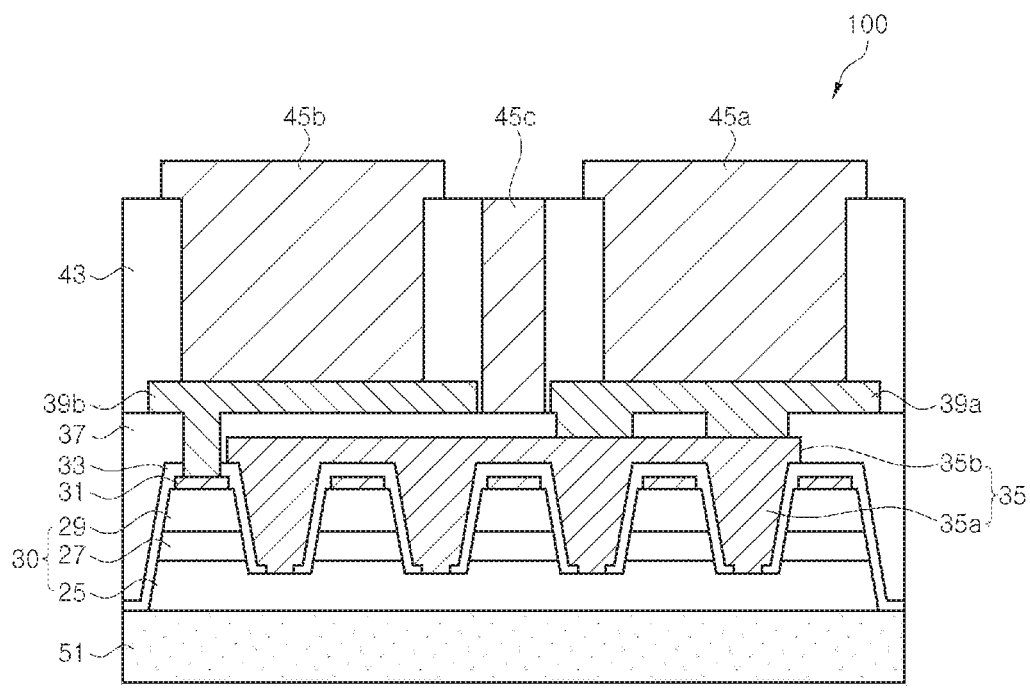
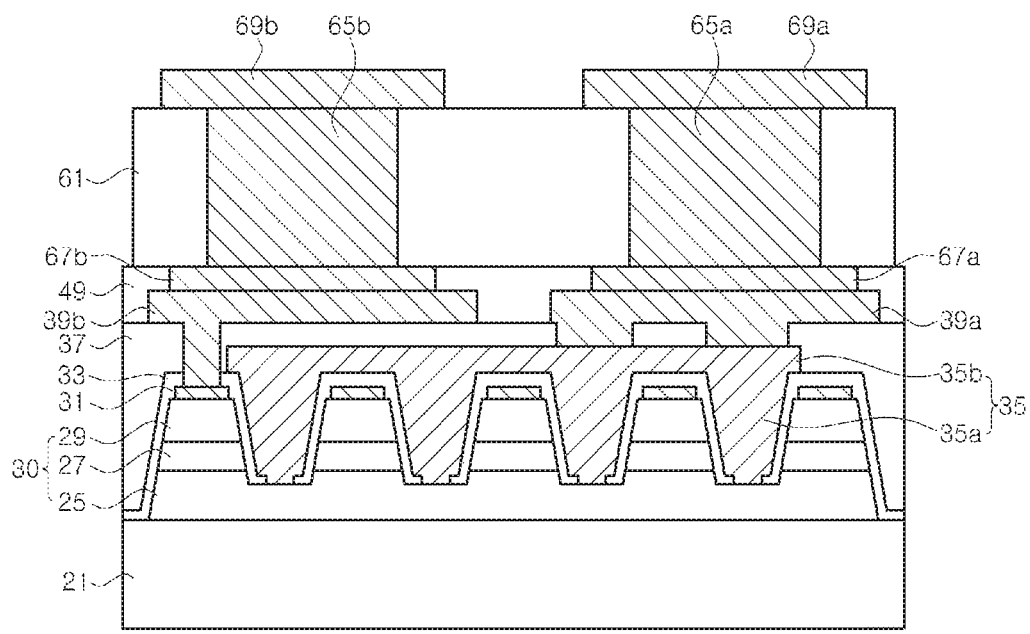
FIG. 13

FIG.15
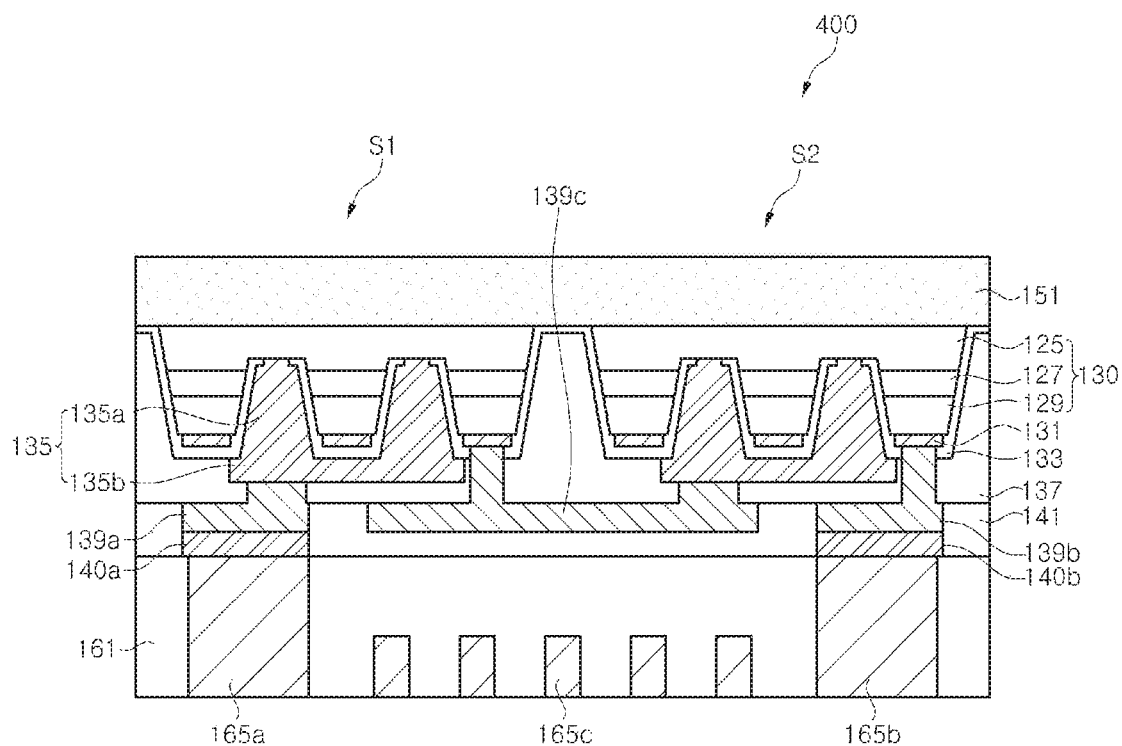
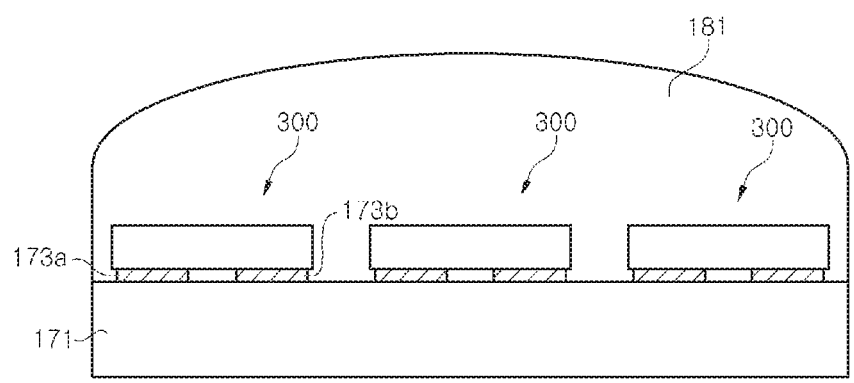
FIG. 16
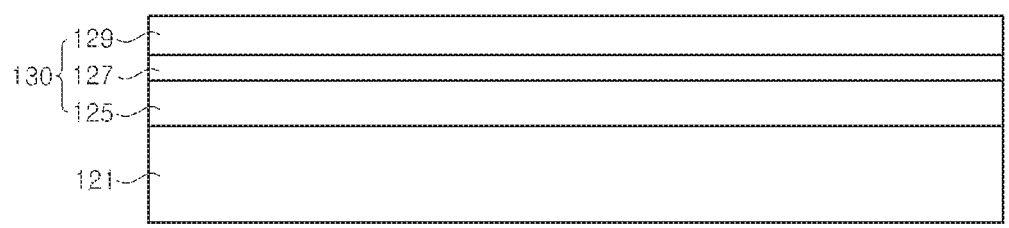
FIG. 17

FIG. 18A
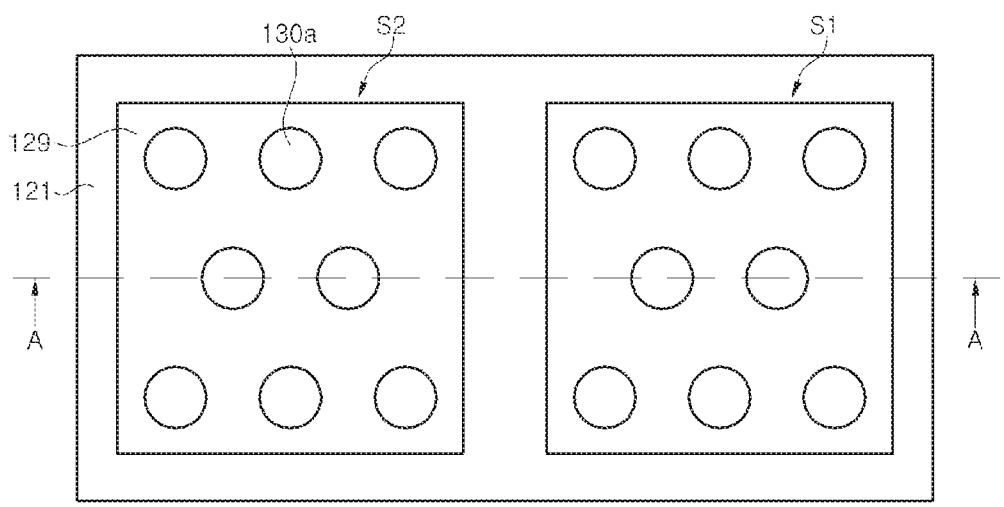
(a)
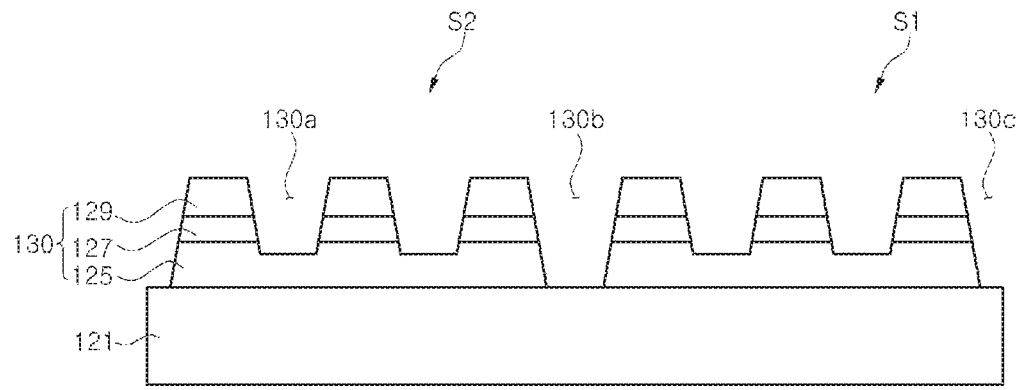
(b)
FIG. 18B

FIG. 19A
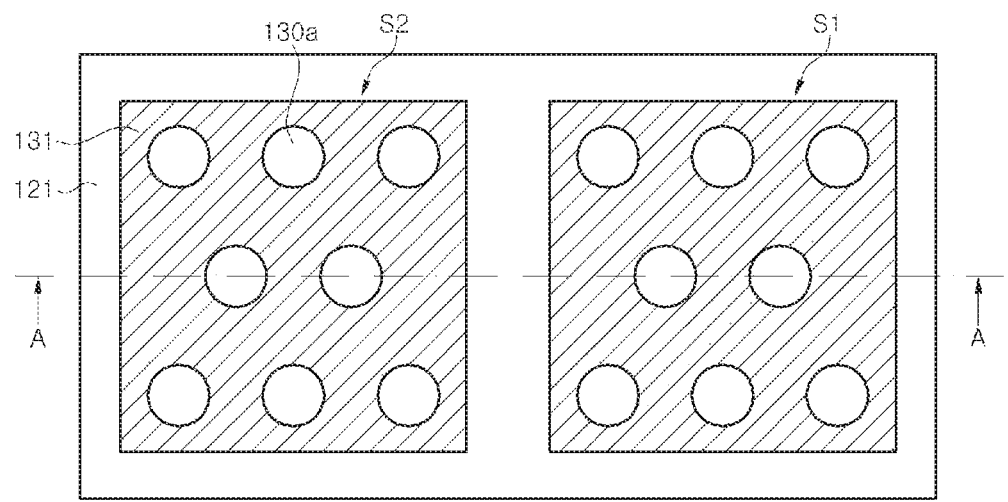
(a)
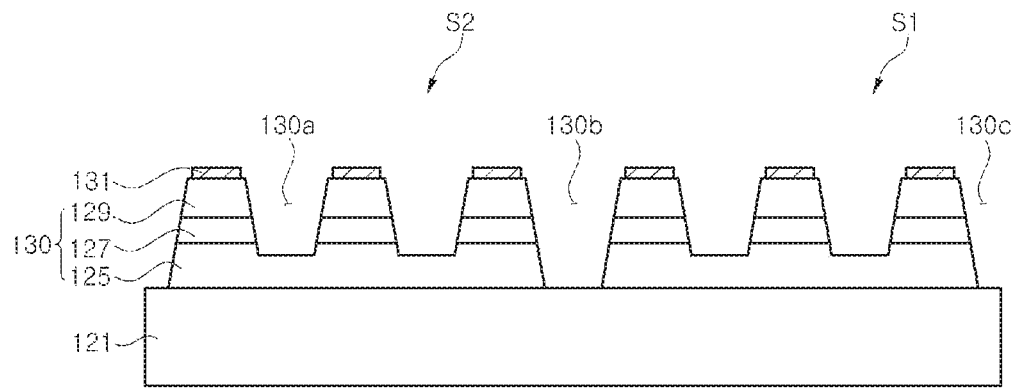
(b)
FIG. 19B

FIG. 20A
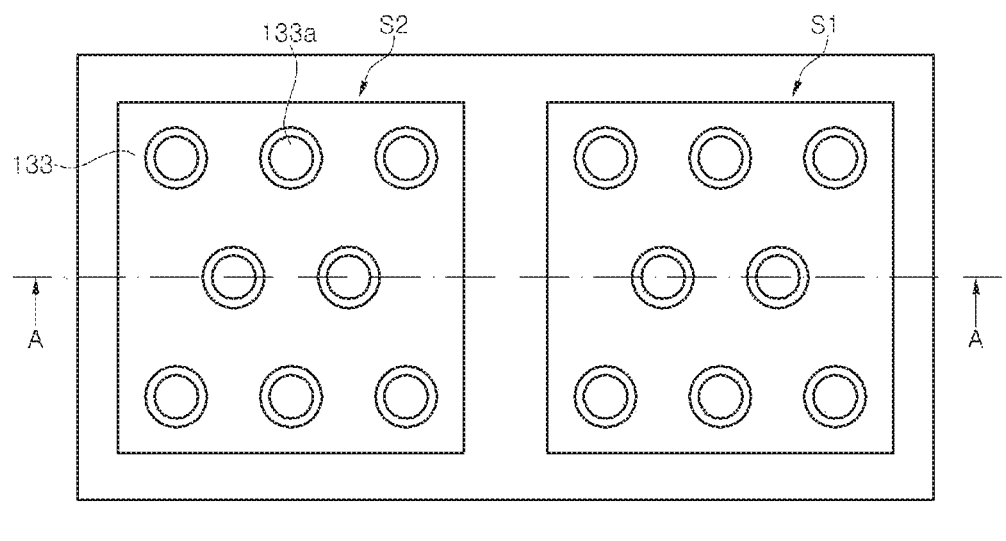
(a)
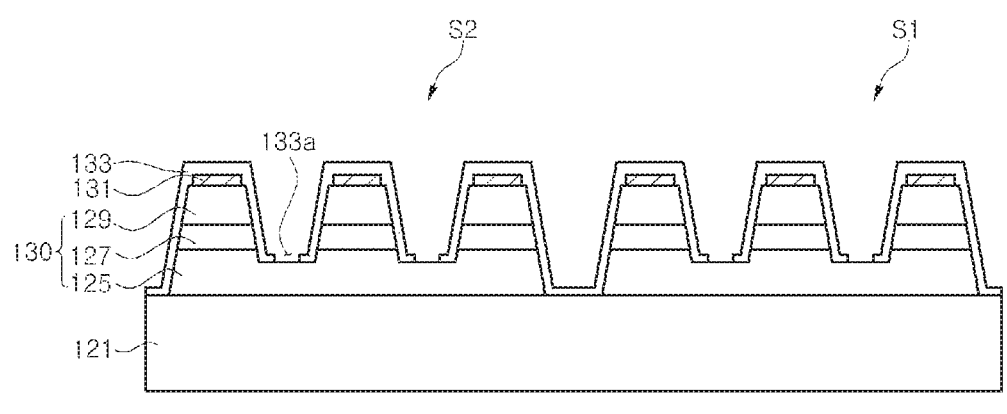
(b)
FIG. 20B

FIG. 21A
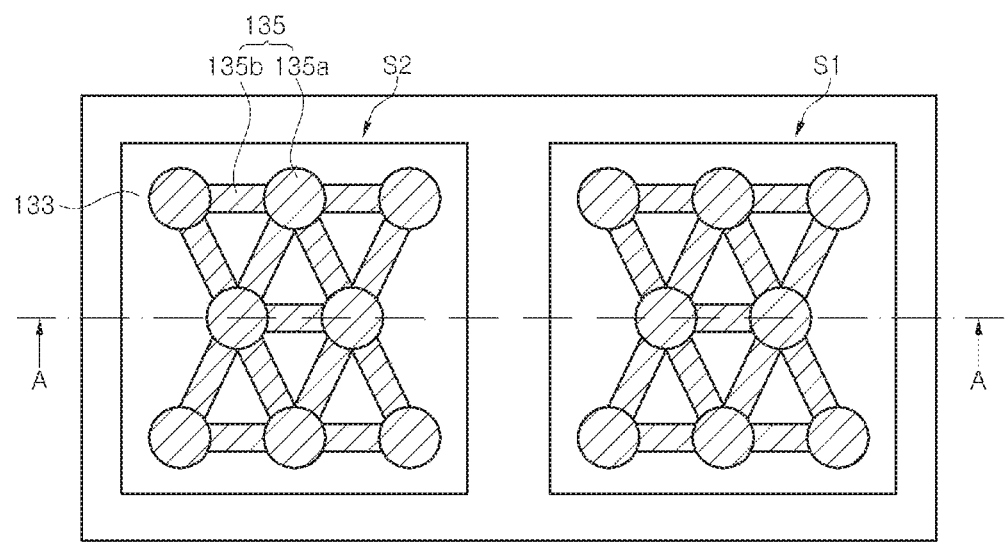
(a)
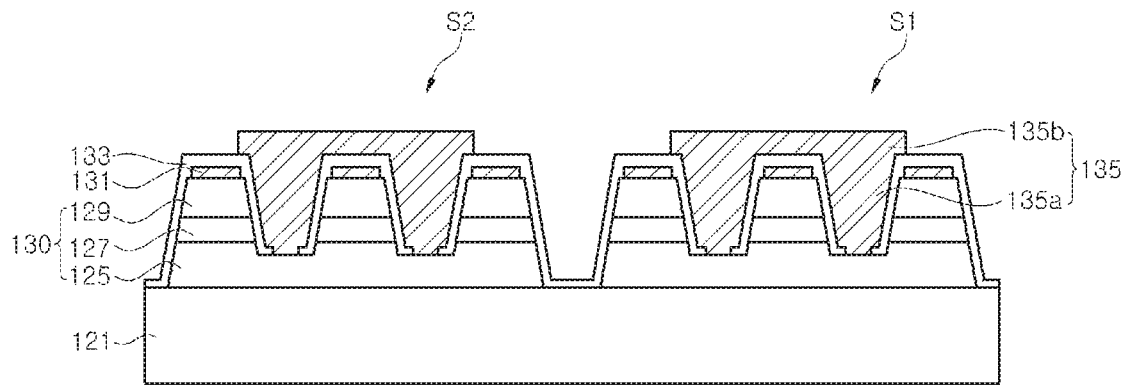
(b)
FIG. 21B

FIG. 22A
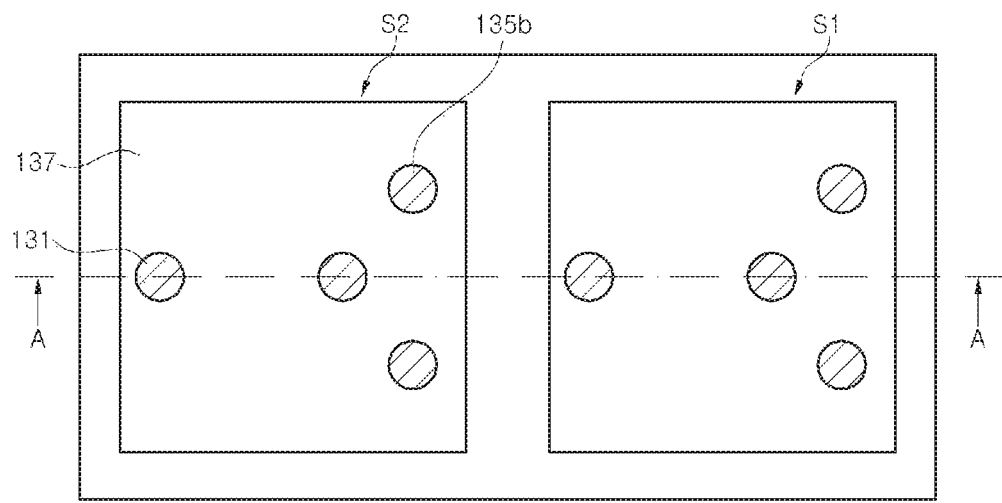
(a)
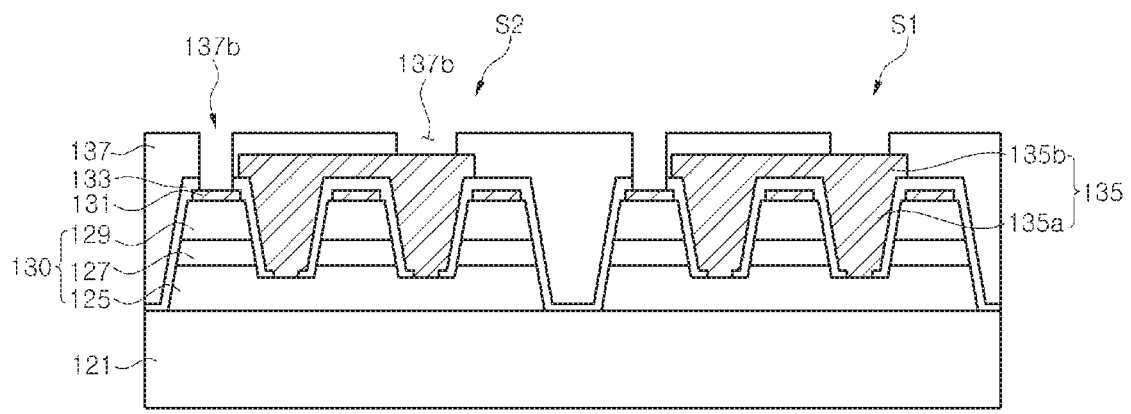
(b)
FIG. 22B

FIG. 23A
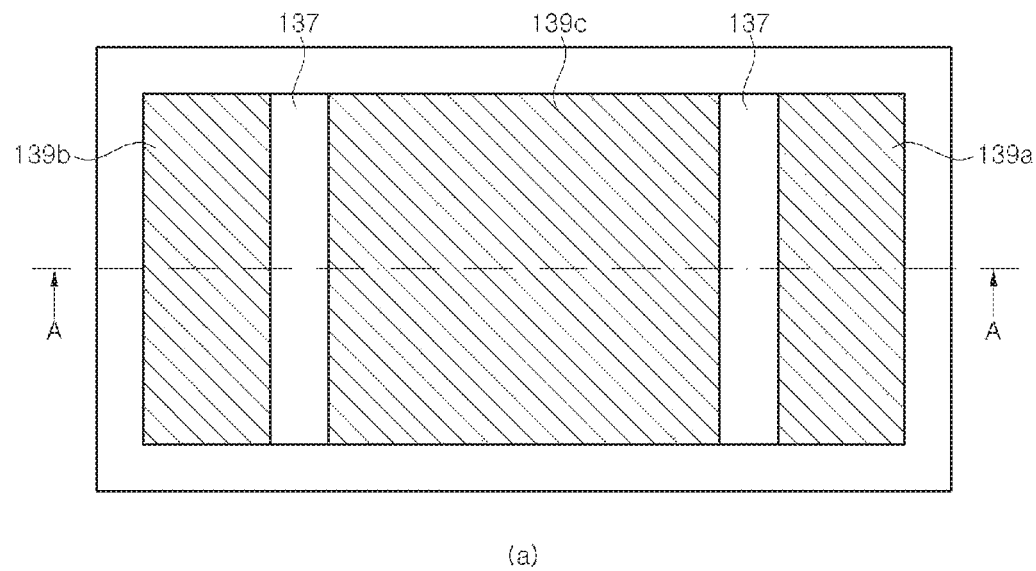
(a)
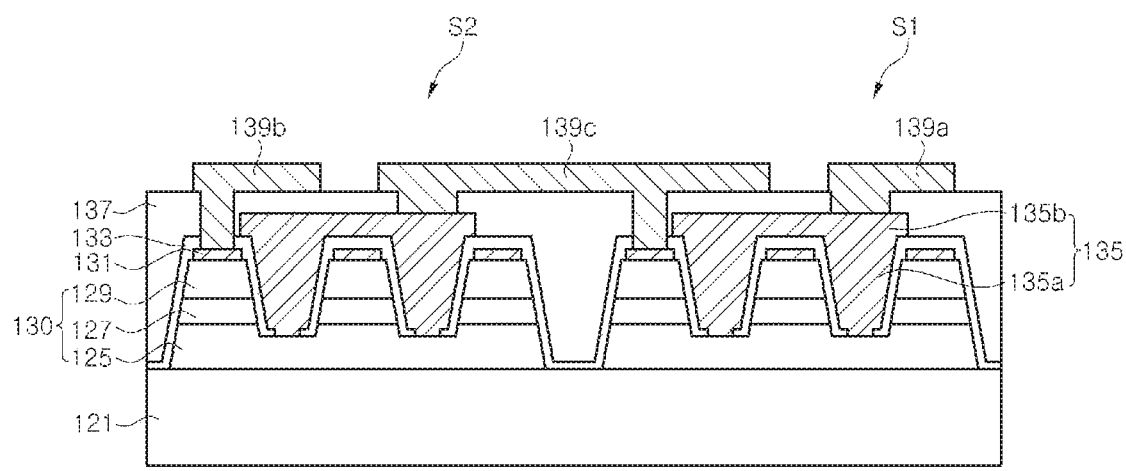
(b)
FIG. 23B

FIG. 26
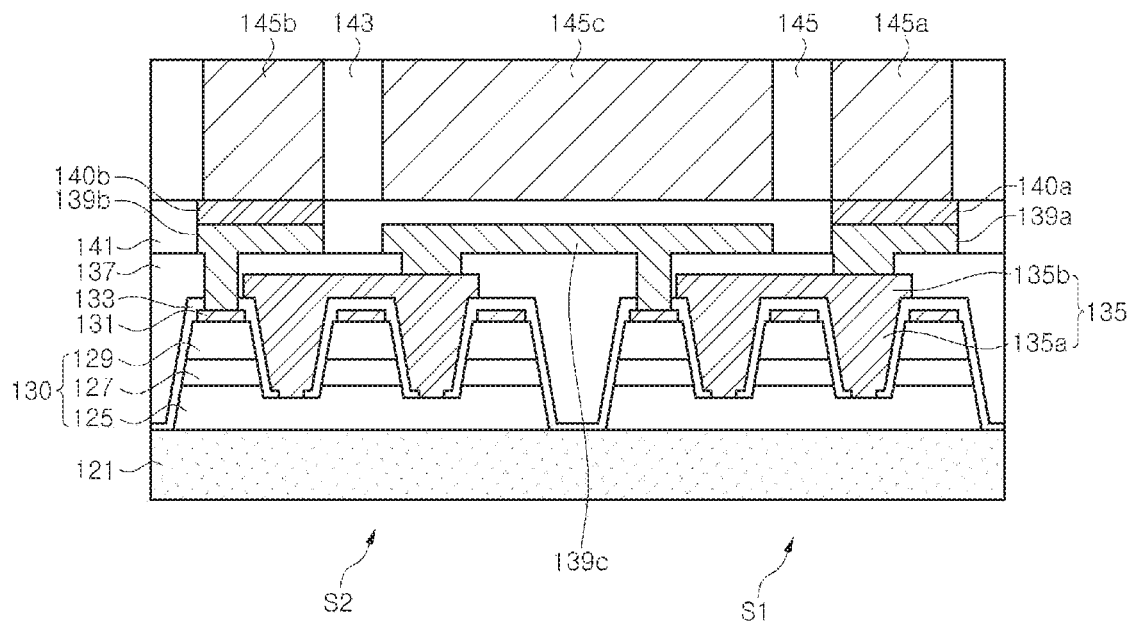
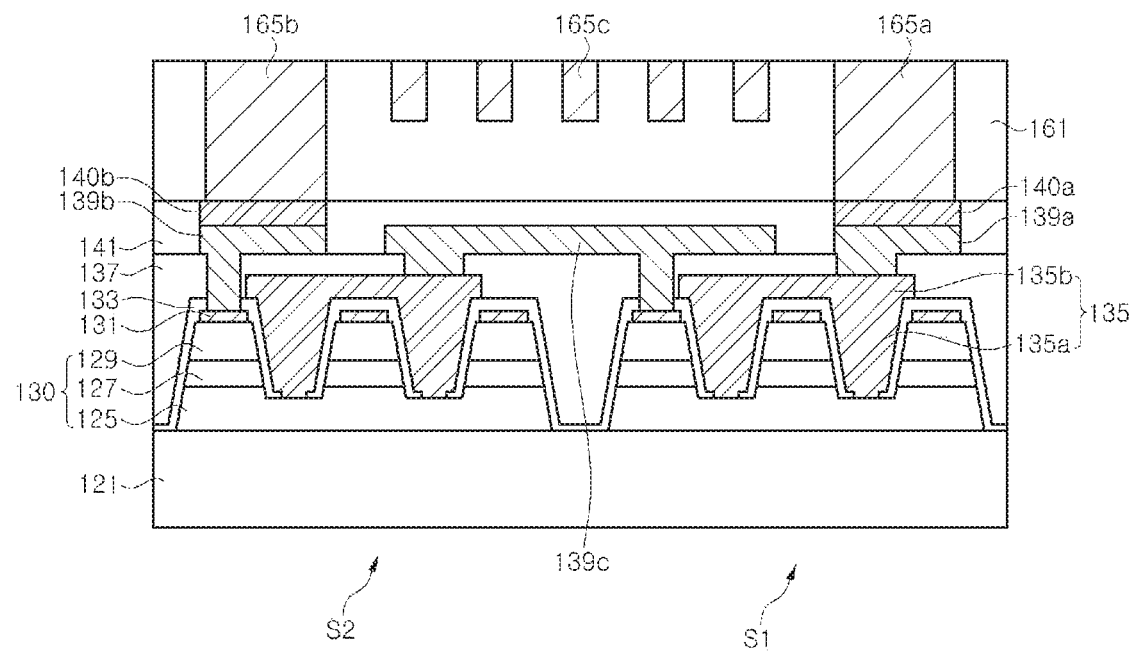
FIG. 27

FIG. 30A
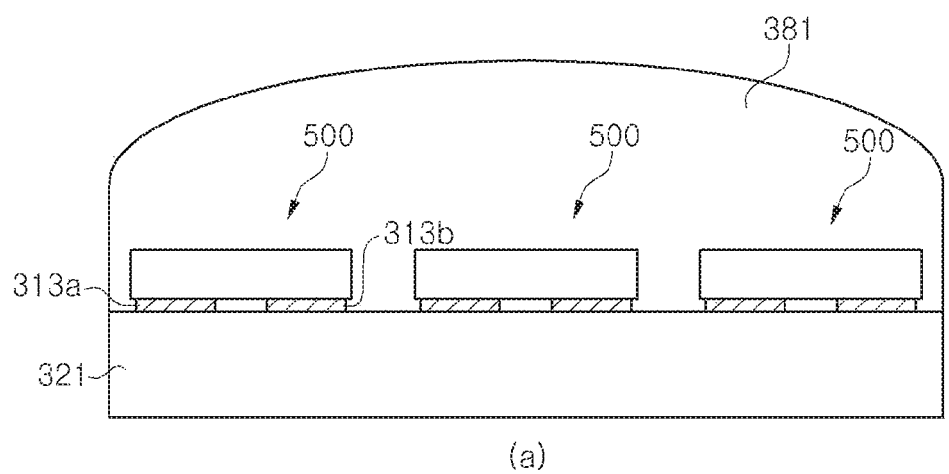
(a)
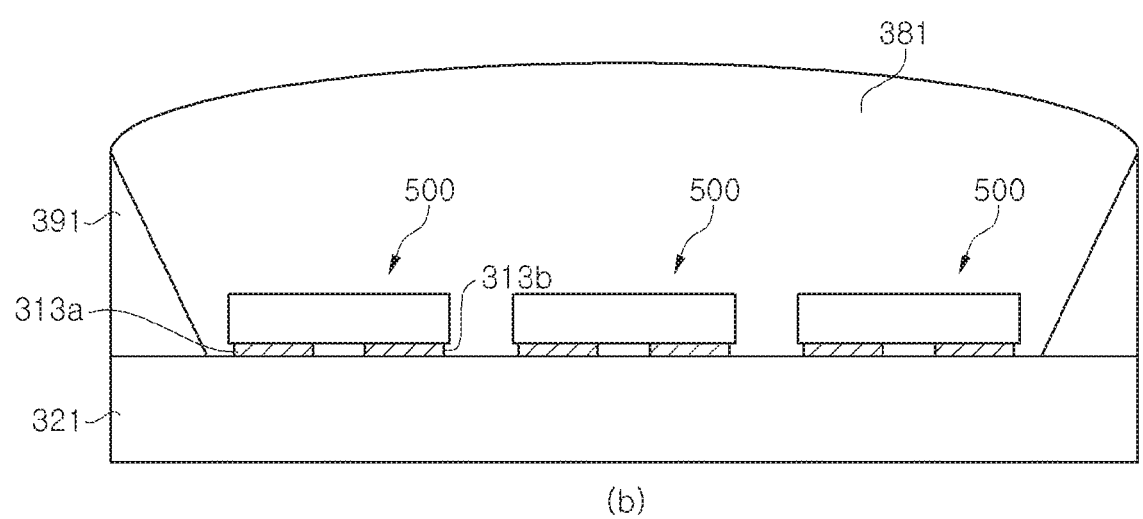
(b)
FIG. 30B

FIG. 32A
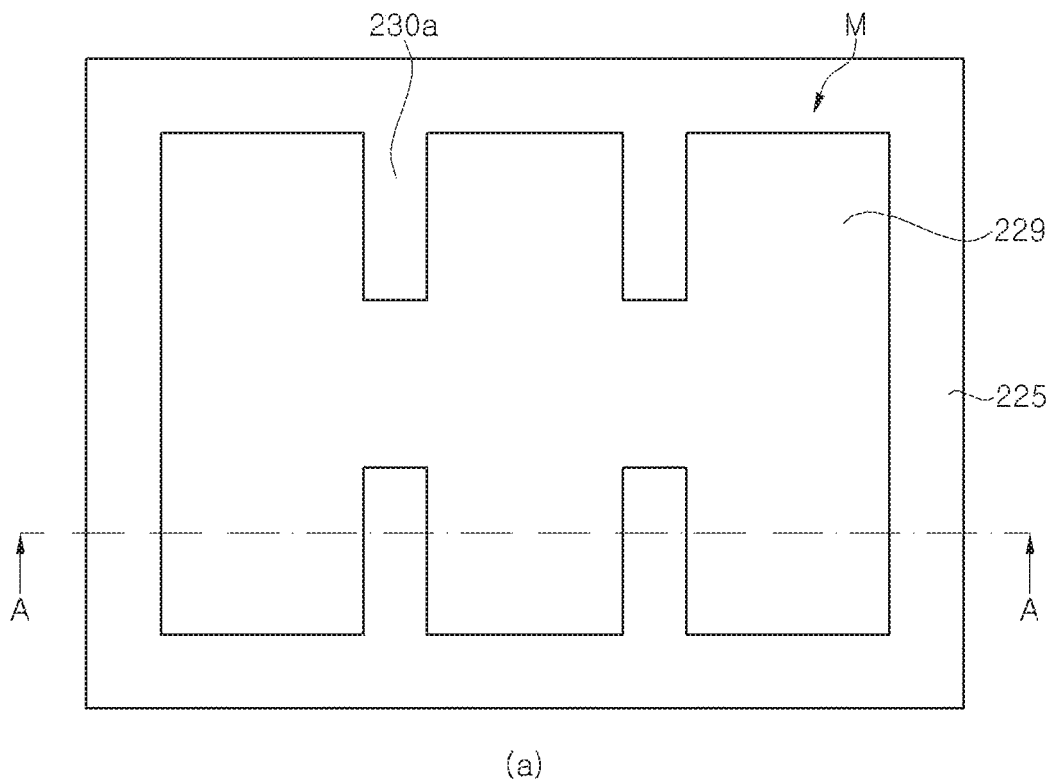
(a)
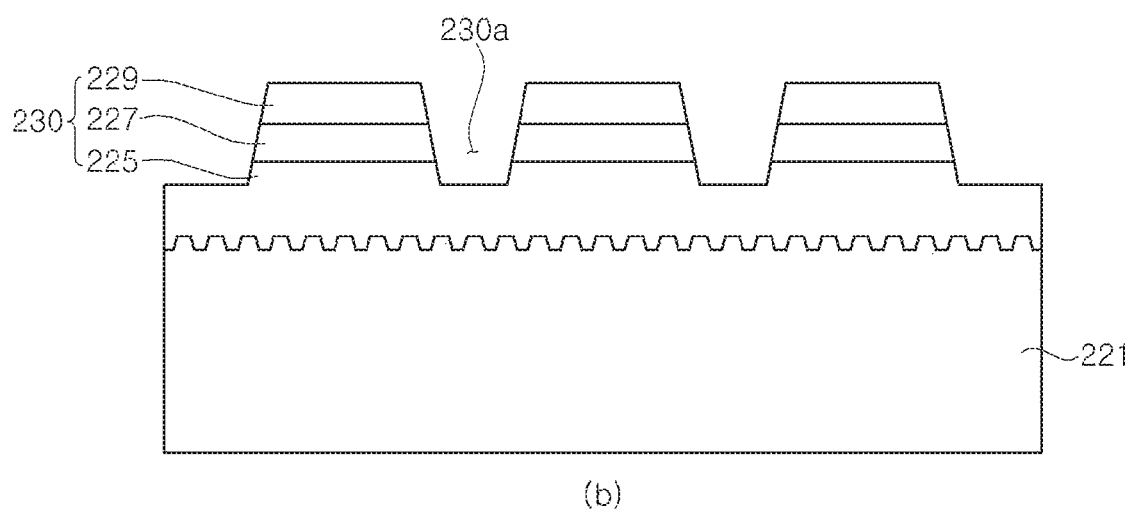
(b)
FIG. 32B

FIG. 33A
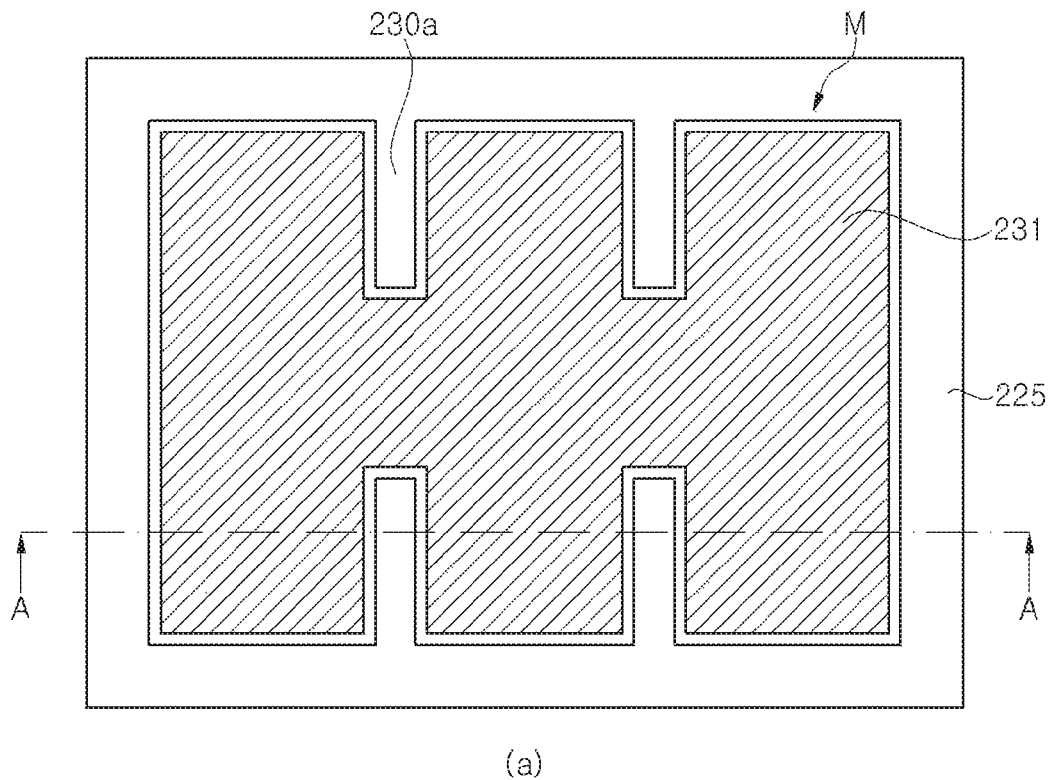
(a)
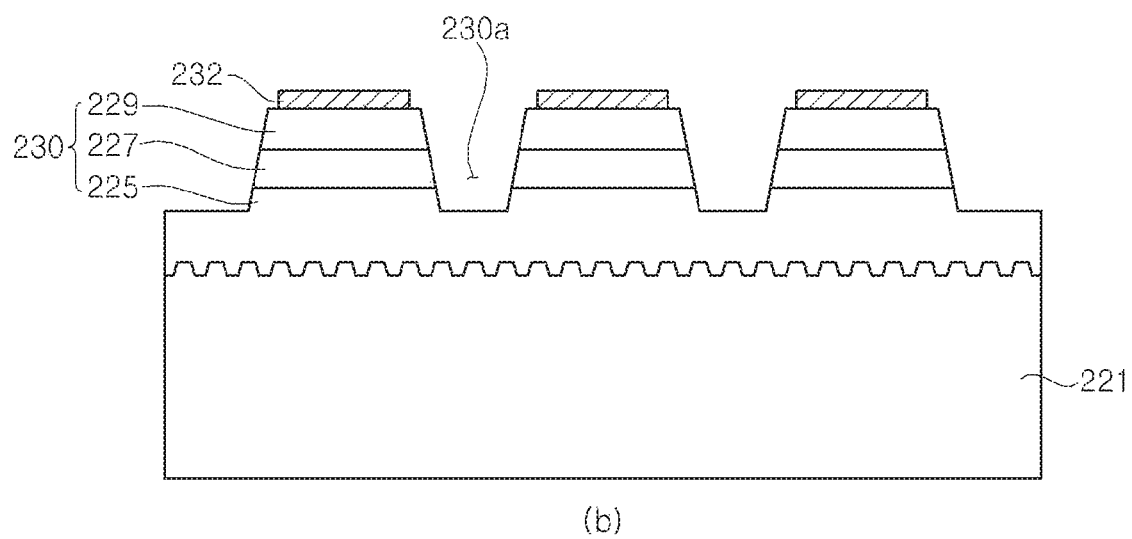
(b)
FIG. 33B

FIG. 34A
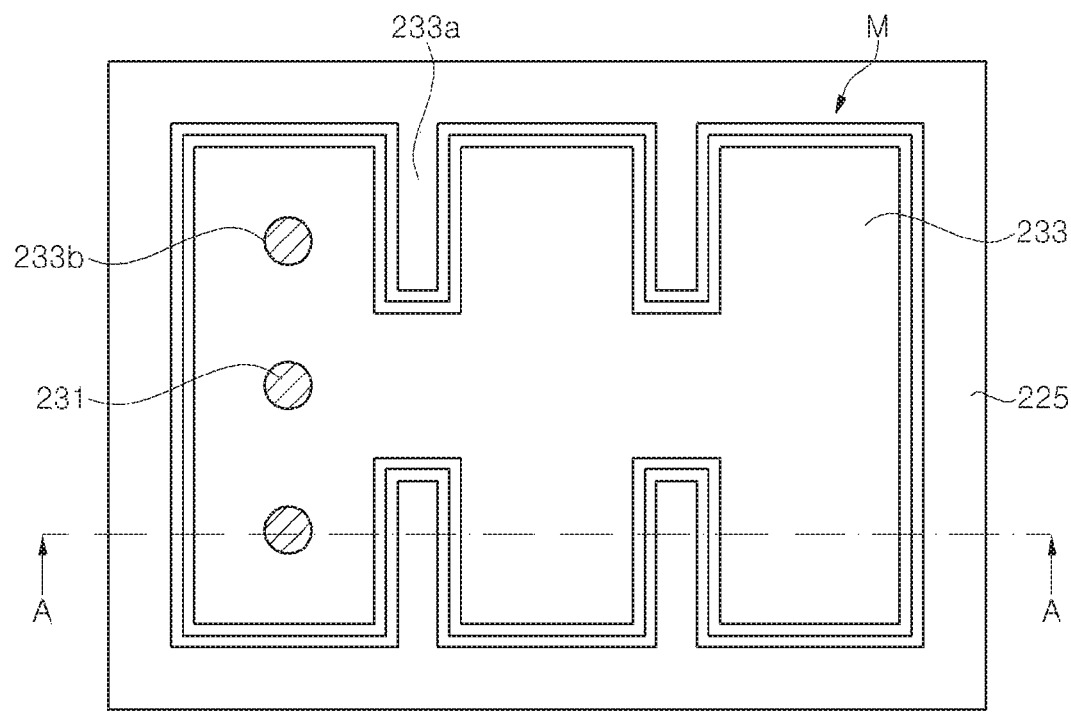
(a)
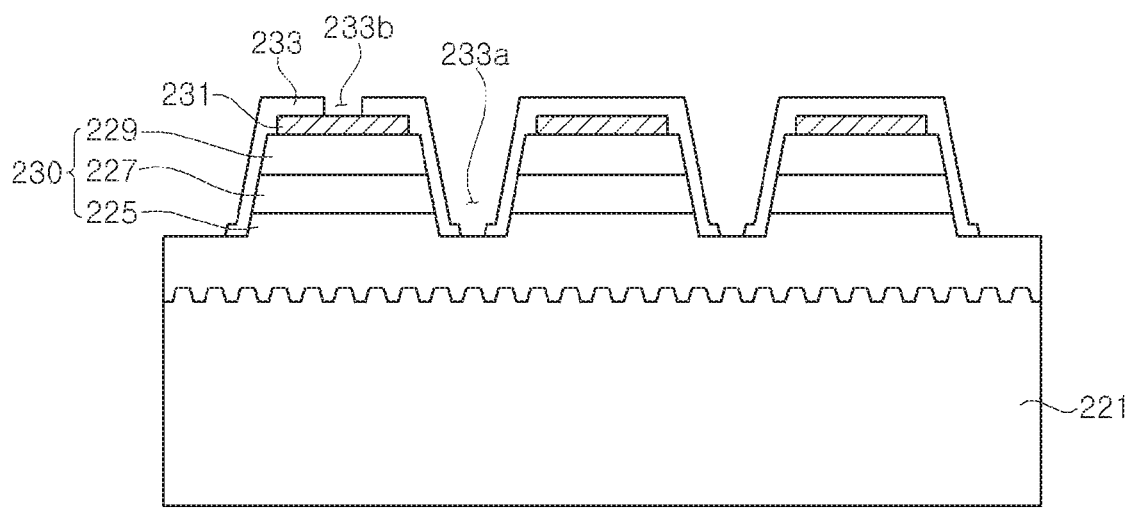
(b)
FIG. 34B

FIG. 35A
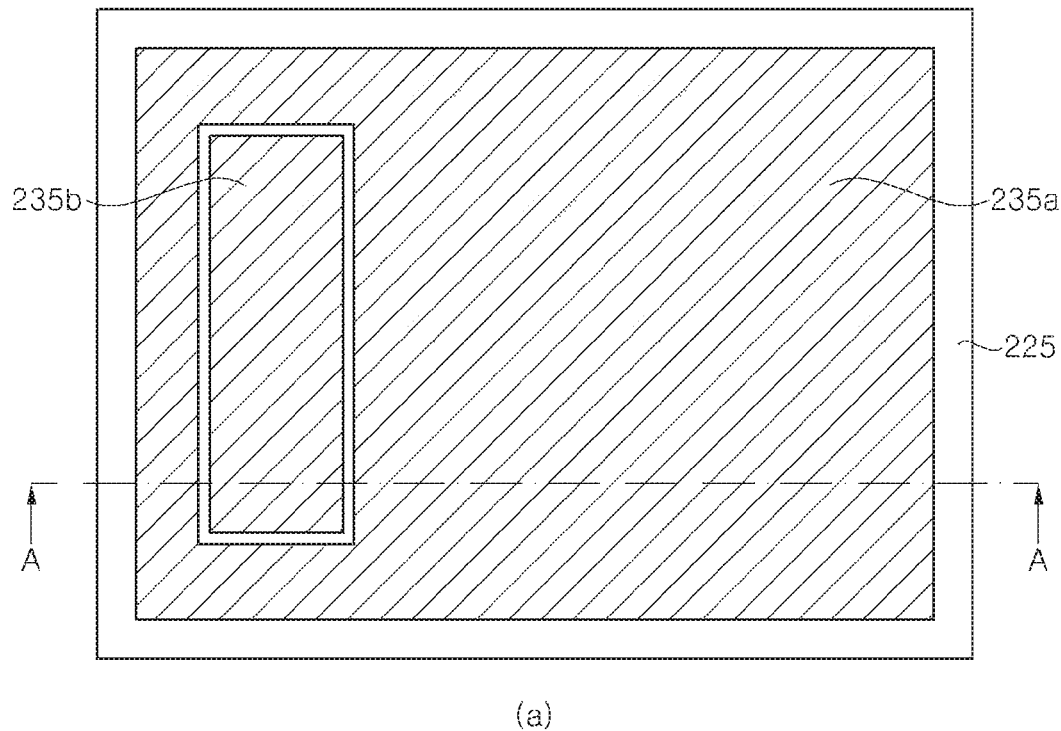
(a)
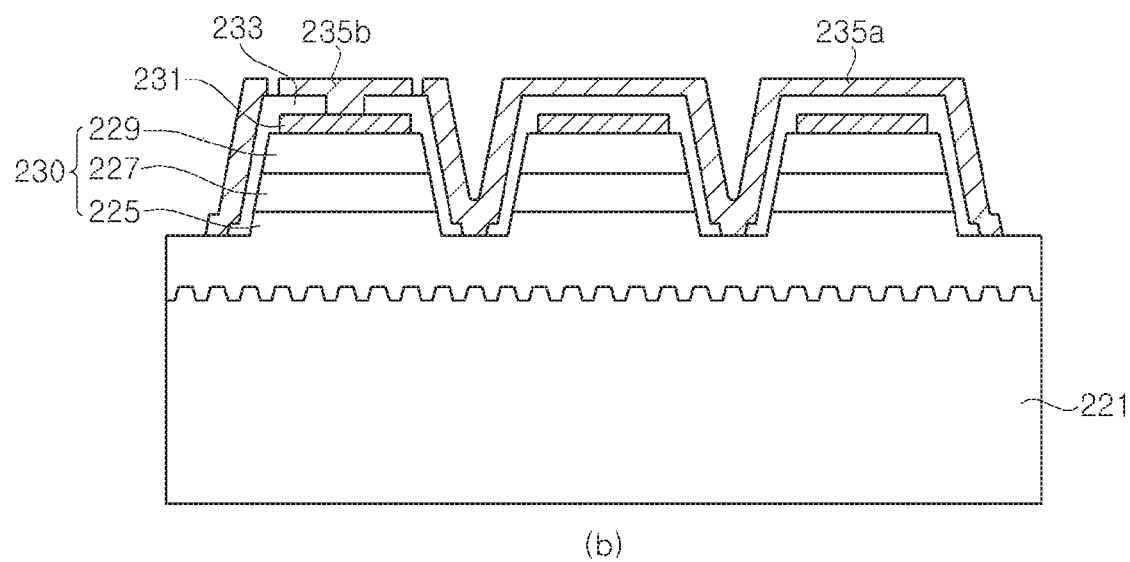
(b)
FIG. 35B

FIG. 36A
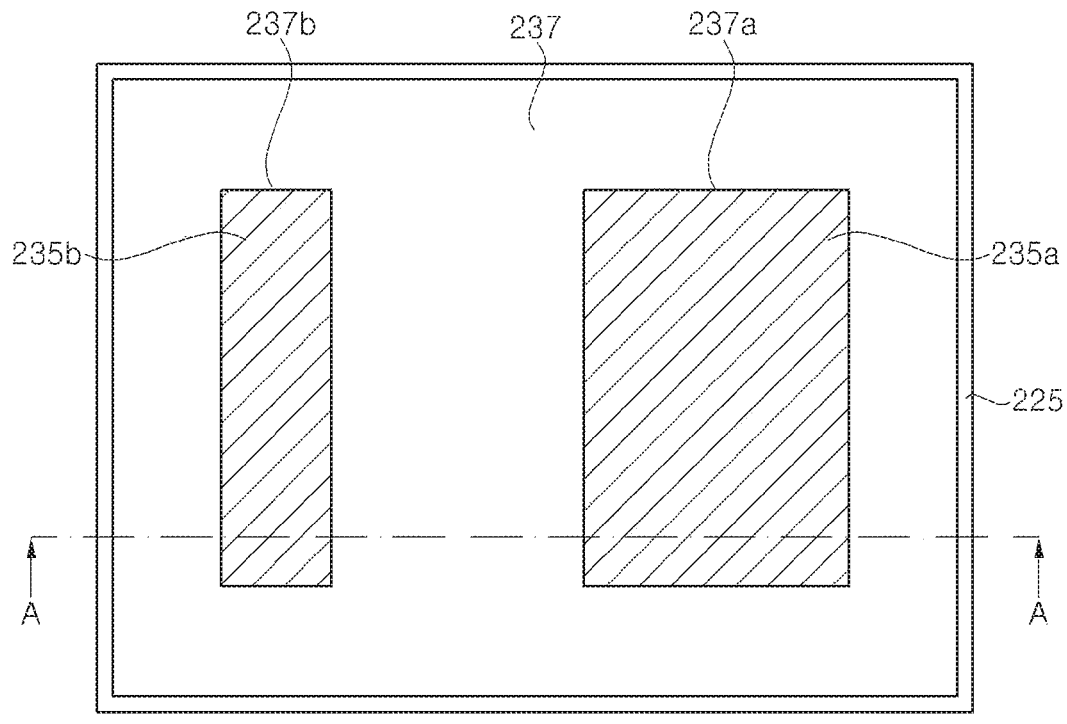
(a)
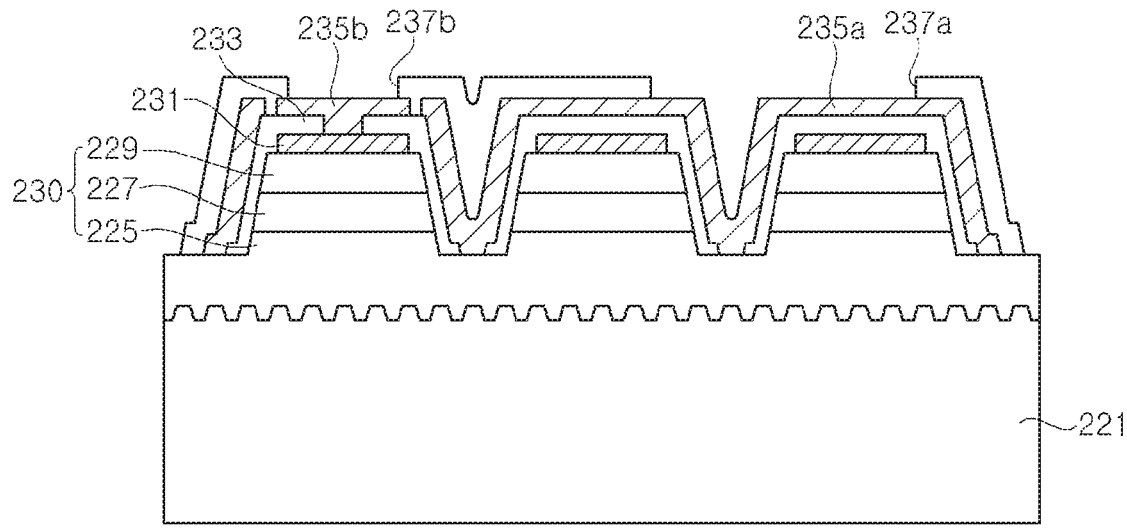
(b)
FIG. 36B

FIG. 37A
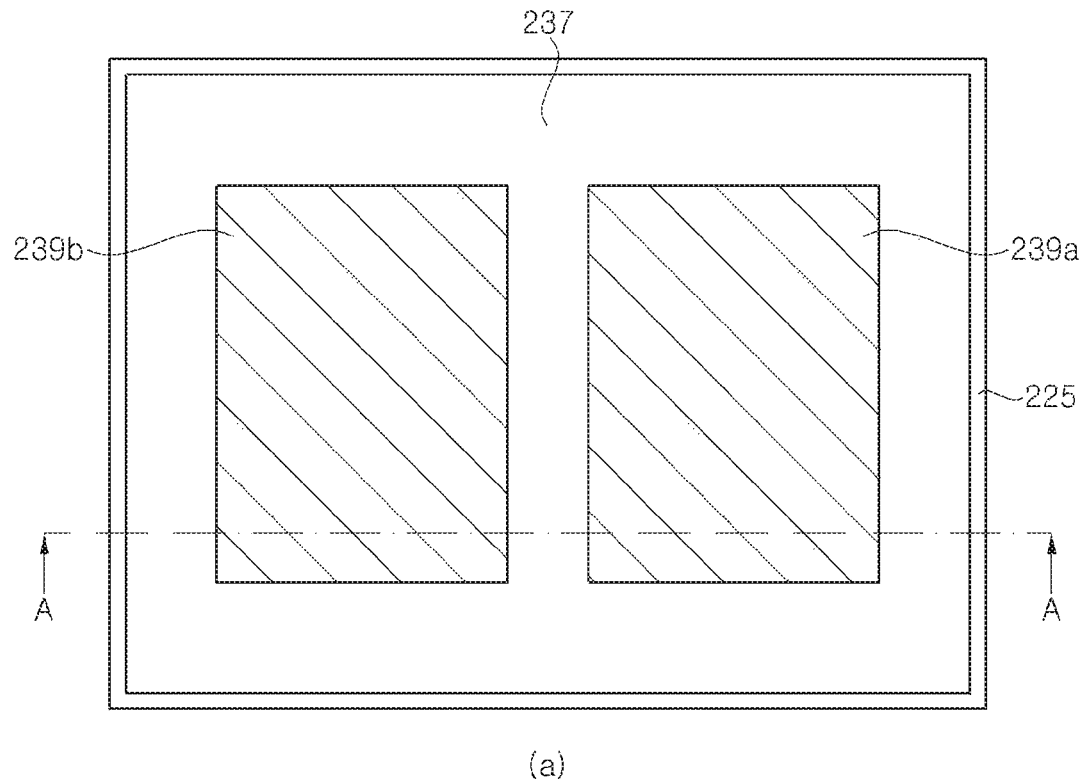
(a)
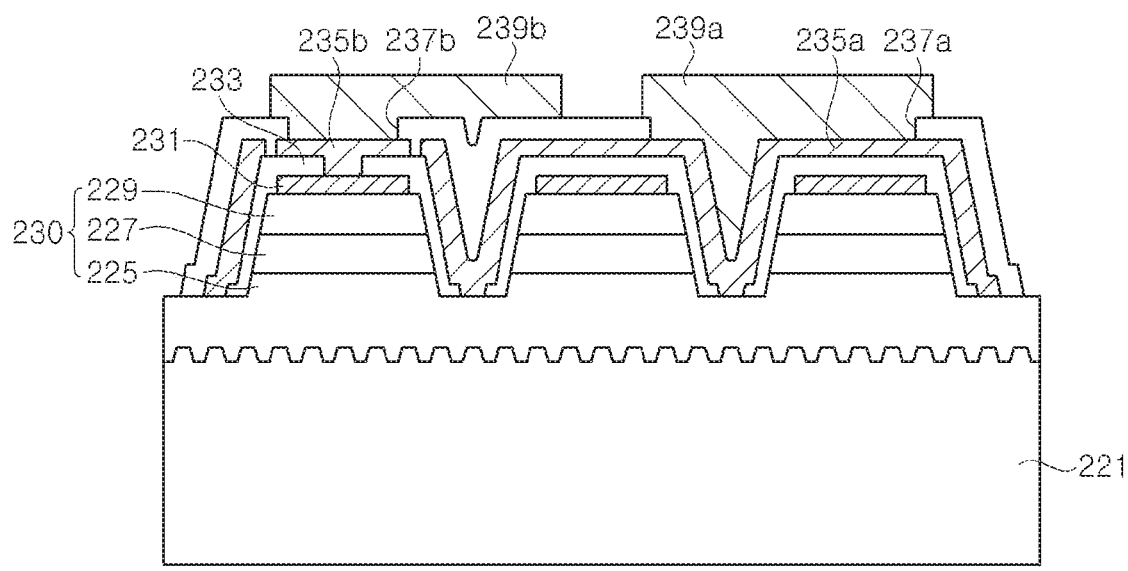
(b)
FIG. 37B

FIG. 38A
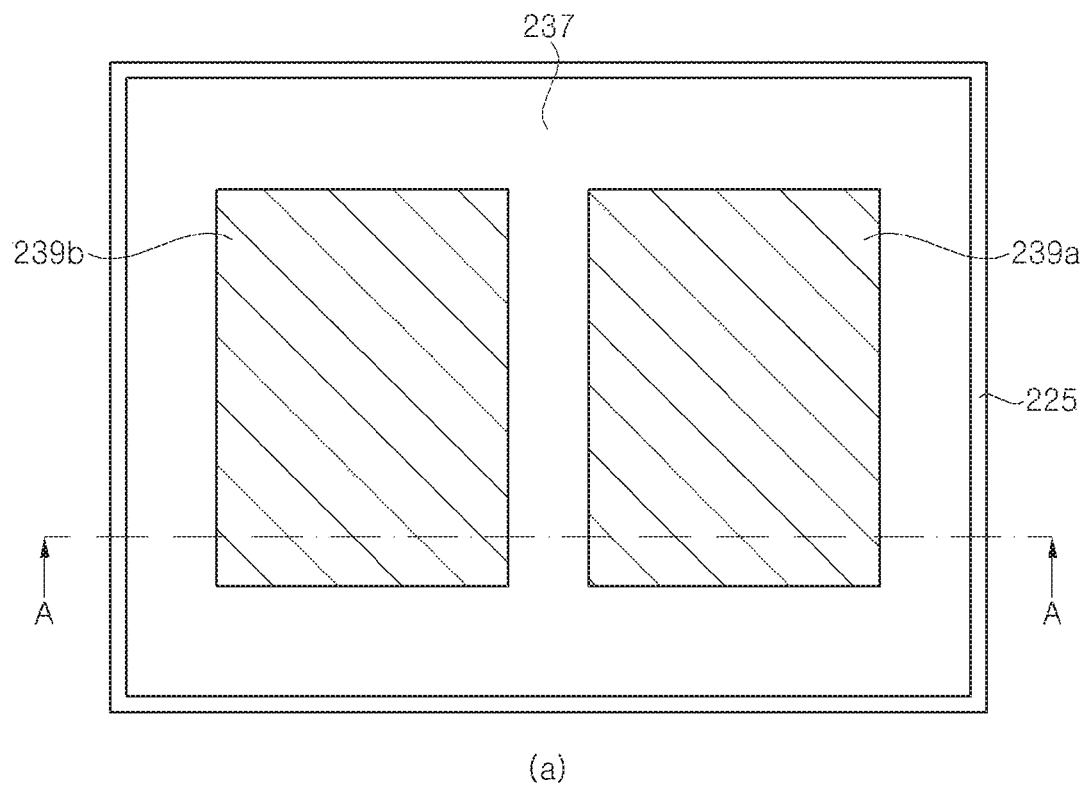
(a)
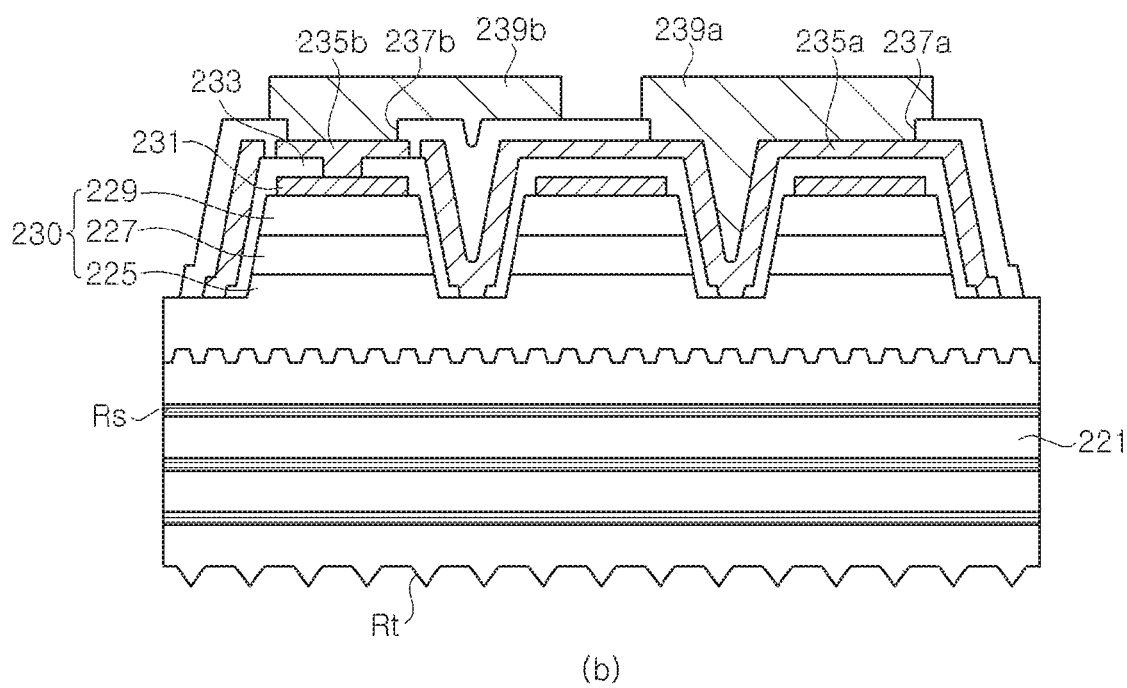
(b)
FIG. 38B

FIG. 40A
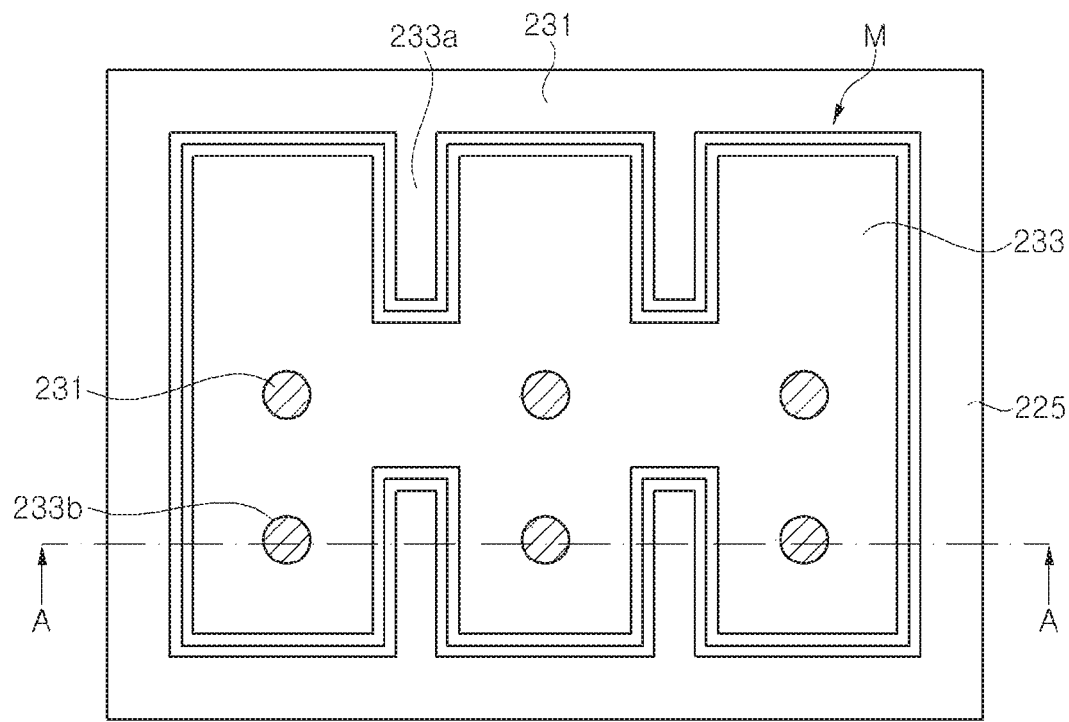
(a)
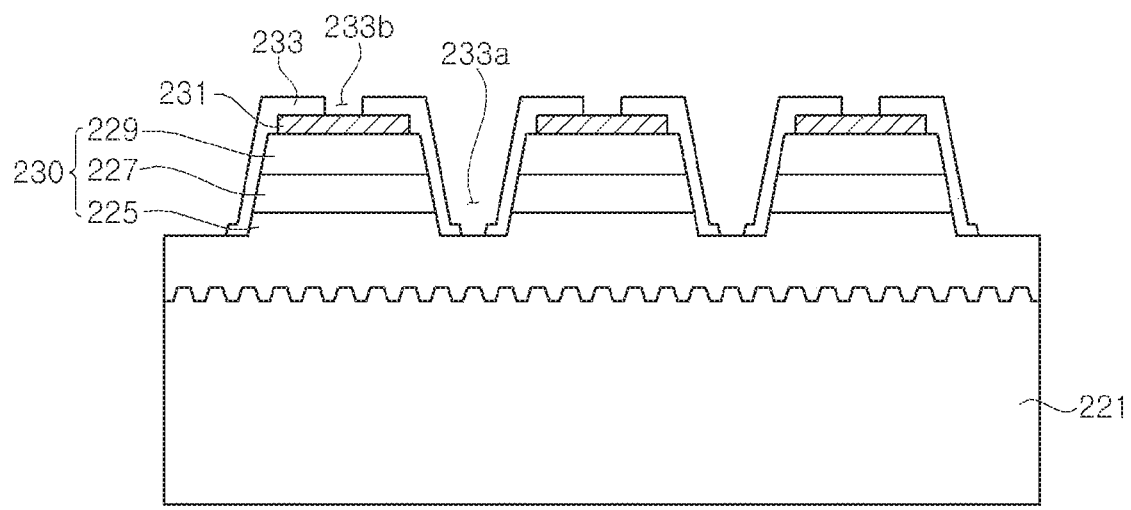
(b)
FIG. 40B

FIG. 41A
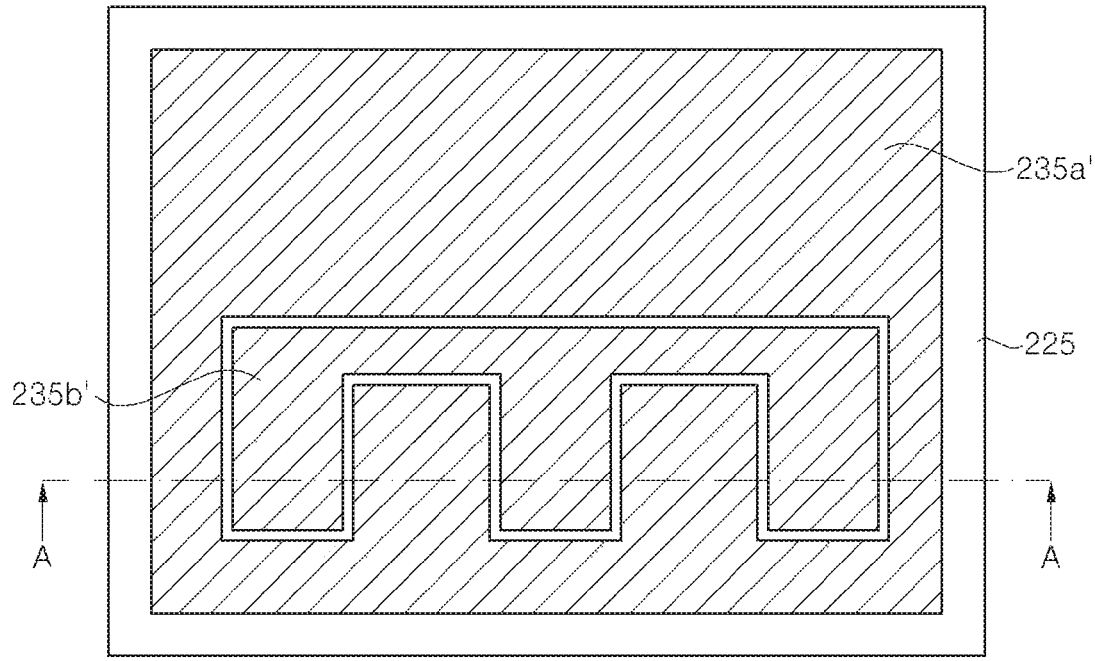
(a)
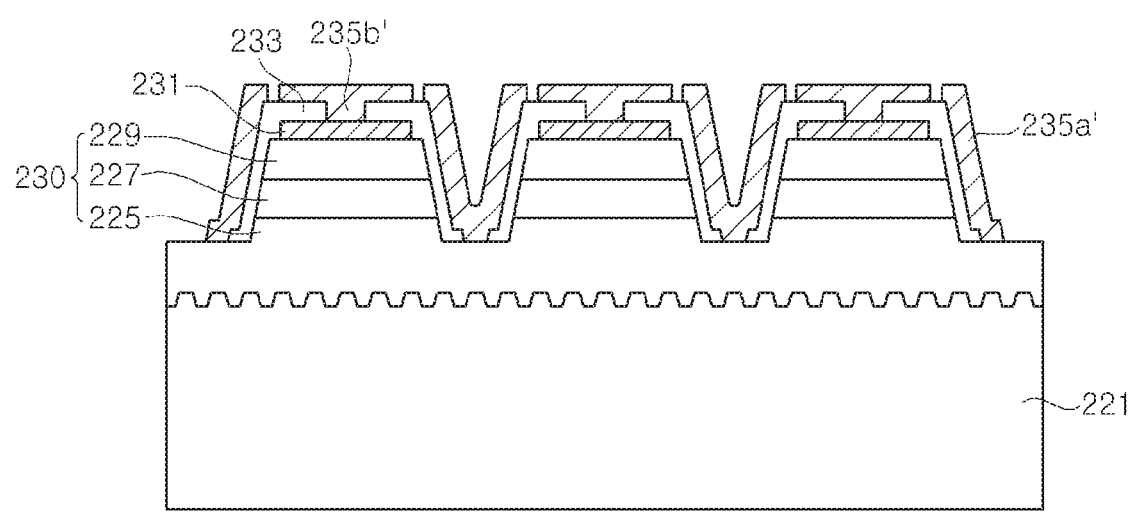
(b)
FIG. 41B

FIG. 42A
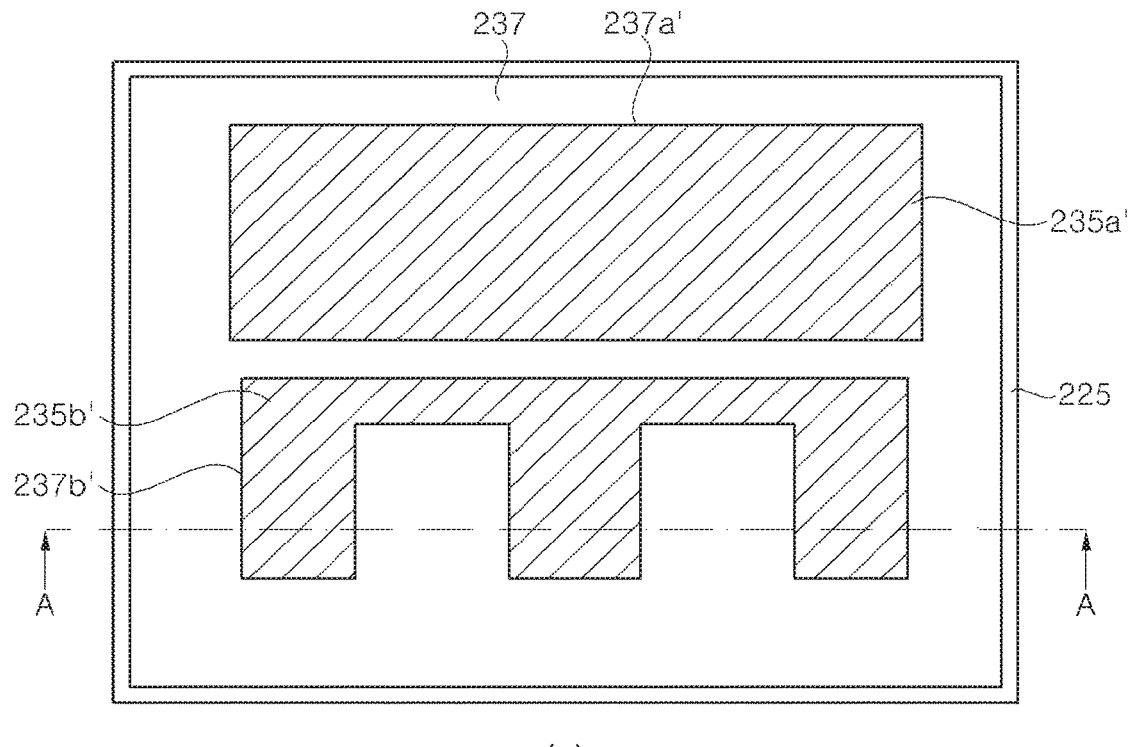
(a)
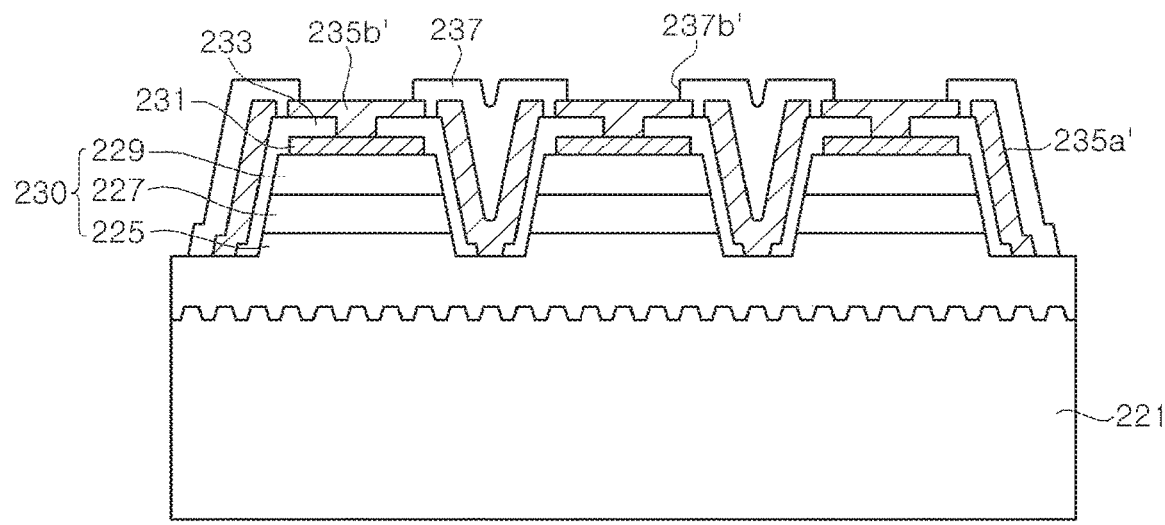
(b)
FIG. 42B

FIG. 43A
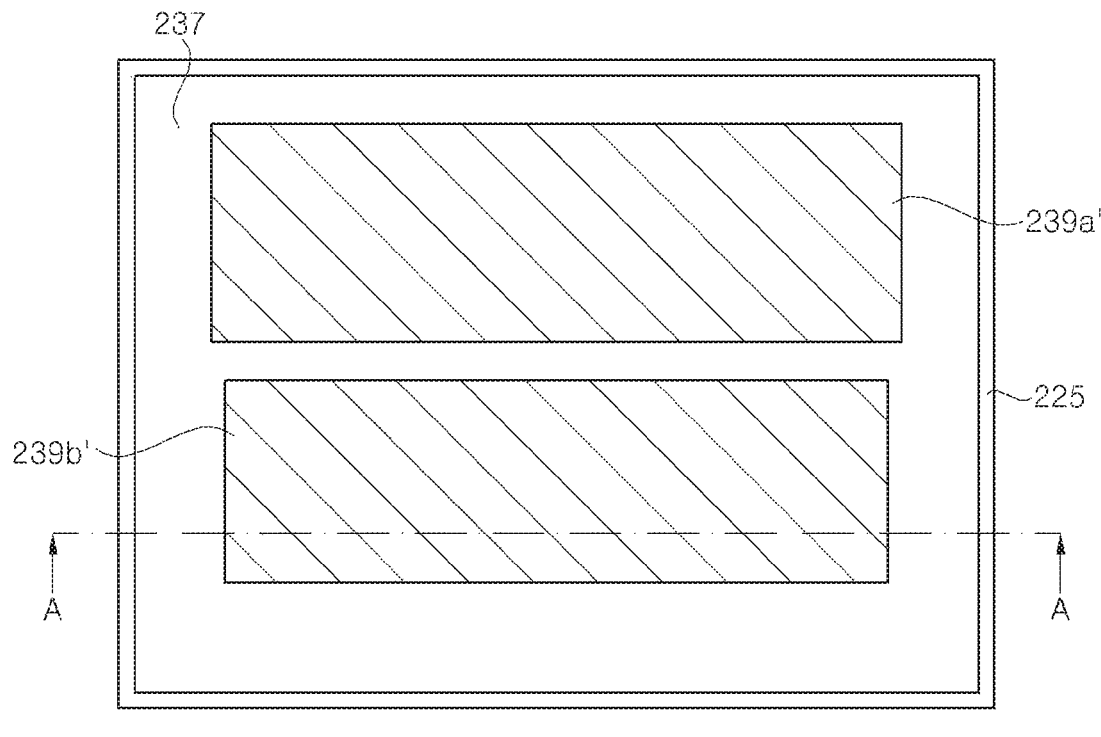
(a)
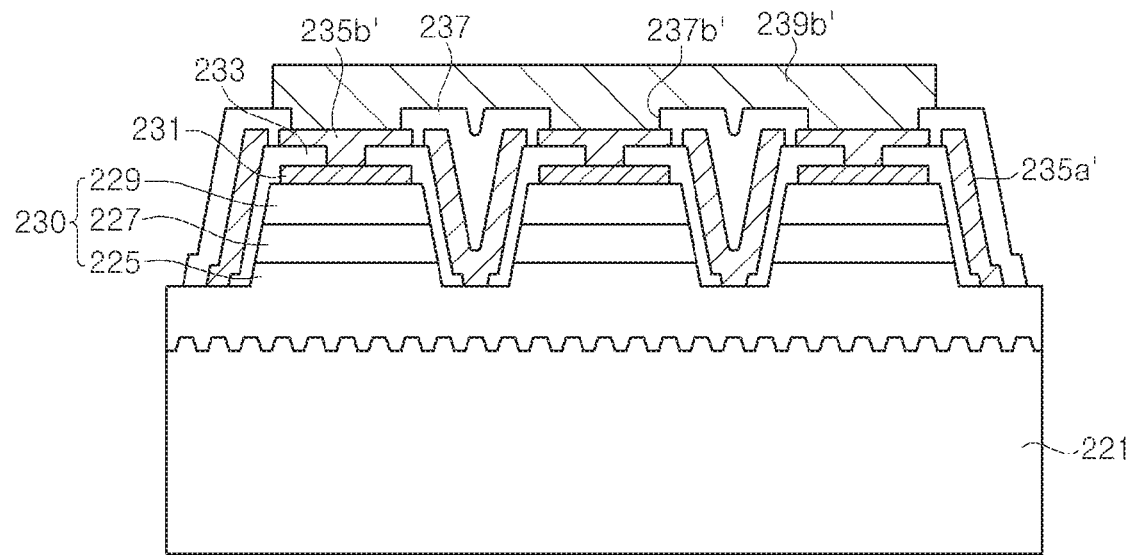
(b)
FIG. 43B

FIG. 44A
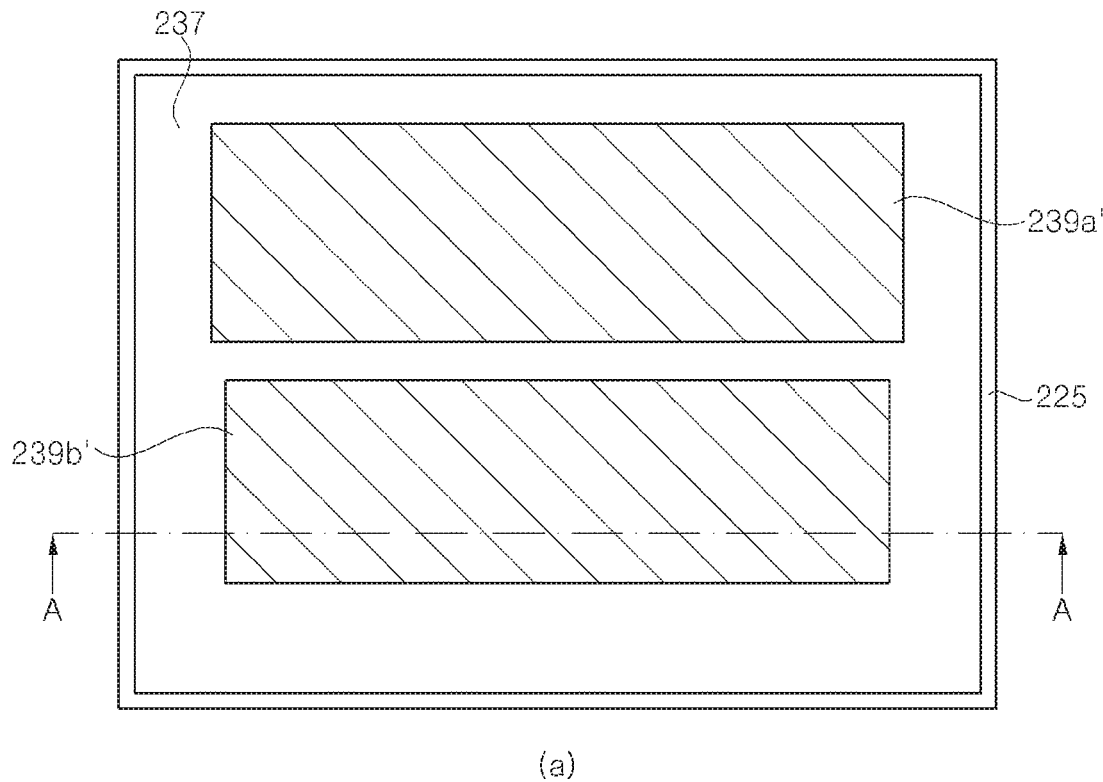
(a)
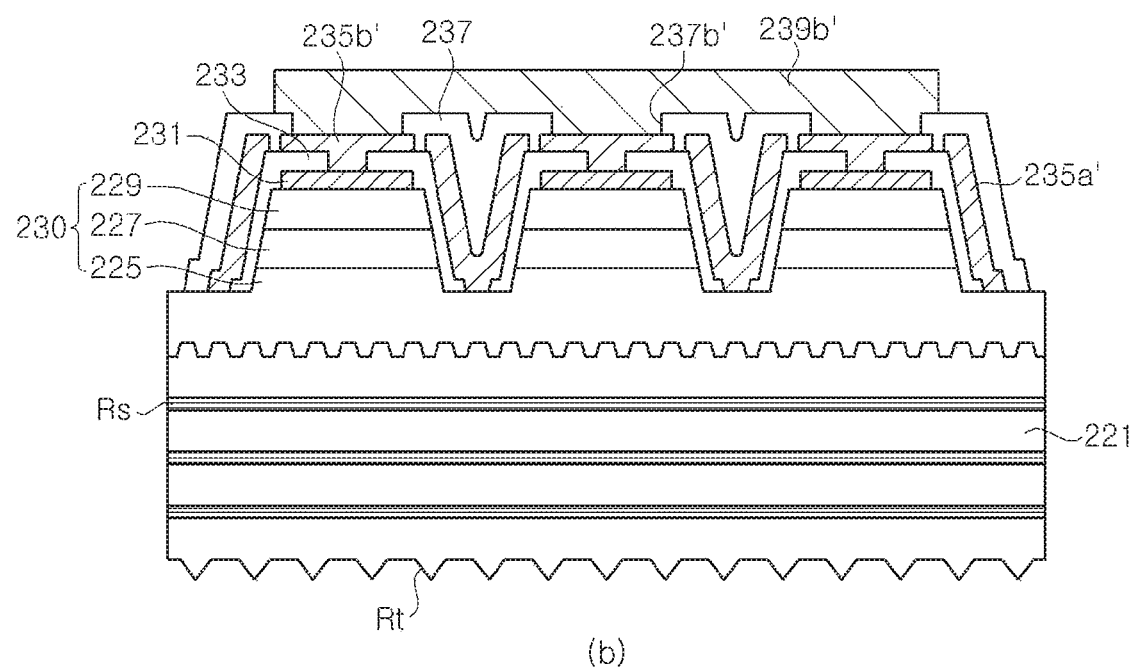
(b)
FIG. 44B

UV LIGHT EMITTING DIODE PACKAGE AND LIGHT EMITTING DIODE MODULE HAVING THE SAME

CROSS-REFERENCE TO RELATED APPLICATION

This application claims the benefit and priority to Chinese Utility Model Patent Application No. 201620257376.5, filed on Mar. 30, 2016, which is hereby incorporated by reference as part of this application for all purposes.

BACKGROUND

Technical Field

The disclosed technology relates to a light emitting diode package, a light emitting module having the same and their fabrication method.

Background

A light emitting diode (LED) is a semiconductor device that includes an N-type semiconductor and a P-type semiconductor, and emits light through recombination of holes and electrons. Such an LED has been used in a wide range of applications such as display devices, traffic lights, and backlight units. Further, considering the potential merits of lower power consumption and longer lifespan than existing electric bulbs or fluorescent lamps, the application range of LEDs has been expanded to general lighting by replacing existing incandescent lamps and fluorescent lamps. Furthermore, UV light emitting diodes are applied to various fields such as sterilization, medicines and medical treatment, banknote identification, and the like.

The LED may be used in an LED module. The LED module is manufactured through a process of fabricating an LED chip at a wafer level, a packaging process, and a modulation process. Specifically, semiconductor layers are grown on a substrate such as a sapphire substrate, and subjected to a wafer-level patterning process to fabricate LED chips having electrode pads, followed by division into individual chips (chip fabrication process). Then, after mounting the individual chips on a lead frame or a printed circuit board, the electrode pads are electrically connected to lead terminals via bonding wires, and the LED chips are covered by a molding member, thereby providing an LED package (packaging process). Then, the LED package is mounted on a circuit board such as a metal core printed circuit board (MC-PCB), thereby providing an LED module such as a light source module (modulation process).

In the packaging process, a housing and/or the molding member may be provided to the LED chip to protect the LED chip from the external environment. In addition, a phosphor may be contained in the molding member to convert light emitted by the LED chip so that the LED package may emit a white light, thereby providing a white LED package. Such a white LED package may be mounted on the circuit board such as the MC-PCB and a secondary lens may be provided to the LED package to adjust orientation characteristics of light emitted from the LED package, thereby providing a desired white LED module.

However, it may be difficult to achieve miniaturization and satisfactory heat dissipation of the conventional LED package including the lead frame or printed circuit board. Furthermore, luminous efficiency of the LED may be deteriorated due to absorption of light by the lead frame or the printed circuit board, electric resistance heating by the lead terminals, and the like. Moreover, UV LEDs create greater amounts of heat than blue LEDs and thus require further improvement in heat dissipation performance.

In addition, the chip fabrication process, the packaging process, and the modulation process may be separately carried out, thereby increasing time and costs for manufacturing the LED module.

Meanwhile, alternating current (AC) LEDs have been produced and marketed. The AC LED includes an LED directly connected to an AC power source to permit continuous emission of light. One example of AC LEDs, which can be used by being directly connected to a high voltage AC power source, is disclosed in U.S. Pat. No. 7,417,259, issued to Sakai, et. al.

According to U.S. Pat. No. 7,417,259, LED elements are arranged in a two-dimensional pattern on an insulating substrate, for example, a sapphire substrate, and are connected in series to form LED arrays. The LED arrays are connected in series to each other, thereby providing a light emitting device that can be operated at high voltage. Further, such LED arrays may be connected in reverse parallel to each other on the sapphire substrate, thereby providing a single-chip light emitting device that can be operated to continuously emit light using an AC power supply.

Since the AC-LED includes light emitting cells on a growth substrate, for example, on a sapphire substrate, the AC-LED restricts the structure of the light emitting cells and may limit improvement of light extraction efficiency. Thus, investigation has been made into a light emitting diode, for example, an AC-LED that is based on a substrate separation process and includes light emitting cells connected in series to each other.

SUMMARY

Exemplary embodiments of the disclosed technology provide a LED package, a LED module having the same, and a method of fabricating the same. In some implementations, the LED package can be directly formed in a module on a circuit board without using a conventional lead frame or printed circuit board. Exemplary embodiments of the disclosed technology also provide a wafer-level LED package and a method of fabricating the same, which has high efficiency and exhibits improved heat dissipation. Exemplary embodiments of the disclosed technology also provide a method of fabricating an LED package, which may reduce manufacturing time and cost of an LED module. Exemplary embodiments of the disclosed technology also provide an LED module and a method of fabricating the same, which has high efficiency and exhibits improved heat dissipation. Exemplary embodiments of the disclosed technology also provide a wafer-level light emitting diode package and a method of fabricating the same, which includes a plurality of light emitting cells and may be directly formed in a module on a circuit board without using a conventional lead frame or printed circuit board. Exemplary embodiments of the disclosed technology also provide a UV light emitting diode package adapted to emit UV, and a light emitting diode module having the same.

Exemplary embodiments of the disclosed technology disclose an LED package including: a semiconductor stack including a first conductive type semiconductor layer, an active layer, and a second conductive type semiconductor layer; a plurality of contact holes arranged in the second conductive type semiconductor layer and the active layer, the contact holes exposing the first conductive type semiconductor layer; a first bump arranged on a first side of the semiconductor stack, the first bump being electrically connected to the first conductive type semiconductor layer via the plurality of contact holes; a second bump arranged on the first side of the semiconductor stack, the second bump being electrically connected to the second conductive type semiconductor layer; and a protective insulation layer covering a sidewall of the semiconductor stack.

In some implementations, the active layer may have a peak wavelength of 405 nm or less, specifically 385 nm or less, more specifically 365 nm or less.

Exemplary embodiments of the disclosed technology also discloses a light emitting diode module including the LED package according to the aforementioned exemplary embodiments. The LED module may include a circuit board; the LED package mounted on the circuit board; and a lens to adjust an orientation angle of light emitted from the LED package.

Exemplary embodiments of the disclosed technology also disclose a method of fabricating an LED package. The method includes forming a semiconductor stack including a first conductive type semiconductor layer, an active layer, and a second conductive type semiconductor layer on a first substrate; patterning the semiconductor stack to form a chip separation region; patterning the second conductive type semiconductor layer and the active layer to form a plurality of contact holes exposing the first conductive type semiconductor layer; forming a protective insulation layer covering a sidewall of the semiconductor stack in the chip separation region; and forming a first bump and a second bump on the semiconductor stack. The first bump is electrically connected to the first conductive type semiconductor layer via the plurality of contact holes, and the second bump is electrically connected to the second conductive type semiconductor layer.

Exemplary embodiments of the disclosed technology also disclose a light emitting diode package. The LED package includes a plurality of light emitting cells each including a first conductive type semiconductor layer, an active layer, and a second conductive type semiconductor layer; a plurality of contact holes arranged in the second conductive type semiconductor layer and the active layer of each of the light emitting cells, the contact holes exposing the first conductive type semiconductor layer thereof; a protective insulation layer covering a sidewall of each of the light emitting cells; a connector located arranged on a first side of the light emitting cells and electrically connecting two adjacent light emitting cells to each other; a first bump arranged on the first side of the light emitting cells and electrically connected to the first conductive type semiconductor layer via the plurality of contact holes of a first light emitting cell of the light emitting cells; and a second bump arranged in the first side of the light emitting cells and electrically connected to the second conductive type semiconductor layer of a second light emitting cell of the light emitting cells.

Exemplary embodiments of the disclosed technology also disclose a light emitting diode module including the LED package described above. The module includes a circuit board; the LED package arranged on the circuit board; and a lens to adjust an orientation angle of light emitted from the LED package.

Exemplary embodiments of the disclosed technology also disclose a method of fabricating an LED package including a plurality of light emitting cells. The method includes forming a semiconductor stack including a first conductive type semiconductor layer, an active layer, and a second conductive type semiconductor layer on a first substrate; patterning the semiconductor stack to form a chip separation region and a light emitting cell separation region; patterning the second conductive type semiconductor layer and the active layer to form a plurality of light emitting cells, each light emitting cell having a plurality of contact holes exposing the first conductive type semiconductor layer; forming a protective insulation layer covering a sidewall of the semiconductor stack in the chip separation region and the light emitting cell separation region; forming a connector connecting adjacent light emitting cells in series to each other; and forming a first bump and a second bump on the plurality of light emitting cells. Here, the first bump is electrically connected to the first conductive type semiconductor layer via the plurality of contact holes of a first light emitting cell of the light emitting cells, and the second bump is electrically connected to the second conductive type semiconductor layer of a second light emitting cell of the light emitting cells.

In another aspect, a light emitting diode (LED) package is provided to comprise: a semiconductor stack comprising a first conductive type semiconductor layer, an active layer, and a second conductive type semiconductor layer; a plurality of contact holes arranged in the second conductive type semiconductor layers and the active layer, the contact holes exposing the first conductive type semiconductor layer; a first bump arranged on a first side of the semiconductor stack, the first bump being electrically connected to the first conductive type semiconductor layer via the plurality of contact holes; a second bump arranged on the first side of the semiconductor stack, the second bump being electrically connected to the second conductive type semiconductor layer; and a protective insulation layer covering a sidewall of the semiconductor stack. In some implementations, the LED package further comprises a wavelength converter arranged on a second side of the semiconductor stack, the second side being opposite to the first side of the semiconductor stack. In some implementations, the wavelength converter comprises a phosphor sheet or an impurity-doped single crystal substrate. In some implementations, the wavelength converter comprises a side surface flush with a side surface of the protective insulation layer. In some implementations, the protective insulation layer comprises a distributed Bragg reflector. In some implementations, the first conductive type semiconductor layer comprises a roughened surface. In some implementations, the LED package further comprises an insulation layer arranged on side surfaces of the first bump and the second bump. In some implementations, the LED package further comprises a dummy bump arranged between the first bump and the second bump. In some implementations, the LED package further comprises a substrate comprising a first through-hole and a second through-hole, the first bump and the second bump being arranged in the first through-hole and the second through-hole, respectively. In some implementations, the substrate comprises sapphire or silicon. In some implementations, the LED package further comprises: a first contact layer comprising first contact sections contacting the first conductive type semiconductor layer in the plurality of contact holes and a connecting section connecting the first contact sections to each other; and a second contact layer contacting the second conductive type semiconductor layer, wherein the protective insulation layer comprises a first insulation layer and a second insulation layer, the first insulation layer being arranged between the first contact layer and the second contact layer and covering the second contact layer, and the second insulation layer being arranged between the semiconductor stack and the first contact layer and covering the first contact layer, wherein the first bump is electrically connected to the first contact layer, and the second bump is electrically connected to the second contact layer. In some implementations, the LED package further comprising: a first electrode pad contacting the first contact layer through a first contact hole arranged in the second insulation layer; and a second electrode pad contacting the second contact layer though a second contact hole arranged in the second insulation layer and the first insulation layer, wherein the first bump and the second bump contact the first electrode pad and the second electrode pad, respectively. In some implementations, at least one of the first insulation layer and the second insulation layer comprises a distributed Bragg reflector.

In another aspect, a method of fabricating a light emitting diode (LED) package is provided to comprise: forming a semiconductor stack on a first substrate, the semiconductor stack comprising a first conductive type semiconductor layer, an active layer, and a second conductive type semiconductor layer; patterning the semiconductor stack to form a chip separation region; patterning the second conductive type semiconductor layer and the active layer to form a plurality of contact holes exposing the first conductive type semiconductor layer; forming a protective insulation layer covering a sidewall of the semiconductor stack in the chip separation region; and forming a first bump and a second bump on the semiconductor stack, wherein the first bump is electrically connected to the first conductive type semiconductor layer via the plurality of contact holes, and the second bump is electrically connected to the second conductive type semiconductor layer.

In another aspect, a method of fabricating a light emitting diode (LED) package is provided to include: forming a semiconductor stack on a first substrate, the semiconductor stack comprising a first conductive type semiconductor layer, an active layer, and a second conductive type semiconductor layer; patterning the semiconductor stack to form a chip separation region and a light emitting cell separation region; patterning the second conductive type semiconductor layer and the active layer to form a plurality of light emitting cells, each light emitting cell comprising a plurality of contact holes exposing the first conductive type semiconductor layer; forming a protective insulation layer covering a sidewall of the semiconductor stack in the chip separation region and the light emitting cell separation region; forming a connector connecting adjacent light emitting cells to each other in series; and forming a first bump and a second bump on the plurality of light emitting cells, wherein the first bump is electrically connected to the first conductive type semiconductor layer via the plurality of contact holes of a first light emitting cell of the light emitting cells, and the second bump being electrically connected to the second conductive type semiconductor layer of a second light emitting cell of the light emitting cells.

In some implementations, the first substrate comprises an impurity for converting a wavelength of light generated in the active layer. In some implementations, the method further comprise: removing the first substrate to expose the first conductive type semiconductor layer; and attaching a phosphor sheet to the exposed first conductive type semiconductor layer. In some implementations, the forming of the protective insulation layer comprises forming a first insulation layer and a second insulation layer. In some implementations, the method further comprises: forming a second contact layer on the second conductive type semiconductor layer; forming the first insulation layer to cover the second contact layer and sidewalls of the plurality of contact holes, the first insulation layer comprising openings exposing the first conductive type semiconductor layer in the plurality of contact holes; forming a first contact layer on the first insulation layer, the first contact layer comprising: contact sections contacting the first conductive type semiconductor layer exposed in the plurality of contact holes; and a connecting section connecting the contact sections to each other; forming the second insulation layer to cover the first contact layer; patterning the first insulation layer and the second insulation layer to form an opening exposing the first contact layer; forming an opening exposing the second contact layer; and forming a first electrode pad and a second electrode pad on the second insulation layer, the first electrode pad and the second electrode pad to be respectively connected to the first contact layer and the second contact layer through the openings, wherein the first bump and the second bump are electrically connected to the first electrode pad and the second electrode pad, respectively.

In some implementations, the forming of the first bump and the second bump comprises forming an insulation layer pattern having openings exposing regions of the first electrode pad and the second electrode pad, and plating the exposed regions of the first electrode pad and the second electrode pad with a metallic material. In some implementations, the method further comprises: forming a dummy bump between the first bump and the second bump. In some implementations, the method further comprises bonding a second substrate on the first electrode pad and the second electrode pad before forming the first bump and the second bump, wherein forming the first bump and the second bump comprises forming a plurality of through-holes in the second substrate, filling the through-holes with a metallic material, and bonding the metallic material to the first electrode pad and the second electrode pad. In some implementations, the method further comprises: before bonding the second substrate, forming an insulation layer covering the first electrode pad and the second electrode pads, and patterning the insulation layer to expose the first electrode pad and the second electrode pad.

In some implementations, the forming the first bump and the second bump comprises forming a plurality of through-holes in the insulation substrate, filling the through-holes with a metallic material, and bonding the metallic material to the first electrode pad and the second electrode pad. In some implementations, the method further comprises: before forming the dummy bump, forming a third insulation layer to cover the first electrode pad, the second electrode pad, and the connector, and patterning the third insulation layer to expose the first electrode pad and the second electrode pad.

In another aspect, a light emitting diode (LED) package is provided to comprise: a plurality of light emitting cells each comprising a first conductive type semiconductor layer, an active layer, and a second conductive type semiconductor layer; a plurality of contact holes arranged in the second conductive type semiconductor layer and the active layer of each of the light emitting cells, the contact holes exposing the first conductive type semiconductor layer of each of the light emitting cells; a protective insulation layer covering a sidewall of each of the light emitting cells; a connector located arranged on a first side of the light emitting cells and electrically connecting two adjacent light emitting cells to each other; a first bump arranged on the first side of the light emitting cells and electrically connected to the first conductive type semiconductor layer via the plurality of contact holes of a first light emitting cell of the light emitting cells;

and a second bump arranged on the first side of the light emitting cells and electrically connected to the second conductive type semiconductor layer of a second light emitting cell of the light emitting cells.

In some implementations, the LED package further comprises a wavelength converter arranged on a second side of the plurality of light emitting cells, the second side being opposite to the first side of the plurality of light emitting cells. In some implementations, wherein the wavelength converter comprises a phosphor sheet or an impurity-doped single crystal substrate. In some implementations, the wavelength converter has a side surface flush with a side surface of the protective insulation layer. In some implementations, the protective insulation layer comprises a distributed Bragg reflector. In some implementations, the first conductive type semiconductor layer of each of the light emitting cells comprises a roughened surface. In some implementations, the LED package of claim 25, further comprising an insulation layer arranged on side surfaces of the first bump and the second bump. In some implementations, the LED package further comprises a dummy bump arranged between the first bump and the second bump. In some implementations, the LED package further comprises a substrate comprising a first through-hole and a second through-hole, the first bump and the second bump being arranged in the first through-hole and the second through-hole, respectively.

In some implementations, the substrate comprises grooves arranged in a lower surface thereof and filled with a metallic material. In some implementations, the LED package further comprises: a first contact layer comprising first contact sections contacting the first conductive type semiconductor layer of each of the light emitting cells in the plurality of contact holes and a connecting section connecting the first contact sections to each other; and a second contact layer contacting the second conductive type semiconductor layer of each of the light emitting cells, wherein the protective insulation layer comprises a first insulation layer and a second insulation layer, the first insulation layer being arranged between the first contact layer and the second contact layer and covering the second contact layer, and a second insulation layer being arranged between the semiconductor stack and the first contact layer and covering the first contact layer, wherein the connector is arranged directly under the second insulation layer, the connector to connect the first contact layer and the second contact layer to each other, the first bump contacting the first contact layer of the first light emitting cell, and the second bump is contacting the second contact layer of the second light emitting cell. In some implementations, the LED package further comprises: a first electrode pad contacting the first contact layer of the first light emitting cell through a first contact hole arranged in the second insulation layer; and a second electrode pad contacting the second contact layer of the second light emitting cell though a second contact hole arranged in the second insulation layer and the first insulation layer, wherein the first bump and the second bump contact the first electrode pad and the second electrode pad, respectively. In some implementations, the connector is arranged at a same level as the first electrode pad and the second electrode pad. In some implementations, the LED package further comprises a third insulation layer being arranged between the dummy bump and the connector. In some implementations, at least one of the first insulation layer and second insulation layer comprises a distributed Bragg reflector.

In another aspect, a light emitting diode module is provided to comprise: a circuit board; the LED package that is configured as discussed above and arranged on the circuit board; and a lens to adjust an orientation angle of light emitted from the LED package. In some implementations, the circuit board comprises a metal core printed circuit board (MC-PCB), and a plurality of the LED packages are mounted on the MC-PCB.

Exemplary embodiments of the present disclosed technology also disclose a UV light emitting diode package. The UV LED package includes: an upper semiconductor layer; a mesa disposed under the upper semiconductor layer, having an inclined side surface, and including an active layer and a lower semiconductor layer; a first insulation layer covering the mesa and having an opening exposing the upper semiconductor layer; a first contact layer contacting the upper semiconductor layer through the opening of the first insulation layer; a second contact layer disposed between the mesa and the first insulation layer and contacting the lower semiconductor layer; a first electrode pad and a second electrode pad disposed under the first contact layer and electrically connected to the first contact layer and the second contact layer, respectively; and a second insulation layer disposed between the first contact layer and the first and second electrode pads, wherein the active layer emits UV light having a wavelength of 405 nm or less.

In some implementations, the upper semiconductor layer comprises a greater concentration of Al than a well layer of the active layer to allow light having a wavelength 10 nm or more shorter than peak wavelengths of light emitted from the active layer to pass therethrough. In some implementations, the active layer emits UV light having a wavelength of 365 nm or less. In some implementations, the UV LED package further comprises: a growth substrate located on the first conductive type upper semiconductor layer. In some implementations, the growth substrate has a thickness of 150 μm or more. In some implementations, the growth substrate has a thickness of 300 μm or more. In some implementations, the growth substrate has a roughened surface on an upper surface thereof. In some implementations, the upper semiconductor layer has unevenness on an upper surface thereof. In some implementations, the upper semiconductor layer comprises an AlN layer having a thickness of 2 μm or more. In some implementations, the upper semiconductor layer further comprises a superlattice layer between the AlN layer and the active layer. In some implementations, the lower semiconductor layer comprises a layer having a greater Ga content or a smaller Al content than a well layer of the active layer in order to absorb light emitted from the active layer. In some implementations, the first insulation layer is a reflector formed by stacking insulation layers having different indices of refraction. In some implementations, the first contact layer comprises a reflective metal layer. In some implementations, the first contact layer contacts the upper semiconductor layer between the mesa and an edge of the upper semiconductor layer along a periphery of the mesa. In some implementations, the first contact layer further contacts the upper semiconductor layer through bays or through-holes formed in the mesa.

Exemplary embodiments of the disclosed technology also disclose a UV light emitting diode module. The UV LED module includes: a circuit board having first and second pads; and a UV LED package mounted on the circuit board, wherein a first electrode pad and a second electrode pad of the UV LED package are electrically connected to the first pad and the second pad, respectively. The UV LED package is the same as the UV LED package set forth above. In some implementations, the circuit board is a ceramic printed circuit board having a metal interconnection line embedded therein. In some implementations, the UV LED module of claim 16, further comprising: a first metal bump and a second metal bump between the first pad and the second pad and between the first electrode pad and the second electrode pad, respectively. In some implementations, the UV LED module of claim 18, wherein each of the first and second metal bumps has a single layer or multilayer structure formed of a material selected from the group consisting of Sn, AuSn, Au, and NiSn. In some implementations, the UV LED module further comprises: a light guide part covering the UV LED package.

In another aspect, a light emitting diode (LED) package is provided to comprise: a semiconductor stack including a first conductive type semiconductor layer, a second conductive type semiconductor layer and an active layer interposed between the first and second semiconductor layers, wherein the second conductive type semiconductor layer and the active layer are structured to expose the first conductive type semiconductor layer on sides of the semiconductor stack; a first electrical contact disposed to contact the first conductive type semiconductor layer on the sides of the semiconductor stack and to provide a first electrical contact path to the semiconductor stack; a second electrical contact disposed to contact the second conductive type semiconductor layer and to provide a second electrical contact path to the semiconductor stack; an inner insulation layer formed on the sides of the semiconductor stack to cover an external sidewall of the semiconductor stack to protect the semiconductor stack from an external environment; and an outer insulation layer formed to cover a side surface of the inner insulation layer.

In some implementations, the external sidewall of the semiconductor stack is inclined. In some implementations, the first electrical contact is disposed between the inner insulation layer and the outer insulation layer. In some implementations, the inner insulation layer includes a single layer including silicon oxide or silicon nitride. In some implementations, the inner insulation layer includes an optically reflective structure. In some implementations, the inner insulation layer includes a distributed Bragg reflector. In some implementations, the inner insulation layer includes layers of silicon oxide or silicon nitride. In some implementations, the inner insulation layer includes a silicon oxide layer and a distributed Bragg reflector. In some implementations, the inner insulation layer extends to cover the second electrical contact to protect the second electrical contact from an external environment. In some implementations, the outer insulation layer includes a single layer including silicon dioxide or silicon nitride. In some implementations, the outer insulation layer includes multiple layers. In some implementations, the outer insulation layer includes an optically reflective structure. In some implementations, the outer insulation layer includes a distributed Bragg reflector. In some implementations, the outer insulation layer extends to cover the first electrical contact and the second electrical contact to protect the first electrical contact and the second electrical contact from the external environment. In some implementations, the outer insulation layer includes phosphor materials. In some implementations, the first electrical contact and the second electrical contact are arranged on a first surface of the semiconductor stack and the outer insulation layer further extends to cover a second surface of the semiconductor stack opposite to the first surface. In some implementations, the LED package further includes: a first bump electrically coupled to the first conductive type semiconductor layer by the first electrical contact; a second bump electrically coupled to the second conductive type semiconductor layer by the second electrical contact; and an additional insulation layer formed over the inner insulation layer and the outer insulation layer to cover side surfaces of the first and second bumps to protect the first and second bumps from an external environment. In some implementations, the additional insulation layer includes a polymer. In some implementations, the second conductive type semiconductor layer has a thickness smaller than that of the first conductive type semiconductor layer. In some implementations, the first conductive type semiconductor layer has a roughened surface.

In another aspect, a light emitting diode (LED) package is provided to comprise: a semiconductor stack including a first conductive type semiconductor layer having a first surface and a second surface opposite to the first surface, an active layer formed on the first surface of the first conductive type semiconductor layer, and a second conductive type semiconductor layer formed on the active layer, wherein the first conductive type semiconductor layer is formed on sides of the semiconductor stack without the active layer and the second conductive type semiconductor layer formed on the first conductive type semiconductor layer; a first insulation layer formed on a side of the semiconductor stack to cover a side surface of the semiconductor stack; a second insulation layer formed on the side of the semiconductor stack to cover a side surface of the first insulation layer, the second insulation layer covering the side surface of the semiconductor stack; and a third insulation layer formed on the side of the semiconductor stack to cover a side surface of the second insulation layer, the third insulation layer covering the side surface of the semiconductor stack, a first electrical contact path disposed closer to the first surface of the first conductive type semiconductor layer than the second surface of the first conductive type semiconductor layer and electrically contacting with the first conductive type semiconductor layer; and a second electrical contact path disposed closer to the first surface of the first conductive type semiconductor layer than the second surface of the first conductive type semiconductor layer and electrically contact with the second conductive type semiconductor layer.

In some implementations, the side surface of the semiconductor stack is inclined. In some implementations, the first electrical contact path is provided between the first insulation layer and the second insulation layer. In some implementations, the first electrical contact path is provided on the sides of the semiconductor stack. In some implementations, the first insulation layer and the second insulation layer include a transparent insulation layer. In some implementations, the LED package further comprises an optically reflective structure between the first and second insulation layers. In some implementations, the first insulation layer includes a transparent insulation layer and the second insulation layer includes an optically reflective structure. In some implementations, the optically reflective structure includes a distributed Bragg reflector. In some implementations, the optically reflective structure includes a distributed Bragg reflector reflecting light having wavelength corresponding to one of blue light, green light, or red light. In some implementations, the third insulation layer extends to cover the first electrical contact path and the second electrical contact path to protect the first electrical contact path and the second electrical contact path from the external environment. In some implementations, the third insulation layer includes phosphor material. In some implementations, the third insulation layer is phosphor-free. In some implementations, the LED package further comprises an additional insulation layer formed on the side of the semiconductor stack to cover a side surface of the third insulation layer, the additional layer covering the side surface of the semiconductor stack. In some implementations, the additional insulation layer includes phosphor material. In some implementations, the LED package further includes a wavelength convertor arranged on the second surface of the first conductive type semiconductor layer and including phosphor material. In some implementations, the second conductive type semiconductor layer has a thickness smaller than that of the first conductive type semiconductor layer. In some implementations, the first surface of the first conductive type semiconductor layer has a roughness.

In one aspect, a light emitting diode (LED) package is provided to comprise one or more light emitting diodes to emit light, wherein each single light emitting diode includes: a semiconductor stack comprising a first conductive type semiconductor layer, an active layer, and a second conductive type semiconductor layer; a plurality of contact holes arranged in and surrounded by the second conductive type semiconductor layer and the active layer, the contact holes exposing to penetrate through the second conductive type semiconductor layer and the active layer to expose the first conductive type semiconductor layer; a first bump arranged on a first side of the semiconductor stack, the first bump being electrically connected to the first conductive type semiconductor layer via the plurality of contact holes; and a second bump arranged on the first side of the semiconductor stack, the second bump being electrically connected to the second conductive type semiconductor layer; and wherein the LED package further includes a protective insulation layer covering each external side wall surface a sidewall of the semiconductor stack facing externally of the LED package so that the protection insulation layer surrounds the LED package.

In some implementations, the LED package further comprises a wavelength converter arranged on a second side of the semiconductor stack, the second side being opposite to the first side of the semiconductor stack. In some implementations, the wavelength converter comprises a phosphor sheet or an impurity-doped single crystal substrate. In some implementations, the wavelength converter comprises a side surface flush with a side surface of the protective insulation layer. In some implementations, the protective insulation layer comprises a distributed Bragg reflector. In some implementations, the first conductive type semiconductor layer comprises a roughened surface. In some implementations, the LED package further comprises an insulation layer arranged on side surfaces of the first bump and the second bump. In some implementations, the LED package further comprises a dummy bump arranged between the first bump and the second bump. In some implementations, the LED package further comprises a substrate comprising a first through-hole and a second through-hole, the first bump and the second bump being arranged in the first through-hole and the second through-hole, respectively. In some implementations, the substrate comprises sapphire or silicon. In some implementations, the LED package further comprises: a first contact layer comprising first contact sections contacting the first conductive type semiconductor layer in the plurality of contact holes and a connecting section connecting the first contact sections to each other; and a second contact layer contacting the second conductive type semiconductor layer, wherein the protective insulation layer comprises a first insulation layer and a second insulation layer, the first insulation layer being arranged between the first contact layer and the second contact layer and covering the second contact layer, and the second insulation layer being arranged between the semiconductor stack and the first contact layer and covering the first contact layer, wherein the first bump is electrically connected to the first contact layer, and the second bump is electrically connected to the second contact layer. In some implementations, the LED package further comprises: a first electrode pad contacting the first contact layer through a first contact hole arranged in the second insulation layer; and a second electrode pad contacting the second contact layer though a second contact hole arranged in the second insulation layer and the first insulation layer, wherein the first bump and the second bump contact the first electrode pad and the second electrode pad, respectively. In some implementations, at least one of the first insulation layer and the second insulation layer comprises a distributed Bragg reflector.

In another aspect, a light emitting diode (LED) module is provided to comprise: a circuit board; the above-discussed LED package arranged on the circuit board; and a lens to adjust an orientation angle of light emitted from the LED package. In some implementations, the circuit board comprises a metal core printed circuit board (MC-PCB), and a plurality of the LED packages is arranged on the MC-PCB.

In another aspect, a structure having light emitting diode (LED) packages is provided to comprise: a stack of layers formed over one another and patterned to include an array of LED package regions, each LED package region including (1) a LED package formed in the stack of layers in a central region of the LED package region and (2) a protective insulation structure formed to surround and protect the LED package from surroundings outside the protective insulation structure and to separate from adjacent LED packages, wherein each LED package formed in the stack of layers includes: a semiconductor stack including a first conductive type semiconductor layer, a second conductive type semiconductor layer and an active layer between the first and second semiconductor layers to generate light under an electrical signal applied to the first and second type semiconductor layers, wherein the semiconductor stack is located between a first side and a second side of the semiconductor stack that are on opposite sides of the semiconductor stack; contact holes formed as through holes in each semiconductor stack and surrounded by the second conductive type semiconductor layer and the active layer to pass therethrough so as to expose the first conductive type semiconductor layer; a first electrical contact layer material filling in the contact holes to be electrically coupled to the first conductive type semiconductor layer and connecting the first contact holes; a first bump on the first side of the semiconductor stack and electrically coupled to the first conductive type semiconductor layer via the first electrical contact layer material; and a second bump on the first side of the semiconductor stack and electrically insulated from the first bump to be electrically coupled to the second conductive type semiconductor layer, and wherein the protective insulation structure includes a two-layer protective structure having a first protective insulation layer that surrounds and covers each external side wall surface of the semiconductor stack and a second protective insulation layer that forms on the first protective insulation layer to protect the semiconductor stack from an external environment.

In some implementations, the structure comprises a wafer on which the stack of layers is formed and is patterned to include the array of LED package regions. In some implementations, each of the contact holes is tapered to have a larger end facing the second side and a smaller end facing the first side. In some implementations, the protective insulation structure further covers an entirety of each external side surface of an electrical contact structure that includes the first and second bumps on the first side of the semiconductor stack to protect the electrical contact structure from an external environment. In some implementations, each contact hole is formed to extend into a portion of the first conductive type semiconductor layer so that a portion of the first electrical contact material reaches into the portion of the first conductive type semiconductor layer to be in contact with the first conductive type semiconductor layer. In some implementations, each LED package formed in the stack of layers includes: a dummy bump that is electrically conductive, formed on the first side of the semiconductor stack between the first and second bumps to be electrically insulated from the first and second bumps to dissipate heat from the LED package.

In another aspect, a light emitting diode (LED) package is provided to comprise: a semiconductor stack comprising a first conductive type semiconductor layer, a second conductive type semiconductor layer and an active layer that is interposed between the first and second semiconductor layers to generate light under an electrical signal applied to the first and second type semiconductor layers, wherein the semiconductor stack is located between a first side and a second side of the semiconductor stack that are on opposite sides of the semiconductor stack, and wherein the first side is closer to the second conductive type semiconductor layer than the first conductive type semiconductor layer and the second side is closer to the first conductive type semiconductor layer than the second conductive type semiconductor layer; contact holes formed as through holes in the semiconductor stack within an area for a single light emitting diode to be surrounded by the second conductive type semiconductor layer and the active layer to pass therethrough so as to expose the first conductive type semiconductor layer within openings created by the contact holes; an electrical contact structure on the first side of the semiconductor stack and electrically coupled to supply the electrical signal to the first and second type semiconductor layers via the contact holes, the electrical contact structure including (1) a first bump formed of an electrically conductive material and arranged on the first side of the semiconductor stack and electrically coupled to the first conductive type semiconductor layer as part of a first electrical contact path to the semiconductor stack via the contact holes, (2) a first electrical contact layer material disposed to fill in the contact holes and to electrically couple the first conductive type semiconductor layer and the first bump via the contact holes, (3) a second bump formed of the electrically conductive material of the first bump and arranged on the first side of the semiconductor stack and electrically insulated from the first bump to be electrically coupled to the second conductive type semiconductor, and (4) a second electrical contact layer material electrically coupled between the second bump and the second conductive type semiconductor layer; and an external structure that covers (1) the second side of the semiconductor stack that exports light generated in the active layer outside the LED package, and (2) side wall surfaces of the semiconductor stack.

In some implementations, the external structure includes: a first stacked protective insulation structure positioned to cover the entirety of each external side wall surface of the semiconductor stack to protect the semiconductor stack from an external environment; and a second stacked protective insulation structure stacked over the first stacked protective insulation structure and located on the first side of the semiconductor stack to cover an entirety of each external side surface of the electrical contact structure to protect the electrical contact structure from an external environment. In some implementations, the external structure further covers external side wall surfaces of the electrical contact structure on the first side of the semiconductor stack. In some implementations, the external structure includes: a first protective insulation layer covering an entirety of each external side wall surface of the semiconductor stack; and a second protective insulation layer that surrounds the semiconductor stack and forms on the first protective insulation layer so that the second protective insulation layer and the first protective insulation collectively form a two-layer protection structure to cover the entirety of each external side wall surface of the semiconductor stack and to enclose external sides of the semiconductor stack. In some implementations, the composite insulation structure includes a phosphor structure that is formed of a phosphor composition that coverts light emitted from the active layer into light at a different wavelength to be exported on the second side out of the LED package. In some implementations, the LED package further comprises: a dummy bump formed of the electrically conductive material and arranged on the first side of the semiconductor stack near the first bump or second bump to dissipate heat from the LED package, wherein the dummy bump is not electrically connected to the first bump or the second bump.

In another aspect, a light emitting diode (LED) package, comprising one or more light emitting diodes to emit light, is provided wherein each single light emitting diode includes: a semiconductor stack comprising a first conductive type semiconductor layer, a second conductive type semiconductor layer and an active layer that is interposed between the first and second semiconductor layers to generate light under an electrical signal applied to the first and second type semiconductor layers, the first conductive type semiconductor layer shaped to include an inclined side wall; a plurality of contact holes arranged in, and surrounded by the second conductive type semiconductor layer and the active layer, to penetrate through the second conductive type semiconductor layer and the active layer to expose the first conductive type semiconductor layer; a first bump arranged on a first side of the semiconductor stack and electrically coupled to the first conductive type semiconductor layer via the plurality of contact holes; a second bump arranged on the first side of the semiconductor stack and electrically coupled to the second conductive type semiconductor layer; and a protective insulation layer covering a sidewall of the semiconductor stack of each light emitting diode and having a thickness that varies along the sidewall of the semiconductor stack.

In some implementations, the protective insulation layer includes a two-layer protective structure having a first protective insulation layer that includes a uniform thickness along the sidewall of the semiconductor stack and a second protective insulation layer that has a varying thickness along the sidewall of the semiconductor stack. In some implementations, the second protective insulation layer is formed on the first protective insulation layer. In some implementations, the protective insulation layer covers side walls of the first conductive type semiconductor layer, the active layer, and the second conductive type semiconductor layer. In some implementations, each single light emitting diode further includes: a first contact layer electrically coupling the first conductive type semiconductor layer and the first bump via the contact holes; and a second contact layer electrically coupled between the second conductive type semiconductor layer and the second bump, wherein the protective insulation layer extends to cover the second contact layer, the extended portion of the protective insulation layer having a size greater than that of the second contact layer. In some implementations, the protective insulation layer includes an optically reflective structure to reflect light towards a second side of the semiconductor stack that is opposite to the first side of the semiconductor stack. In some implementations, the protective insulation layer has an inclined shape along the sidewall of the semiconductor stack. In some implementations, each light emitting diode further includes: a dummy bump formed of an electrically conductive material and arranged on the first side of the semiconductor stack between the first and second bumps to dissipate heat from the LED package, wherein the dummy bump is electrically insulated from the first and second bumps.

It is to be understood that both the foregoing general description and the following detailed description are exemplary and explanatory. The above and other aspects of the disclosed technology and examples of their implementations are described in greater detail in the drawings, the description and the claims.

BRIEF DESCRIPTION OF THE DRAWINGS

The accompanying drawings, which are included to provide a further understanding of the disclosed technology and are incorporated in and constitute a part of this specification, illustrate exemplary embodiments of the disclosed technology, and together with the description serve to explain the principles of the disclosed technology.

FIG. 3 is a sectional view of a light emitting diode module including the light emitting diode package according to the first exemplary embodiment.

FIG. 4 to FIG. 12 show a process of fabricating the light emitting diode package according to the first exemplary embodiment, in which A in view numbers has been used to show a plan view and B in view numbers has been used to show a sectional view taken along line A-A of corresponding plan views in FIG. 5A to FIG. 10B.

FIG. 13 is a sectional view showing a method of fabricating the light emitting diode package according to the second exemplary embodiment of the disclosed technology.

FIG. 15 is a schematic sectional view of a light emitting diode package according to a fourth exemplary embodiment of the disclosed technology.

FIG. 16 is a sectional view of a light emitting diode module including the light emitting diode package according to the third exemplary embodiment.

FIG. 17 to FIG. 26 show a process of fabricating the light emitting diode package according to the third exemplary embodiment, in which A in view numbers has been used to show a plan view and B in view numbers has been used to show is a sectional view taken along line A-A of corresponding plan views in FIG. 18A to FIG. 23B.

FIG. 27 is a sectional view showing a method of fabricating the light emitting diode package according to the fourth exemplary embodiment of the disclosed technology.

FIGS. 30A and 30B are schematic sectional views of a light emitting diode module including a plurality of light emitting diode packages according to the fifth exemplary embodiment of the disclosed technology.

FIG. 31 to FIG. 38B show a process of fabricating the light emitting diode package according to the fifth exemplary embodiment of the disclosed technology, in which A in view numbers has been used to show a plan view and B in view numbers has been used to show a sectional view taken along line A-A of corresponding plan views in FIG. 32A to FIG. 38B.

FIG. 40A to FIG. 44B are schematic plan views of other modifications of the light emitting diode package according to the fifth exemplary embodiment of the disclosed technology, in which A in view numbers has been used to show a plan view and B in view numbers has been used to show a sectional view taken along line A-A of corresponding plan views in FIG. 40A to FIG. 44B.

DETAILED DESCRIPTION OF THE ILLUSTRATED EMBODIMENTS

Figure 1:
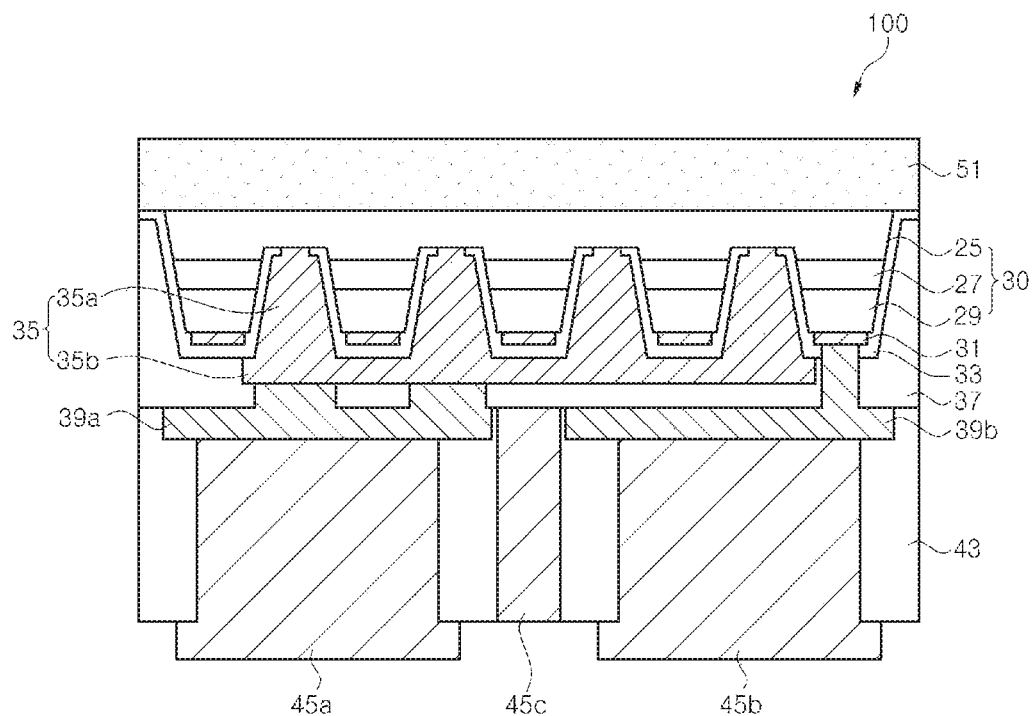
FIG. 1 is a schematic sectional view of a light emitting diode package according to a first exemplary embodiment of the disclosed technology.

The disclosed technology is described in more detail hereinafter with reference to the accompanying drawings, in which exemplary embodiments of the disclosed technology are shown. This disclosed technology may, however, be embodied in many different forms and should not be construed as limited to the exemplary embodiments set forth herein. Rather, these exemplary embodiments are provided to facilitate the understanding of various aspects of the disclosed technology. In the drawings, the sizes and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 is a schematic sectional view of an LED package 100 according to a first exemplary embodiment of the disclosed technology.

Referring to FIG. 1, the LED package 100 may include a semiconductor stack 30, a first contact layer 35, a second contact layer 31, a first insulation layer 33, a second insulation layer 37, a first electrode pad 39a, a second electrode pad 39b, a first bump 45a, and a second bump 45b. The LED package 100 may further include an insulation layer 43, a dummy bump 45c, and a wavelength convertor 51.

The semiconductor stack 30 includes a first conductive type upper semiconductor layer 25, an active layer 27, and a second conductive type lower semiconductor layer 29. The active layer 27 is interposed between the upper and lower semiconductor layers 25, 29.

The active layer 27 and the upper and lower semiconductor layers 25, 29 may be composed of or include a III-N based compound semiconductor, for example, (Al, Ga, In)N semiconductor. Each of the upper and lower semiconductor layers 25, 29 may be a single layer or multiple layers. For example, the upper and/or lower semiconductor layers 25, 29 may include a super lattice layer in addition to a contact layer and a clad layer. The active layer 27 may have a single quantum well structure or a multi-quantum well structure. The first conductive type may be an n-type and the second conductive type may be a p-type. Alternatively, the first conductive type may be a p-type and the second conductive type may be an n-type. Since the upper semiconductor layer 25 can be formed of or include an n-type semiconductor layer having relatively low specific resistance, the upper semiconductor layer 25 may have a relatively high thickness. Therefore, a roughened surface R may be formed on an upper surface of the upper semiconductor layer 25, in which the roughened surface R enhances extraction efficiency of light generated in the active layer 27.

The semiconductor stack 30 has a plurality of contact holes 30a (see FIG. 5B) formed through the second conductive type lower semiconductor layer 29 and the active layer 27 to expose the first conductive type upper semiconductor layer, and the first contact layer 35 contacts the first conductive type upper semiconductor layer 25 exposed in the plurality of contact holes.

The second contact layer 31 contacts the second conductive type lower semiconductor layer 29. The second contact layer 31 includes a reflective metal layer to reflect light generated in the active layer 27. Further, the second contact layer 31 may form an ohmic contact with the second conductive type lower semiconductor layer 29.

The first insulation layer 33 covers the second contact layer 31. Further, the first insulation layer 33 covers a sidewall of the semiconductor stack 30 exposed in the plurality of contact holes 30a. In addition, the first insulation layer 33 may cover a side surface of the semiconductor stack 30. The first insulation layer 33 insulates the first contact layer 35 from the second contact layer 31 while insulating the second conductive type lower semiconductor layer 29 and the active layer 27 exposed in the plurality of contact holes 30a from the first contact layer 35. The first insulation layer 33 may be composed of a single layer or multiple layers. The first insulation layer 33 may include a transparent insulation layer such as a silicon oxide or silicon nitride film. Alternatively, the first insulation layer 33 may include an optically reflective insulation layer. For example, the first insulation layer 33 may include a distributed Bragg reflector. In some implementations, the distributed Bragg reflector is formed by alternately stacking insulation layers having different indices of refraction, for example, $SiO_2/TiO_2$ or $SiO_2/Nb_2O_5$. In some implementations, the distributed Bragg reflector is configured to reflect light having wavelength corresponding to one of blue light, green light, or red light. In device designs where the first insulation layer 33 includes multiple layers, the first insulation layer 33 may include two or more insulation layers. In some implementations, the first insulation layer 33 may have a combined structure including a transparent insulation material and a reflective insulation material. For example, the first insulation layer 33 includes two layers including a transparent insulation layer and a reflective insulation layer. For example, the first insulation layer 33 may include three layers including a transparent insulation layer, a reflective insulation layer, and a transparent insulation layer that are stacked in order. The multilayer structure of the first insulation layer 33 can be embodied in various manners to include an additional layer and/or provide various combination of the transparent insulation material and the reflective insulation material.

The first contact layer 35 is located under the first insulation layer 33 and contacts the first conductive type upper semiconductor layer 25 through the first insulation layer 33 in the plurality of contact holes 30a. The first contact layer 35 includes contact sections 35a contacting the first conductive type upper semiconductor layer 25, and a connecting section 35b connecting the contact sections 35a to each other. Therefore, the contact sections 35a are electrically connected to each other by the connecting section 35b. The first contact layer 35 is formed under some regions of the first insulation layer 33 and may be composed of a reflective metal layer.

The second insulation layer 37 covers the first contact layer 35 under the first contact layer 35. In addition, the second insulation layer 37 covers the first insulation layer 33 while covering a side surface of the semiconductor stack 30. For example, the second insulation layer 37 is formed over sides of the semiconductor stack 30 to cover a side surface of the first insulation layer 33. By doing so, the second insulation layer 37 can provide additional protection of the semiconductor stack 30 from the external environment. The second insulation layer 37 may be composed of or include a single layer or multiple layers. Further, the second insulation layer 37 may be or include an optical reflective structure including, for example, a distributed Bragg reflector. In some implementations, the second insulation layer 37 including the distributed Bragg reflector is configured to reflect light having wavelength corresponding to one of blue light, green light, or red light.

The first and second electrode pads 39a, 39b are located under the second insulation layer 37. The first electrode pad 39a may be connected to the first contact layer 35 through the second insulation layer 37. Further, the second electrode pad 39b may be connected to the second contact layer 31 through the second insulation layer 37 and the first insulation layer 33.

The first bump 45a and the second bump 45b are located under the first and second electrode pads 39a, 39b to be connected thereto, respectively. The first and second bumps 45a, 45b may be formed by plating. The first and second bumps 45a, 45b are terminals electrically connected to a circuit board such as an MC-PCB and have coplanar distal ends. In addition, the first electrode pad 39a may be formed at the same level as that of the second electrode pad 39b, so that the first bump 45a and the second bump 45b may also be formed on the same plane. Therefore, the first and second bumps 45a, 45b may have the same height.

Meanwhile, the dummy bump 45c may be located between the first bump 45a and the second bump 45b. The dummy bump 45c may be formed together with the first and second bumps 45a and 45b to provide a heat passage for discharging heat from the semiconductor stack 30.

The insulation layer 43 may cover side surfaces of the first and second bumps 45a, 45b. The insulation layer 43 may also cover a side surface of the dummy bump 45c. In addition, the insulation layer 43 fills spaces between the first bump 45a, the second bump 45b and the dummy bump 45c to prevent moisture from entering the semiconductor stack 30 from outside. The insulation layer 43 also covers side surfaces of the first and second electrode pads 39a, 39b to protect the first and second electrode pads 39a, 39b from external environmental factors such as moisture. Although the insulation layer 43 may be configured to cover the overall side surfaces of the first and second bumps 45a, 45b, but other implementations are possible. Alternatively, the insulation layer 43 may cover the side surfaces of the first and second bumps 45a, 45b except for some regions of the side surface near distal ends of the first and second bumps. In some implementations, the insulation layer 43 may include suitable insulation materials and may be free of phosphors. In some implementations, such an insulation layer 43 covering side walls of the stack provide an additional light conversion mechanism for converting the emitted light into light of a different wavelength by including one or more phosphor materials. When the insulation layer 43 is structured to provide both desired insulation and light conversion, the wavelength convertor layer 51 may also be formed with the same material as the light converting insulation layer 43. In some device designs, the light-converting insulation layer 43 and the wavelength convertor layer 51 may be formed as one contiguous structure to wrap around the LED package 100 on the top and sides in the example in FIG. 1.

In the present exemplary embodiment, the insulation layer 43 is illustrated as covering the side surfaces of the first and second electrode pads 39a and 39b, but other implementations are possible. Alternatively, another insulation layer may be used to cover the first and second electrode pads 39a, 39b and the insulation layer 43 may be formed under the other insulation layer. In this case, the first and second bumps 45a, 45b may be connected to the first and second electrode pads 39a, 39b through the other insulation layer.

The wavelength convertor 51 may be located on the first conductive type upper semiconductor layer 25 opposite to the rest of the semiconductor stack 30. The wavelength convertor 51 may contact an upper surface of the first conductive type upper semiconductor layer 25. The wavelength convertor 51 may be or include a phosphor sheet or material having a uniform thickness without being limited thereto. Alternatively, the wavelength converter 51 may be or a substrate, for example, a sapphire substrate or a silicon substrate, which is doped with an impurity for wavelength conversion. In some implementations, the wavelength convertor 51 including a phosphor material may be extended to cover a side of the semiconductor stack 30. In this case, the wavelength convertor 51 may be formed as an integral structure with the outmost insulation layer covering a side of the semiconductor stack 30.

In the present exemplary embodiment, the side surface of the semiconductor stack 30 is covered with a protective insulation layer. The protective insulation layer may include, for example, the first insulation layer 33 and/or the second insulation layer 37. In addition, the first contact layer 35 may be covered with the second insulation layer 37 to be protected from an external environment and the second contact layer 31 may be covered with the first insulation layer 33 and the second insulation layer 37 to be protected from an external environment. The first and second electrode pads 39a, 39b are also protected by, for example, the insulation layer 43. Accordingly, it is possible to prevent deterioration of the semiconductor stack 30 due to moisture.

The wavelength convertor 51 may be attached to the first conductive type upper semiconductor layer 25 at a wafer-level, and then divided together with the protective insulation layer during a chip separation process. Therefore, a side surface of the wavelength convertor 51 may be in a line with the protective insulation layer. That is, the side surface of the wavelength converter 51 may be flush along a straight line with a side surface of the protective insulation layer. Further, the side surface of the wavelength convertor 51 may be in a line with a side surface of the insulation layer 43. Thus, the side surfaces of the wavelength converter 51, the protective insulation layer, and the insulation layer 43 may all be flush along a straight line.

Figure 2:
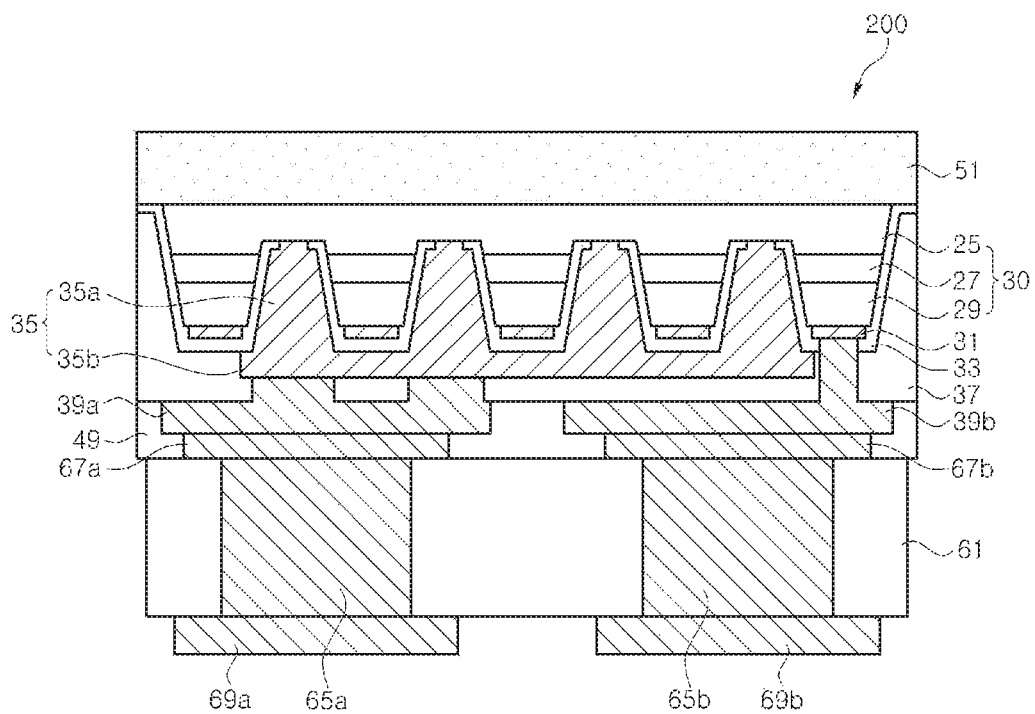
FIG. 2 is a schematic sectional view of a light emitting diode package according to a second exemplary embodiment of the disclosed technology.

FIG. 2 is a schematic sectional view of a light emitting diode package 200 according to a second exemplary embodiment of the disclosed technology.

Referring to FIG. 2, the LED package 200 is similar to the LED package 100 according to the above exemplary embodiment. In the present exemplary embodiment, however, first and second bumps 65a, 65b are formed in a substrate 61.

Specifically, the substrate 61 includes through-holes, which have the first and second bumps 65a, 65b formed therein, respectively. The substrate 61 is an insulation substrate, for example, a sapphire substrate or a silicon substrate, but is not limited thereto. The substrate 61 having the first and second bumps 65a, 65b may be attached to a first electrode pad 39a and a second electrode pad 39b. In this case, to prevent the first and second electrode pads 39a, 39b from being exposed to the outside, an insulation layer 49 may cover side surfaces and bottom surfaces of the first and second electrode pads 39a, 39b. Further, the insulation layer 49 may have openings, which expose the first and second electrode pads 39a, 39b, and additional metal layers 67a, 67b are then formed in the openings. The additional metal layers 67a, 67b may be composed of a bonding metal.

FIG. 3 is a sectional view of a light emitting diode module including the LED package 100 according to the first exemplary embodiment.

Referring to FIG. 3, the LED module includes a circuit board 71, for example, an MC-PCB, the LED package 100, and a lens 81. The circuit board 71, for example, the MC-PCB, has connection pads 73a, 73b for mounting the LED packages 100 thereon. The first and second bumps 45a, 45b (see FIG. 1) of the LED package 100 are connected to the connection pads 73a, 73b, respectively.

A plurality of LED packages 100 may be mounted on the circuit board 71 and the lens 81 may be disposed on the LED packages 100 to adjust an orientation angle of light emitted from the LED packages 100.

In accordance with the second exemplary embodiment, the light emitting diode packages 200 may be mounted on the circuit board instead of the LED packages 100.

FIG. 4A to FIG. 12 show a process of fabricating the LED package 100 according to the first exemplary embodiment. In FIG. 5A to FIG. 10B, A is a plan view and B is a sectional view taken along line A-A of a corresponding plan view.

Referring to FIG. 4, a semiconductor stack 30, which includes a first conductive type semiconductor layer 25, an active layer 27 and a second conductive type semiconductor layer 29, is formed on a growth substrate 21. The growth substrate 21 may be a sapphire substrate but is not limited thereto. Alternatively, the growth substrate 21 may be another kind of heterogeneous substrate, for example, a silicon substrate. Each of the first and second conductive type semiconductor layers 25, 29 may be composed of a single layer or multiple layers. Further, the active layer 27 may have a single-quantum well structure or multi-quantum well structure.

The compound semiconductor layers may be formed of III-N based compound semiconductor on the growth substrate 21 by metal organic chemical vapor deposition (MOCVD) or molecular beam epitaxy (MBE).

A buffer layer (not shown) may be formed before forming the compound semiconductor layers. The buffer layer is formed to relieve lattice mismatch between the growth substrate 21 and the compound semiconductor layers and may be formed of a GaN-based material layer such as gallium nitride or aluminum nitride.

Referring to FIGS. 5A and 5B, the semiconductor stack 30 is patterned to form a chip (package) separation region 30b while patterning the second conductive type semiconductor layer 29 and the active layer 27 to form a plurality of contact holes 30a exposing the first conductive type semiconductor layer 25. The semiconductor stack 30 may be patterned by photolithography and etching processes.

The chip separation region 30b is a region for dividing the LED package structure into individual LED packages and side surfaces of the first conductive type semiconductor layer 25, the active layer 27 and the second conductive type semiconductor layer 29 are exposed on the chip separation region 30b. Advantageously, the chip separation region 30b may be configured to expose the substrate 21 without being limited thereto.

The plurality of contact holes 30a may have a circular shape, but is not limited thereto. The contact holes 30 may have a variety of shapes. The second conductive type semiconductor layer 29 and the active layer 27 are exposed to sidewalls of the plurality of contact holes 30a. As shown, the contact holes 30a may have slanted sidewalls.

Referring to FIGS. 6A and 6B, a second contact layer 31 is formed on the second conductive type semiconductor layer 29. The second contact layer 31 is formed on the semiconductor stack 30 except for regions corresponding to the plurality of contact holes 30a.

The second contact layer 31 may include a transparent conductive oxide film such as indium tin oxide (ITO) or a reflective metal layer such as silver (Ag) or aluminum (Al). The second contact layer 31 may be composed of a single layer or multiple layers. The second contact layer 31 may also be configured to form an ohmic contact with the second conductive type semiconductor layer 29.

The second contact layer 31 may be formed before or after formation of the plurality of contact holes 30a.

Referring to FIGS. 7A and 7B, a first insulation layer 33 is formed to cover the second contact layer 31. The first insulation layer 33 may cover the side surface of the semiconductor stack 30 exposed to the chip separation region 30b while covering the sidewalls of the plurality of contact holes 30a. Here, the first insulation layer 33 may have openings 33a, which expose the first conductive type semiconductor layer 25 in the plurality of contact holes 30a.

The first insulation layer 33 may be composed of a single layer or multiple layers. The first insulation layer 33 may include a transparent insulation layer such as a silicon oxide or silicon nitride film. Alternatively, the first insulation layer 33 may include an optically reflective insulation layer. For example, the first insulation layer include a distributed Bragg reflector, which is formed by alternately stacking insulation layers having different indices of refraction. For example, the first insulation layer 33 may be formed by alternately stacking $SiO_2/TiO_2$ or $SiO_2/Nb_2O_5$. In some implementations, the first insulation layer 33 may be formed to provide a distributed Bragg reflector having high reflectivity over a wide wavelength range of blue, green, and red light by adjusting the thickness of each of the insulation layers. In some implementations where the first insulation layer 33 includes multiple layers, the first insulation layer 33 may include two or more insulation layers. For example, the first insulation layer 33 may have a combined structure including a transparent insulation material and a reflective insulation material. For example, the first insulation layer 33 includes two layers including a transparent insulation layer and a reflective insulation layer. For example, the first insulation layer 33 may include three layers including a transparent insulation layer, a reflective insulation layer, and a transparent insulation layer that are stacked in order. The multilayer structure of the first insulation layer 33 can be embodied in various manners to include an additional layer and/or provide various combinations of the transparent insulation material and the reflective insulation material.

Referring to FIGS. 8A and 8B, a first contact layer 35 is formed on the first insulation layer 33. The first contact layer 35 includes contact sections 35a contacting the first conductive type upper semiconductor layer 25 exposed in the contact holes 30a, and a connecting section 35b connecting the contact sections 35a to each other. The first contact layer 35 may be composed of a reflective metal layer, but is not limited thereto.

The first contact layer 35 is formed on some regions of the semiconductor stack 30, so that the first insulation layer 33 is exposed on other regions of the semiconductor stack 30 where the first contact layer 35 is not formed.

Referring to FIGS. 9A and 9B, a second insulation layer 37 is formed on the first contact layer 35. The second insulation layer 37 may be composed of a single layer or multiple layers, such as a silicon oxide or silicon nitride film. Further, the second insulation layer 37 may include an optical reflective structure including, for example, a distributed Bragg reflector, which is formed by alternately stacking insulation layers having different indices of refraction. In some implementations, the second insulation layer 37 including the distributed Bragg reflector can be configured to reflect light having wavelength corresponding to one of blue light, green light, or red light.

The second insulation layer 37 may cover the first contact layer 35 while covering the first insulation layer 33. The second insulation layer 37 may also cover the side surface of the semiconductor stack 30 in the chip separation region 30b.

The second insulation layer 37 has an opening 37a which exposes the first contact layer 35. Further, the second insulation layer 37 and the first insulation layer 33 are formed with an opening 37b, which exposes the second contact layer 31.

Referring to FIGS. 10A and 10B, first and second electrode pads 39a, 39b are formed on the second insulation layer 37. The first electrode pad 39a is connected to the first contact layer 35 through the opening 37a and the second electrode pad 39b is connected to the second contact layer 31 through the opening 37b.

The first electrode pad 39a is separated from the second electrode pad 39b and each of the first and second electrode pads 39a, 39b may have a relatively large area from a top perspective, for example, an area not less than ⅓ of the area of the LED package.

Figure 11:
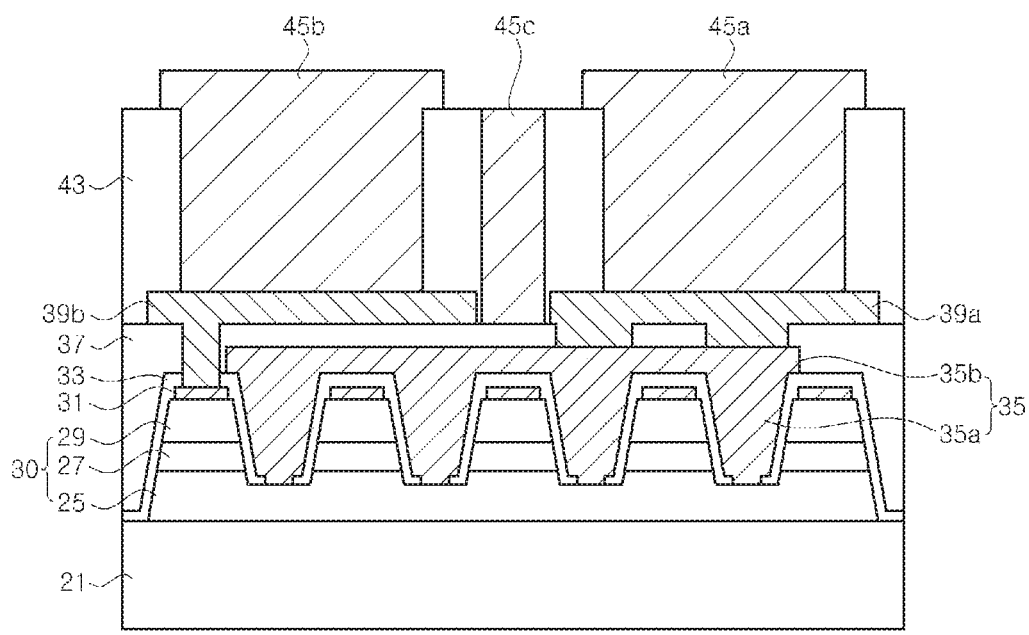

Referring to FIG. 11, an insulation layer 43 is formed on the first and second electrode pads 39a, 39b. The insulation layer 43 covers the first and second electrode pads 39a, 39b and has grooves which expose upper surfaces of the electrode pads 39a, 39b. Further, the insulation layer 43 may have a groove which exposes the second insulation layer 37 between the first and second electrode pads 39a, 39b.

Then, first and second bump 45a, 45b are formed in the grooves of the insulation layer 43, and a dummy bump 45c may be formed between the first bump and the second bump.

The bumps may be formed by plating, for example, electroplating, using a metallic material. If necessary, a seed layer for plating may also be formed.

After the first and second bumps 45a, 45b are formed, the insulation layer 43 may be removed. For example, the insulation layer 43 may be formed of a polymer such as photoresist and may be removed after the bumps are formed.

Alternatively, the insulation layer 43 may remain to protect the side surfaces of the first and second bumps 45a, 45b.

In the present exemplary embodiment, the insulation layer 43 is illustrated as being directly formed on the first and second electrode pads 39a, 39b. In other exemplary embodiments, another insulation layer may be formed to cover the first and second electrode pads 39a, 39b. The other insulation layer may be configured to have openings exposing the first and second electrode pads 39a, 39b. Then, the processes of forming the insulation layer 43 and the bumps may be carried out.

Referring to FIG. 12, the growth substrate 21 is removed and a wavelength convertor 51 is attached to the first conductive type semiconductor layer 25. The growth substrate 21 may be removed by an optical technique such as laser lift-off (LLO), mechanical polishing or chemical etching.

Then, the exposed surface of the first conductive type semiconductor layer 25 is subjected to anisotropic etching such as photoelectrochemical (PEC) etching to form a roughened surface on the exposed first conductive type semiconductor layer 25.

Meanwhile, the wavelength convertor such as a phosphor sheet containing phosphors may be attached to the first conductive type semiconductor layer 25.

Alternatively, the growth substrate 21 may contain an impurity for converting a wavelength of light generated in the active layer 27. In this case, the growth substrate 21 may be used as the wavelength convertor 51.

Then, the LED package structure is divided into individual packages along the chip separation region 30b, thereby providing finished LED packages 100. At this time, the second insulation layer 37 is cut together with the wavelength convertor 51 so that cut planes thereof can be formed in a line.

FIG. 13 is a sectional view showing a method of fabricating the LED package 200 according to the second exemplary embodiment of the disclosed technology.

Referring to FIG. 13, in the method of fabricating the LED package 200 according to the present exemplary embodiment, the processes until the first and second electrode pads 39a, 39b are formed are the same as those of the method of fabricating the LED package 100 described above (FIGS. 10 A and B).

After the first and second electrode pads 39a, 39b are formed, an insulation layer 49 is formed to cover the first and second electrode pads 39a, 39b. The insulation layer 49 may cover side surfaces of the first and second electrode pads 39a, 39b to protect the first and second electrode pads 39a, 39b. The insulation layer 49 has openings which expose the first and second electrode pads 39a, 39b. Additional metal layers 67a, 67b are then formed in the openings. The additional metal layers 67a, 67b may be composed of a bonding metal.

The substrate 61 is bonded to the first and second electrode pads 39a, 39b. The substrate 61 may have through-holes, in which the first and second bumps 65a, 65b may be formed. Further, the first and second bumps may be formed at distal ends thereof with pads 69a, 69b. The substrate 61 having the first and second bumps 65a, 65b and the pads 69a, 69b may be separately prepared and bonded to a wafer having the first and second electrode pads 39a, 39b.

Then, as described with reference to FIG. 12, the growth substrate 21 is removed and a wavelength convertor 51 may be attached to the first conductive type semiconductor layer 25, followed by division of the LED package structure into individual LED packages. As a result, the finished LED packages 200 as described in FIG. 2 are provided.

Figure 14:
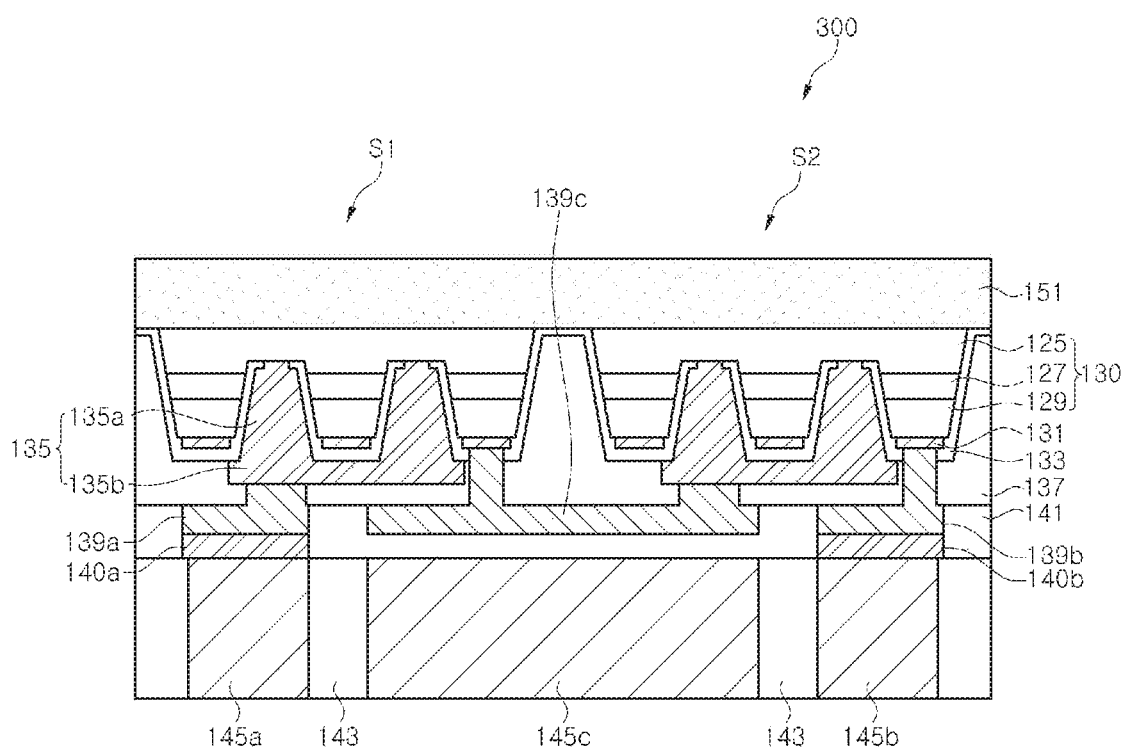
FIG. 14 is a schematic sectional view of a light emitting diode package according to a third exemplary embodiment of the disclosed technology.

FIG. 14 is a sectional view of an LED package 300 according to a third exemplary embodiment of the disclosed technology.

Referring to FIG. 14, the LED package 300 may include a semiconductor stack 130, which is divided into a plurality of light emitting cells (only two light emitting cells S1, S2 are shown herein), a first contact layer 135, a second contact layer 131, a first insulation layer 133, a second insulation layer 137, a first electrode pad 139a, a second electrode pad 139b, a connector 139c connecting adjacent light emitting cells to each other in series, a first bump 145a and a second bump 145b. Further, the LED package 300 may include a third insulation layer 141, an insulation layer 143, a dummy bump 145c, a wavelength convertor 151, and additional metal layers 140a, 140b.

The semiconductor stack 130 includes a first conductive type upper semiconductor layer 125, an active layer 127, and a second conductive type lower semiconductor layer 129. The semiconductor stack 130 of the present exemplary embodiment is similar to the semiconductor stack 30 described in FIG. 1, and a detailed description thereof will be omitted herein.

Each of the light emitting cells S1, S2 has a plurality of contact holes 130a (see FIG. 18B) extending through the second conductive type lower semiconductor layer 129 and the active layer 127 to expose the first conductive type upper semiconductor layer, and the first contact layer 135 contacts the first conductive type upper semiconductor layer 125 exposed in the plurality of contact holes. The light emitting cells S1, S2 are separated from each other by a cell separation region 130b (see FIG. 18B).

The second contact layer 131 contacts the second conductive type lower semiconductor layer 129 of each of the light emitting cells S1, S2. The second contact layer 131 includes a reflective metal layer to reflect light generated in the active layer 127. Further, the second contact layer 131 may form an ohmic contact with the second conductive type lower semiconductor layer 129.

The first insulation layer 133 covers the second contact layer 131. Further, the first insulation layer 133 covers a sidewall of the semiconductor stack 130 exposed in the plurality of contact holes 130a. In addition, the first insulation layer 133 may cover a side surface of each of the light emitting cells S1, S2. The first insulation layer 133 insulates the first contact layer 135 from the second contact layer 131 while insulating the second conductive type lower semiconductor layer 129 and the active layer 127 exposed in the plurality of contact holes 130a from the first contact layer 35. The first insulation layer 133 may be composed of a single layer or multiple layers, such as a silicon oxide or silicon nitride film. Furthermore, the first insulation layer 133 may be composed of a distributed Bragg reflector, which is formed by alternately stacking insulation layers having different indices of refraction, for example, $SiO_2/TiO_2$ or $SiO_2/Nb_2O_5$.

The first contact layer 135 is located under the first insulation layer 133 and contacts the first conductive type upper semiconductor layer 125 through the first insulation layer 133 in the plurality of contact holes 130a in each of the light emitting cells S1, S2. The first contact layer 135 includes contact sections 135a contacting the first conductive type upper semiconductor layer 125, and a connecting section 135b connecting the contact sections 135a to each other. Therefore, the contact sections 135a are electrically connected to each other by the connecting section 135b. The first contact layers 135 located under the respective light emitting cells S1, S2 are separated from each other and formed under some regions of the first insulation layer 133. The first contact layer 135 may be composed of a reflective metal layer.

The second insulation layer 137 covers the first contact layer 135 under the first contact layer 135. In addition, the second insulation layer 137 may cover the first insulation layer 133 while covering the side surface of each of the light emitting cells S1, S2. The second insulation layer 137 may be composed of a single layer or multiple layers. Alternatively, the second insulation layer 37 may be composed of a distributed Bragg reflector.

The first electrode pad 139a and the second electrode pad 139b are located under the second insulation layer 137. The first electrode pad 139a may be connected to the first contact layer 135 of a first light emitting cell S1 through the second insulation layer 137. Further, the second electrode pad 139b may be connected to the second contact layer 31 of a second light emitting cell S2 through the second insulation layer 137 and the first insulation layer 133.

The connector 139c is located under the second insulation layer 137 and electrically connects two adjacent light emitting cells S1, S2 to each other through the second insulation layer 137. The connector 139c may connect the second contact layer 131 of one light emitting cell S1 to the first contact layer 135 of another light emitting cell S2 adjacent thereto, so that the two light emitting cells S1, S2 are connected in series to each other.

In the present exemplary embodiment, two light emitting cells S1, S2 are illustrated. However, it should be understood that two or more light emitting cells may be connected in series to each other by a plurality of connectors 139c. Here, the first and second electrode pads 139a, 139b may be connected in series to the light emitting cells S1, S2 located at opposite ends of such series array.

Meanwhile, the third insulation layer 141 may cover the first electrode pad 139a, the second electrode pad 139b and the connector 139c under the first electrode pad 139a, the second electrode pad 139b and the connector 139c. The third insulation layer 141 may have an opening exposing the first electrode pad 139a and the second electrode pad 139b. The third insulation layer 141 may be formed of a silicon oxide or silicon nitride film.

The first bump 145a and the second bump 145b are located under the first and second electrode pads 139a, 139b, respectively. The first and second bumps 145a, 145b may be formed by plating. The first and second bumps 145a, 145b are terminals electrically connected to a circuit board such as an MC-PCB and have distal ends coplanar with each other. In addition, the first electrode pad 139a may be formed at the same level as that of the second electrode pad 139b, so that the first bump 45a and the second bump 45b may also be formed on the same plane. Therefore, the first and second bumps 45a, 45b may have the same height.

The additional metal layers 140a, 140b may be interposed between the first bump 145a and the first electrode pad 139a and between the second bump 145b and the second electrode pad 139b. Here, the additional metal layers 140a, 140b are provided to form the first and second electrode pads 139a, 139b to be higher than the connector 139c and may be located inside openings of the third insulation layer 141. The first and second electrode pads 139a, 139b and the additional metal layers 140a, 140b may constitute final electrode pads.

Meanwhile, the dummy bump 145c may be located between the first bump 145a and the second bump 145b. The dummy bump 145c may be formed together with the first and second bump 145a, 145b to provide a heat passage for discharging heat from the light emitting cells S1, S2. The dummy bump 145c is separated from the connector 139c by the third insulation layer 141.

The insulation layer 143 may cover side surfaces of the first and second bumps 145a, 145b. The insulation layer 143 may also cover a side surface of the dummy bump 145c. In addition, the insulation layer 143 fills spaces between the first bump 145a, the second bump 145b and the dummy bump 145c to prevent moisture from entering the semiconductor stack 130 from outside. Although the insulation layer 143 may be configured to cover the overall side surfaces of the first and second bumps 145a, 145b, other implementations are still possible. Alternatively, the insulation layer 143 may cover the side surfaces of the first and second bumps 145a, 145b except for some regions of the side surface near distal ends of the first and second bumps.

The wavelength convertor 151 may be located on the light emitting cells S1, S2. The wavelength convertor 151 may contact an upper surface of the first conductive type upper semiconductor layer 125. The wavelength convertor 151 also covers a cell separation region 130b and a chip separation region. The wavelength convertor 151 may be a phosphor sheet having a uniform thickness without being limited thereto. Alternatively, the wavelength converter 51 may be a substrate, for example, a sapphire substrate or a silicon substrate, which is doped with an impurity for wavelength conversion.

In the present embodiment, the side surfaces of the light emitting cells S1, S2 are covered with a protective insulation layer. The protective insulation layer may include, for example, the first insulation layer 133 and/or the second insulation layer 137. In addition, the first contact layer 135 may be covered with the second insulation layer 137 to be protected from external environment and the second contact layer 131 may be covered with the first insulation layer 133 and the second insulation layer 137 to be protected from external environment. Further, the first and second electrode pads 139a, 139b are also protected by, for example, the third insulation layer 141. Accordingly, it is possible to prevent deterioration of the light emitting cells S1, S2 due to moisture.

The wavelength convertor 151 may be attached to the first conductive type upper semiconductor layer 125 at a wafer-level, and then divided together with the protective insulation layer during a chip separation process (or package separation process). Therefore, a side surface of the wavelength convertor 151 may be in a line with the protective insulation layer. Further, the side surface of the wavelength convertor 151 may be in a line with a side surface of the insulation layer 143.

FIG. 15 is a schematic sectional view of a light emitting diode package 400 according to a fourth exemplary embodiment of the disclosed technology.

Referring to FIG. 15, the LED package 400 is similar to the LED package 300 according to the above exemplary embodiment. In present exemplary embodiment, however, first and second bumps 165a, 165b are formed in a substrate 161.

Specifically, the substrate 161 includes through-holes, which have the first and second bumps 165a, 165b formed therein, respectively. The substrate 161 is an insulation substrate, for example, a sapphire substrate or a silicon substrate, but is not limited thereto.

The substrate 161 having the first and second bumps 165a, 165b may be attached to a third insulation layer 141, and the first and second bumps 165a, 165b may be connected to first and second electrode pads 139a, 139b, respectively. Here, the first and second bumps 165a, 165b may be bonded to additional metal layers 140a, 140b, respectively.

FIG. 16 is a sectional view of a light emitting diode module including the LED packages 300 according to the third exemplary embodiment on a circuit board.

Referring to FIG. 16, the LED module includes a circuit board 171, for example, an MC-PCB, the LED package 300, and a lens 181. The circuit board 171, for example, the MC-PCB, has connection pads 173a, 173b for mounting the LED packages 300 thereon. The first and second bumps 145a, 145b (see FIG. 14) of the LED package 300 are connected to the connection pads 73a, 73b, respectively.

A plurality of LED packages 300 may be mounted on the circuit board 171 and the lens 181 may be disposed on the LED packages 300 to adjust an orientation angle of light emitted from the LED packages 300.

In other exemplary embodiments, instead of the LED packages 300, the light emitting diode packages 400 may be mounted on the circuit board.

FIG. 17 to FIG. 25 show a method of fabricating the LED package 300 according to the third exemplary embodiment. In FIG. 18 to FIG. 23, A is a plan view and B is a sectional view taken along line A-A of A.

Referring to FIG. 17, a semiconductor stack 130, which includes a first conductive type semiconductor layer 125, an active layer 127 and a second conductive type semiconductor layer 129, is formed on a growth substrate 121. The growth substrate 121 and the semiconductor stack 130 are similar to the substrate 21 and the semiconductor stack 30 described with reference to FIG. 4, and a detailed description thereof will thus be omitted herein.

Referring to FIGS. 18A and 18B, the semiconductor stack 130 is patterned to form a chip (package) separation region 130c and a cell separation region 130b while patterning the second conductive type semiconductor layer 129 and the active layer 127 to form light emitting cells S1, S2, each having a plurality of contact holes 130a exposing the first conductive type semiconductor layer 125. The semiconductor stack 130 may be patterned by photolithography and etching processes.

The chip separation region 130c is a region for dividing the LED package structure into individual LED packages and side surfaces of the first conductive type semiconductor layer 125, the active layer 127 and the second conductive type semiconductor layer 129 are exposed at the chip separation region 130c. Advantageously, the chip separation region 130c and the cell separation region 130b may be configured to expose the substrate 121 without being limited thereto.

The plurality of contact holes 130a may have a circular shape, but is not limited thereto. The contact holes 130 may have a variety of shapes. The second conductive type semiconductor layer 129 and the active layer 127 are exposed to sidewalls of the plurality of contact holes 130a. The contact holes 130a may have slanted sidewalls.

Referring to FIGS. 19A and 19B, a second contact layer 131 is formed on the second conductive type semiconductor layer 129. The second contact layer 131 is formed on the semiconductor stack 130 in each of the light emitting cells S1, S2 except for regions corresponding to the plurality of contact holes 130a.

The second contact layer 131 may include a transparent conductive oxide film such as indium tin oxide (ITO) or a reflective metal layer such as silver (Ag) or aluminum (Al). The second contact layer 131 may be composed of a single layer or multiple layers. The second contact layer 131 may also be configured to form an ohmic contact with the second conductive type semiconductor layer 129.

The second contact layer 131 may be formed before or after the formation of the plurality of contact holes 130a.

Referring to FIGS. 20A and 20B, a first insulation layer 133 is formed to cover the second contact layer 131. The first insulation layer 133 may cover the side surface of each of the light emitting cells S1, S2 while covering the sidewalls of the plurality of contact holes 130a. Here, the first insulation layer 133 may have openings 133a, which expose the first conductive type semiconductor layer 125 in the plurality of contact holes 130a.

The first insulation layer 133 may be composed of a single layer or multiple layers, such as a silicon oxide or silicon nitride film. In addition, the first insulation layer 133 may be composed of a distributed Bragg reflector, which is formed by alternately stacking insulation layers having different indices of refraction. For example, the first insulation layer 133 may be formed by alternately stacking $SiO_2/TiO_2$ or $SiO_2/Nb_2O_5$. Further, the first insulation layer 133 may be formed to provide a distributed Bragg reflector having high reflectivity over a wide wavelength range of blue, green, and red light by adjusting the thickness of each of the insulation layers.

Referring to FIGS. 21A and 21B, a first contact layer 135 is formed on the first insulation layer 133. The first contact layer 135 is formed on each of the light emitting cells S1, S2, and includes contact sections 35a contacting the first conductive type upper semiconductor layer 125 exposed in the contact holes 130a and a connecting section 135b connecting the contact sections 135a to each other. The first contact layer 135 may be composed of a reflective metal layer, but is not limited thereto.

The first contact layer 135 is formed on some regions of each of the light emitting cells S1, S2, so that the first insulation layer 133 is exposed at other regions of the semiconductor stack 130 where the first contact layer 135 is not formed.

Referring to FIGS. 22A and 22B, a second insulation layer 137 is formed on the first contact layer 135. The second insulation layer 137 may be composed of a single layer or multiple layers, such as a silicon oxide or silicon nitride film. Alternatively, the second insulation layer 137 may be composed of a distributed Bragg reflector, which is formed by alternately stacking insulation layers having different indices of refraction.

The second insulation layer 137 may cover the first contact layer 135 while covering the first insulation layer 133. The second insulation layer 137 may also cover the side surface of the each of the light emitting cells S1, S2. In addition, the second insulation layer 137 may fill in the chip separation region 130c and the cell separation region 130b.

The second insulation layer 137 has an opening 137a which exposes the first contact layer 135 of each of the light emitting cells S1, S2. Further, the second insulation layer 137 and the first insulation layer 133 are formed with an opening 137b, which exposes the second contact layer 131.

Referring to FIGS. 23A and 23B, a connector 139c and first and second electrode pads 139a, 139b are formed on the second insulation layer 137. The first electrode pad 139a is connected to the first contact layer 135 of a first light emitting cell S1 through the opening 137a and the second electrode pad 139b is connected to the second contact layer 131 of a second light emitting cell S2 through the opening 137b. Further, the connector 139c connects the first contact layer 135 and the second contact layer 131 of adjacent light emitting cells S1, S2 to each other in series through the openings 137a, 137b.

Figures 24, 25:
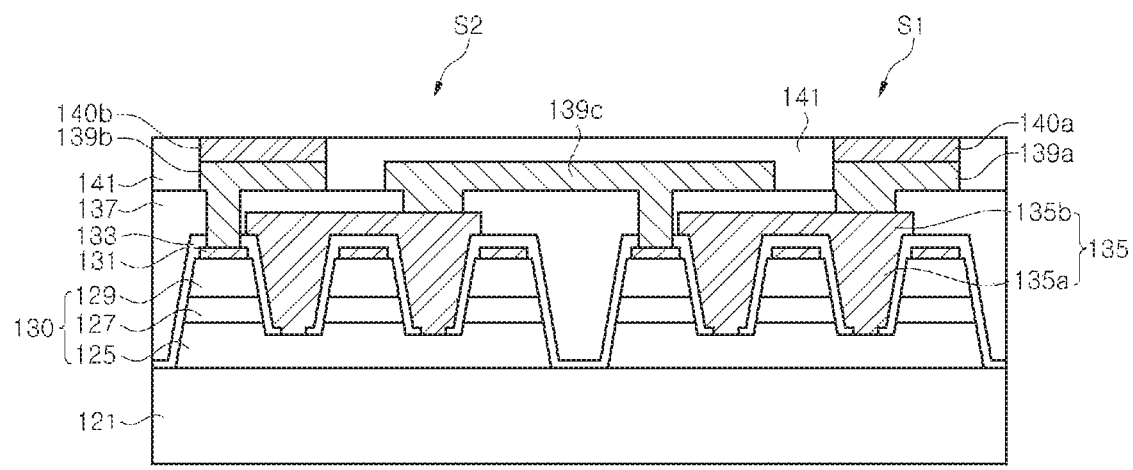

Referring to FIG. 24, a third insulation layer 141 is formed on the first and second electrode pads 139a, 139b and the connector 139c. The third insulation layer 141 covers the first and second electrode pads 139a, 139b and the connector 139c, and has grooves which expose upper surfaces of the electrode pads 139a, 139b. Meanwhile, the third insulation layer 141 may have additional metal layers 140a, 140b formed in the grooves thereof. The additional metal layers 140a, 140b increase the height of the electrode pads 139a, 139b, such that final electrode pads may have a greater height than the connector 139c. The additional metal layers 140a, 140b may be formed before the formation of the third insulation layer 141. Upper surfaces of the additional metal layers 140a, 140b may be substantially coplanar with an upper surface of the third insulation layer 141.

Referring to FIG. 25, a patterned insulation layer 143 is formed on the third insulation layer 141. The patterned insulation layer 143 has grooves, which expose the upper side of the first and second electrode pads 139a, 139b, for example, the additional metal layers 140a, 140b. Further, the patterned insulation layer 143 may have a groove exposing the third insulation layer 141 between the first electrode pad 139a and the second electrode pad 139b.

Then, first and second bumps 145a, 145b are formed in the grooves of the insulation layer 143 and a dummy bump 145c may be formed between the first and second bumps.

The bumps may be formed by plating, for example, electroplating. As needed, a seed layer for plating may also be formed.

After the first and second bumps 145a, 145b are formed, the insulation layer 143 may be removed. For example, the insulation layer 143 may be formed of a polymer such as photoresist and may be removed after the bumps are formed. Alternatively, the insulation layer 143 may remain to protect the side surfaces of the first and second bumps 145a, 145b.

Referring to FIG. 26, the growth substrate 121 is removed and a wavelength convertor 151 is attached to the light emitting cells S1, S2. The growth substrate 21 may be removed by an optical technique such as laser lift-off (LLO), mechanical polishing or chemical etching.

Then, the exposed surface of the first conductive type semiconductor layer 125 is subjected to anisotropic etching such as PEC etching to form a roughened surface on the exposed first conductive type semiconductor layer 125.

Meanwhile, the wavelength convertor 151, such as a phosphor sheet containing phosphors, may be attached to the first conductive type semiconductor layer 125.

Alternatively, the growth substrate 121 may contain an impurity for converting a wavelength of light generated in the active layer 127. In this case, the growth substrate 121 may be used as the wavelength convertor 151.

Then, the LED package structure is divided into individual packages along the chip separation region 130c, thereby providing finished LED packages 300. At this time, the second insulation layer 137 is cut together with the wavelength convertor 151 so that cut planes thereof can be formed in a line.

FIG. 27 is a sectional view explaining a method of fabricating the LED package 400 according to the fourth exemplary embodiment of the disclosed technology.

Referring to FIG. 27, in the method of fabricating the LED package 400 according to this embodiment, the processes until the third insulation layer 141 and the additional metal layers 140a, 1140b are formed are the same as those of the method of fabricating the LED package 300 described above (FIG. 24).

In the present exemplary embodiment, the substrate 161 is bonded to the third insulation layer 141. The substrate 161 may have through-holes, in which the first and second bumps 165a, 165b may be formed. Further, the first and second bumps 165a, 165b may be formed at distal ends thereof with pads (not shown). In addition, the substrate 161 may have grooves partially formed on a lower surface thereof and filled with a metallic material 165c. The metallic material 165c improves substrate heat dissipation.

Alternatively, the substrate 161 having the first and second bumps 165a, 165b may be separately prepared and bonded to a wafer having the first and second electrode pads 139a, 139b. The first and second bumps 165a, 165b may be electrically connected to first and second electrode pads 139a, 139b, respectively.

Then, as described with reference to FIG. 26, the growth substrate 121 is removed and the wavelength convertor 151 may be attached to the light emitting cells S1, S2, followed by division of the LED package structure into individual LED packages. As a result, the finished LED packages 400 as described in FIG. 15 are provided.

As discussed above referring to FIGS. 1 to 27, the disclosed technology provides various examples of the protective insulation designs in consideration of aspects regarding dividing the monolithically formed LED package regions grown on a wafer for further processing. When the divided LED package regions are not properly protected, this dividing operation can expose the diced LED packages to the surrounding environment in subsequent processes such as mounting each individual LED package on a circuit board, forming electrical contacts to the mounted circuit board and placing a covering molding member and other steps to form final LED devices. An unprotected diced LED package can be inadvertently contaminated by external environmental factors and such contamination can cause the LED layers or structure to deteriorate and adversely affect the device operation, device performance and/or device lifetime, especially considering that LED package devices may operate under high voltages or currents and at elevated high temperatures.

In one example of the protective insulation design as discussed above, a protective insulation structure is formed together with the semiconductor stack 30 during wafer-level fabrication of the semiconductor stack for the LED package 100 to include external parts of the first and second insulation layers 33 and 37 and the external part of the insulation layer 43 to surround and cover the entire side wall surfaces of the LED package 100 below the wavelength converter 51 to protect, the semiconductor stack 30 and the underlying electrical contact parts (35b, 39a, 39b, 45a and 45b) from an external environment. Specifically, the disclosed protective insulation layer designs are built into the wafer-level structures to have built-in protection as an individual protective cage or structure for surrounding each LED package region on a wafer from external environmental factors. This protective structure for each LED package region is formed as part of the wafer-level fabrication for forming the LED semiconductor stacks and other structures in each LED package region and thus co-exist with each LED package region at all times and will protect the LED package region during dicing the wafer level structure into individual LED packages or chips, in the subsequent packaging processes, and during the normal use of the LED package device after the fabrication. Therefore, the disclosed protective insulation layer designs protect the individual LED packages or devices in both fabrication phase and the product use phase.

In another example of the protective insulation design as discussed above, to prevent the first and second electrode pads 39a, 39b from being exposed to the outside, a use of an insulation layer 49 is introduced to cover side surfaces and bottom surfaces of the first and second electrode pads 39a, 39b. The insulation layer 49 may have openings, which expose the first and second electrode pads 39a, 39b, and additional metal layers 67a, 67b are then formed in the openings. The external parts of the insulation layer 49 is located between the insulation layer 37 and the insulation substrate 61. Therefore, the protective insulation structure shown in colored parts of the insulation layers 33, 37, and 49 and the insulation substrate 61 provides built-in protection as an individual protective cage for each LED package region on a wafer from external environmental factors.

In another aspect, the disclosed technology discloses built-in heat dissipation bumps that are distinct from the electrical bumps, e.g., the bump 45c between the electrical bumps 45a and 45b in FIG. 1, the bump 145c between the electrical bumps 145a and 145b in FIG. 14, and bumps 165c between the electrical bumps 165a and 165b in FIG. 15. The bumps 45c, 65c and 165c are electrically "dummy" bumps that do not function as electrical paths or connections but are provided to dissipate heat generated in the LED packages. In some LED package designs, such as the examples in FIGS. 1, 14 and 15, the built-in heat dissipation bumps can be implemented along with the protective insulation structure designs to improve the performance of the LED packages FIG. 28A is a schematic sectional view of an LED package 500 according to a fifth exemplary embodiment of the disclosed technology, particularly, an LED package suitable for emission of UV light.

Figure 28A:
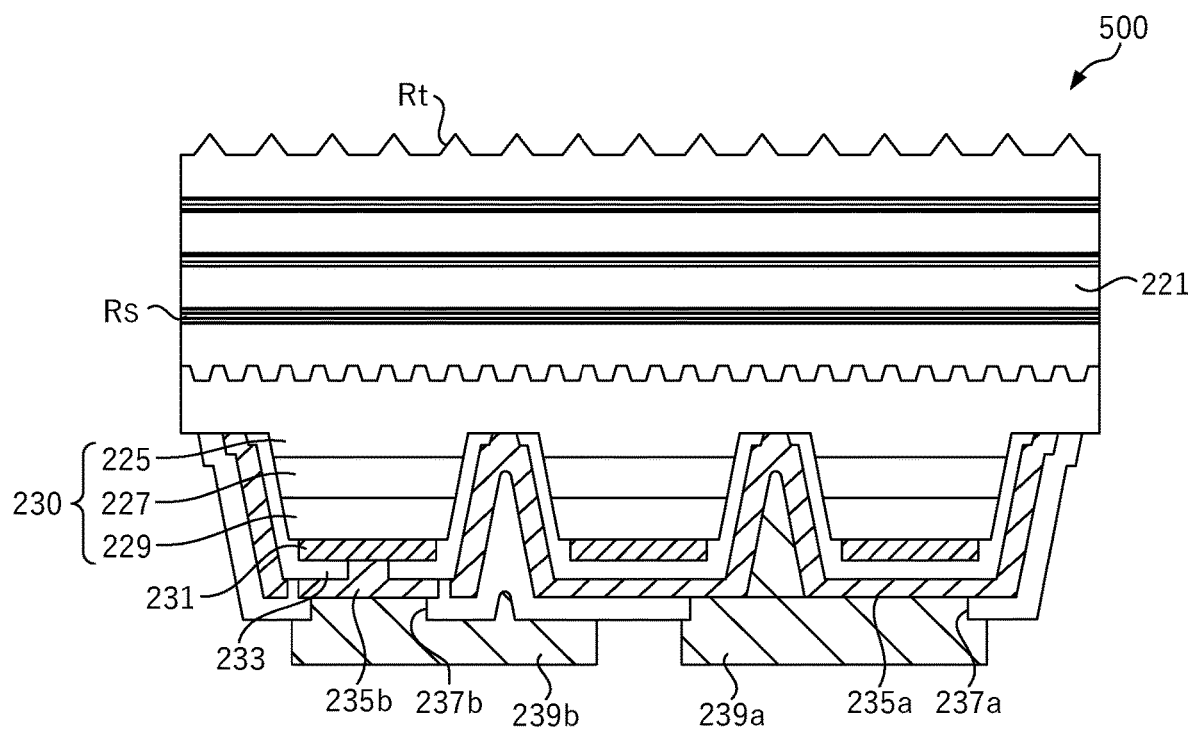
FIG. 28A and FIG. 28B are schematic sectional views of a light emitting diode package according to a first exemplary embodiment of the disclosed technology.

Referring to FIG. 28A, the LED package 500 includes a semiconductor stack 230, a first contact layer 235a, a second contact layer 231, a first insulation layer 233, a second insulation layer 237, a first electrode pad 239a, and a second electrode pad 239b. Further, the LED package 500 may include a substrate 221 and an intermediate connection layer (interconnection layer) 235b.

The substrate 221 is a growth substrate that allows growth of III-N-based compound semiconductors thereon, and may include, for example, a sapphire substrate, a patterned sapphire substrate, or an AlN substrate. The substrate 221 may have a thickness of 150 µm or more, specifically 300 µm or more, more specifically 400 µm or more. Heat capacity of the substrate 221 increases with increasing thickness thereof, thereby improving heat dissipation of the LED package.

The substrate 221 may have a roughened surface Rt on an upper surface thereof and a roughened surface Rs on a side surface thereof. The roughened surface Rt may be formed in a regular pattern or in an irregular pattern. The roughened surface Rs may be formed to surround the substrate in a band shape along the side surface of the substrate. Further, the substrate 221 may have a plurality of roughened surface bands arranged on the side surface thereof. The roughened surfaces Rt and Rs improve light extraction efficiency through reduction of light loss due to total internal reflection.

The semiconductor stack 230 is located under the substrate 221. The semiconductor stack 230 includes a first conductive type upper semiconductor layer 225, an active layer 227 and a second conductive type lower semiconductor layer 229. A mesa M (FIG. 32) or M' (FIG. 39) is located under the first conductive type upper semiconductor layer 225 and includes the lower semiconductor layer 229 and the active layer 227. The mesa M or M' may further include a portion of the upper semiconductor layer 225. In addition, the mesa M or M' is disposed inside a region surrounded by an edge of the first conductive type semiconductor layer 225. Accordingly, a lower surface of the upper semiconductor layer 225 is exposed along the circumference of the mesa (M or M'). The active layer 227 is interposed between the upper and lower semiconductor layers 225, 229.

Each of the upper and lower semiconductor layers 225 and 229 may be composed of a single layer or multiple layers. For example, the upper semiconductor layer 225 may include an AlN buffer layer and a contact layer, and may further include a superlattice layer between the AlN buffer layer and the contact layer. The AlN buffer layer may have a thickness of about 2 µm or more. In some exemplary embodiments, the upper semiconductor layer 225 may have unevenness on an upper surface thereof at the substrate 221 side.

The lower semiconductor layer 229 may include a contact layer and an electron blocking layer. The lower semiconductor layer 229 may have a wider band-gap than well layers of the active layer 227 to allow light generated in the active layer 227 to pass therethrough. In some exemplary embodiments, the lower semiconductor layer 229 may include a layer having a narrower band-gap than the well layers of the active layer 227 in order to absorb light generated in the active layer 227. To this end, the lower semiconductor layer 229 may include a layer which has a greater Ga content or a smaller Al content than the well layers of the active layer 227. In this exemplary embodiment, the active layer 227 may have a single quantum-well structure or a multi-quantum well layer structure. Preferably, the first conductive type is an n type and the second conductive type is a p type.

The active layer 227 and the upper and lower semiconductor layers 225 and 229 may be formed of III-N-based compound semiconductors, for example, (Al, Ga, In)N, suitable for emission of light having a predetermined wavelength, for example, UV light. The active layer 227 may emit light having a wavelength of, for example, 405 nm or less, specifically 385 nm or less, more specifically 365 nm or less. For example, the active layer 227 may have a composition of GaN, InGaN, AlGaN or AlInGaN. In the III-N-based compound semiconductor, the wavelength of light emitted from the active layer decreases with increasing content of Al and increases with increasing content of In. On the other hand, the upper semiconductor layer 225 has a composition that allows light emitted from the active layer 227 to pass therethrough. Considering full width at half maximum of light emitted from the active layer 227, the upper semiconductor layer 225 is formed of a III-N-based compound semiconductor that allows light having a wavelength 10 nm or more shorter than peak wavelengths of light emitted from the active layer 227 to pass therethrough. Accordingly, the upper semiconductor layer 225 may have a higher Al content than the active layer 227. The active layer 227 and the upper and lower semiconductor layers 225 and 229 will be described below in more detail with reference to FIG. 31.

The semiconductor stack 230 includes a plurality of bays 230a (see FIG. 32) that exposes the first conductive type upper semiconductor layer 225 through the second conductive type lower semiconductor layer 229 and the active layer 227. Alternatively, the semiconductor stack 230 includes a plurality of through-holes 230a' (see FIG. 39) that exposes the first conductive type upper semiconductor layer 225 through the second conductive type lower semiconductor layer 229 and the active layer 227. The bays 230a or the through-holes 230a' may be formed together with the mesa M (see FIG. 32) or M' (see FIG. 39). Referring to FIG. 32, the first conductive type upper semiconductor layer 225 is exposed on multiple portions including sides of the semiconductor stack 230. The following description will be given with reference to the mesa M (see FIG. 32) having the bays 230a.

Referring to FIG. 28A again, the second contact layer 231 contacts the second conductive type lower semiconductor layer 229. The second contact layer 231 may be formed of any material so long as the material of the second contact layer can form ohmic contact with the second conductive type lower semiconductor layer 229. Furthermore, the second contact layer 231 may be composed of a single layer or multiple layers and may include a transparent conductive layer or a reflective metal layer.

Figure 28B:
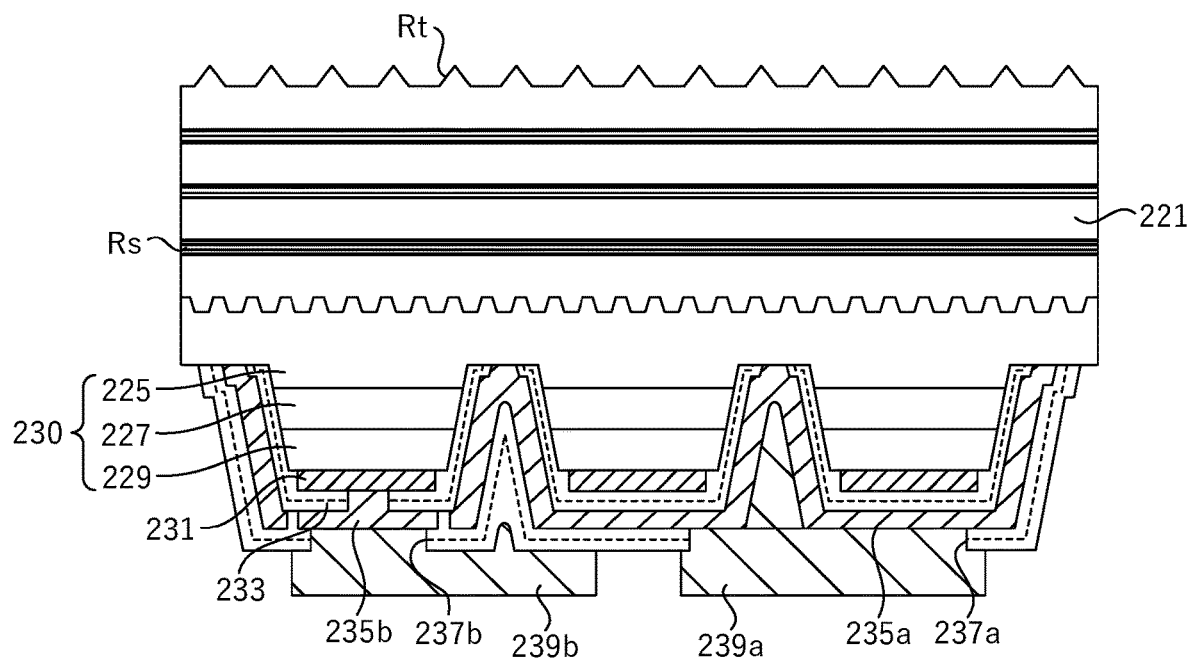

The first insulation layer 233 covers the second contact layer 231. In addition, the first insulation layer 233 covers a portion of the semiconductor stack exposed to the bays 230a, that is, a sidewall of the mesa M, and an outer side surface of the mesa M. On the other hand, the first insulation layer 233 includes at least one opening that partially exposes the second contact layer 231. The first insulation layer 33 may be composed of a single layer or multiple layers of an insulation material, such as silicon oxide or silicon nitride. FIG. 28B shows an example that the first insulation layer 233 includes multiple layers. In some exemplary embodiments, the first insulation layer 33 may be a distributed Bragg reflector, which is formed by alternately stacking insulation layers having different indices of refraction, for example, $SiO_2/TiO_2$ or $SiO_2/Nb_2O_5$.

The first contact layer 235a is located under the first insulation layer 233 and contacts the first conductive type upper semiconductor layer 225 exposed to the bays 230a. Furthermore, the first contact layer 235a contacts the first conductive type semiconductor layer 225 along the outer periphery of the mesa M, that is, along an edge of the first conductive type semiconductor layer 225. The first contact layer 235a may also partially overlap the second contact layer 231. Since the first contact layer 235a contacts not only the bays 230a but also the outer periphery of the mesa M (see FIG. 32), the semiconductor stack can facilitate current spreading.

The first contact layer 235 is insulated from the second contact layer 231 by the first insulation layer 233, and is also insulated from the second conductive type lower semiconductor layer 229 and the active layer 227 exposed to the sidewall of the mesa M. The first contact layer 235 is formed under some regions of the first insulation layer 233 and may be composed of a reflective metal layer.

The interconnection layer 235b contacts the second contact layer 231 through the opening of the first insulation layer 233. The interconnection layer 235b may be formed of the same material as the first contact layer 235a and may be disposed at the same level as the first contact layer 235a. In this exemplary embodiment, the interconnection layer 235b is separated from the first contact layer 235a such that the first contact layer 235a is insulated from the second contact layer 231. As in the above exemplary embodiments, the interconnection layer 235b may also be omitted.

The second insulation layer 237 is located under the first contact layer 235a to cover the first contact layer 235a and has an opening 237a that exposes the first contact layer 235a. Further, the second insulation layer 237 covers the interconnection layer 235b and has an opening 237b that exposes the interconnection layer 235b. In the structure wherein the interconnection layer 235b is omitted, the second insulation layer 237 may have an opening that exposes the second contact layer 231. Furthermore, the second insulation layer 237 may cover the first insulation layer 233 and a side surface of the semiconductor stack 230, that is, a side surface of the mesa M. The second insulation layer 237 may be composed of a single layer or multiple layers, and may be composed of a distributed Bragg reflector. FIG. 28B shows an example that the second insulation layer 237 includes multiple layers.

The first electrode pad 239a and the second electrode pad 239b are located under the second insulation layer 237. The first electrode pad 239a may be connected to the first contact layer 235a through the opening 237a of the second insulation layer 237. In addition, the second electrode pad 239b may be connected to the interconnection layer 235b through the opening 237b of the second insulation layer 237 and thus connected to the second contact layer 231. In the structure wherein the interconnection layer 235b is omitted, the second electrode pad 239b may be directly connected to the second contact layer 231.

According to this exemplary embodiment, the LED package may omit the first bump and the second bump unlike the above exemplary embodiments. Alternatively, the first and second bumps may be disposed on the first electrode pad 239a and the second electrode pad 239b, respectively.

According to this exemplary embodiment, the first contact layer 235a is connected not only to the bays 230a, but also to the first conductive type semiconductor layer 225 at the outer periphery of the mesa M, thereby providing a light emitting diode package capable of achieving uniform current spreading.

Figure 29:
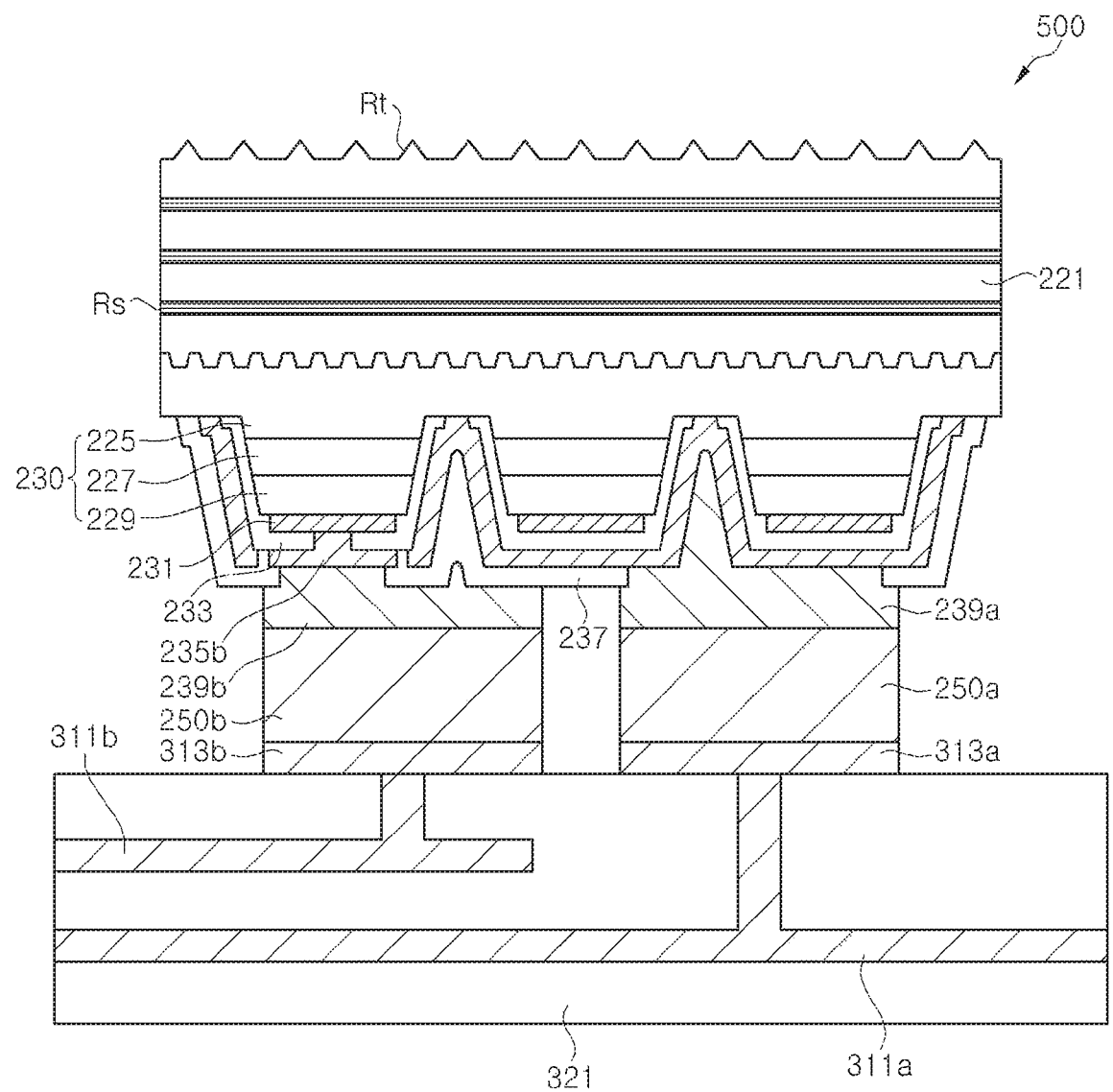
FIG. 29 is a schematic sectional view of a light emitting diode module including the light emitting diode package according to the fifth exemplary embodiment of the disclosed technology mounted on a printed circuit board.

FIG. 29 is a schematic sectional view of the LED package 500 mounted on a printed circuit board.

Referring to FIG. 29, the LED package 500 is connected to a circuit board 321 through first and second bumps 250a, 250b. The first and second bumps 250a, 250b may be provided to the first and second electrode pads 239a, 239b of the LED package 500, or may be provided to the circuit board 321. The circuit board 321 may be an MC-PCB or a ceramic PCB. FIG. 29 schematically shows the ceramic PCB.

The first bump 250a and the second bump 250b are connected to lower sides of the first and second electrode pads 239a and 239b, respectively. The first bump 250a and the second bump 250b may be formed by plating. Each of the first and second bumps 250a and 250b may be a metal bump and may be composed of a single layer of Sn, AuSn, Au or NiSn, or multiple layers of two or more thereof. The first electrode pad 239a and the second electrode pad 239b may be formed at the same level, and thus may be respectively connected to the first electrode pad 239a and the second electrode pad 239b at the same height.

In this exemplary embodiment, side surfaces of the first bump 250a and the second bump 250b may be exposed to the outside or may be covered with fillers.

The ceramic PCB 321 may have pads 313a and 313b disposed on a surface thereof and include circuit interconnections 311a and 311b therein. The circuit interconnection lines are embedded in the ceramic PCB by a ceramic material.

FIG. 30 is a schematic sectional view of an LED module including a plurality of LED packages according to the fifth exemplary embodiment of the disclosed technology.

Referring to FIG. 30A, the LED module includes a circuit board 321, the LED package 500, and a lens (or light guide part) 381. The circuit board 321 may be, for example, an MC-PCB or a ceramic PCB and has connection pads 313a, 313b on which the LED package 500 is mounted. The first and second electrode pads 239a and 239b (FIG. 28A) of the LED package 500 are directly connected to the connection pads 313a and 313b or connected thereto via the first and second bumps 250a and 250b (FIG. 29).

A plurality of LED packages 500 may be mounted on the circuit board 321 and the light guide part 381 is disposed on the LED packages 500 to regulate optical characteristics such as beam angle by guiding light emitted from the LED packages 500.

An LED module shown in FIG. 30B is generally similar to the LED module described with reference to FIG. 30A except that a reflector 391 is disposed on the circuit board 321. The reflector 391 reflects light emitted from the LED packages 500 to improve luminous efficacy.

As in the LED module shown in FIG. 30B, each of the LED modules according to the exemplary embodiments of FIG. 3 and FIG. 16 may also include a reflector on the circuit board 71 or 171.

Next, a method of fabricating the LED module according to the fifth exemplary embodiment will be described in detail with reference to FIG. 31 to FIG. 38. The structure of the LED package shown in FIG. 28A will become more apparent by the following description.

Figure 31:
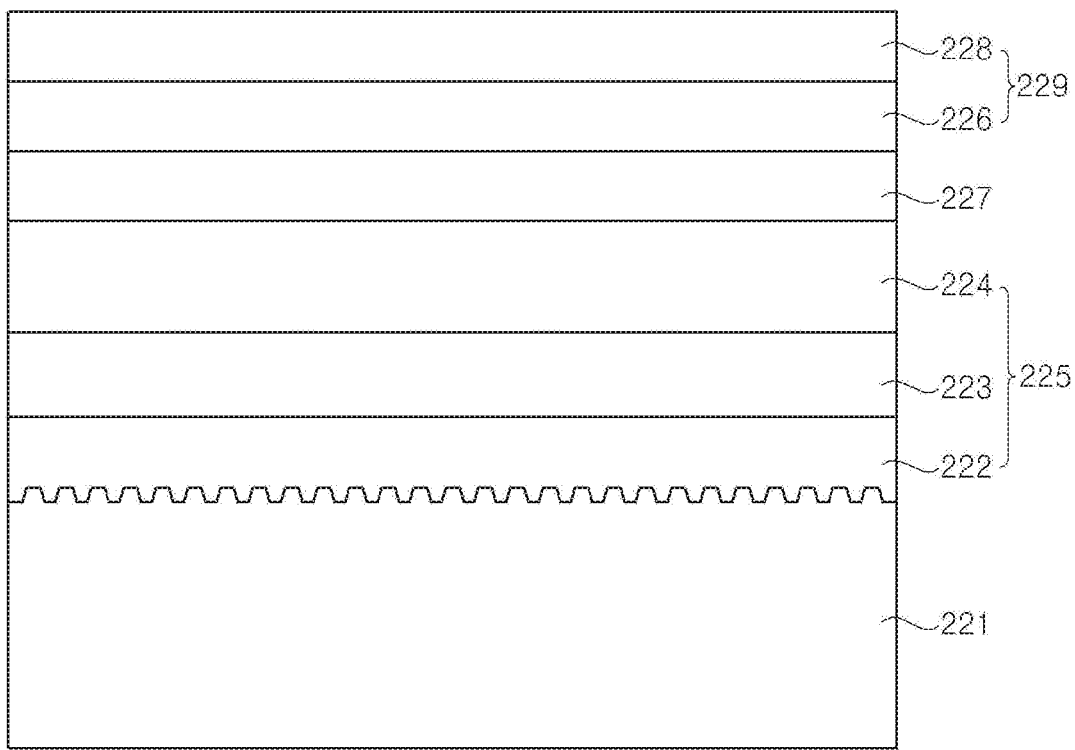

Referring to FIG. 31, a semiconductor stack 230, which includes a first conductive type semiconductor layer 225, an active layer 227 and a second conductive type semiconductor layer 229, is formed on a growth substrate 221. The growth substrate 221 may be a sapphire substrate or an AlN substrate, without being limited thereto. Alternatively, the growth substrate may be a heterogeneous substrate. Specifically, the growth substrate 221 may be a patterned sapphire substrate having a predetermined pattern formed on a surface thereof, as shown in FIG. 31. Although the growth substrate 221 is illustrated as having a size corresponding to a single LED package in FIG. 31, it will be understood by those skilled in the art that the growth substrate 221 may have a size of 2 inches, 4 inches or 6 inches and is finally divided into individual LED packages through a process of fabricating an LED package.

Each of the first and second conductive type semiconductor layers 225, 229 may be composed of a single layer or multiple layers. As shown in FIG. 31, the first conductive type semiconductor layer 225 may include an AlN buffer layer 222 and a contact layer 224, and may further include a superlattice layer between the AlN buffer layer 222 and the contact layer 224. Further, the second conductive type semiconductor layer 229 may include an electron blocking layer 226 and a contact layer 228. The active layer 227 may have a single quantum-well structure or a multi-quantum well layer structure.

These compound semiconductor layers may be formed of III-N-based compound semiconductors and may be grown on the growth substrate 221 by metal organic chemical vapor deposition (MOCVD) or molecular beam epitaxy (MBE).

Referring to FIGS. 32A and 32B mesa M is formed on the first conductive type semiconductor layer 225 by patterning the semiconductor stack 230. The mesa M has bays 230a which expose the first conductive type semiconductor layer 225. The bays 230a may be formed in various shapes. As shown in FIG. 32A, the bays 230a may be formed symmetrical to each other, without being limited thereto. On the other hand, the first conductive type semiconductor layer 225 is also exposed to surroundings of the mesa M. The mesa M may have an inclined sidewall as shown in FIG. 32B. That is, the mesa M may have a shape, the width of which gradually decreases from the first conductive type semiconductor layer 225 side towards the second conductive type semiconductor layer 229 side. The semiconductor stack 230 may be subjected to patterning through a photolithography and etching process.

Figure 39:
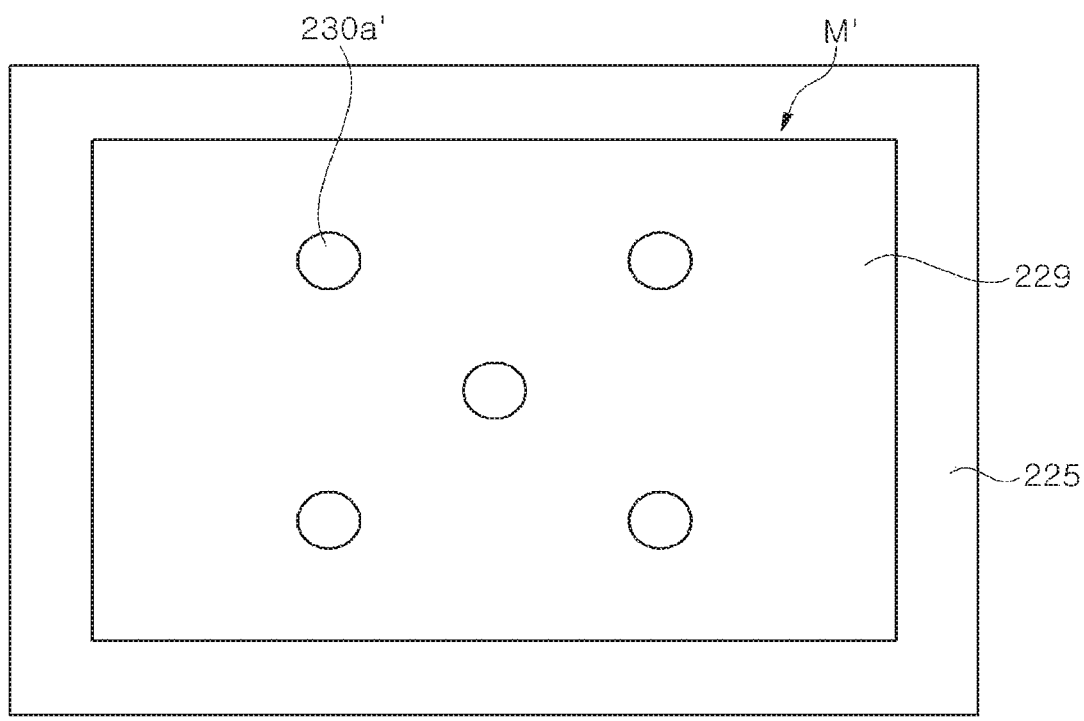
FIG. 39 is a schematic plan view of modification of the light emitting diode package according to the fifth exemplary embodiment of the disclosed technology.

In this exemplary embodiment, the bays 230 are joined to each other in a peripheral region of the mesa M. However, it should be understood that the disclosed technology is not limited to the mesa M including the bays 230a. Alternatively, as shown in FIG. 39, the semiconductor stack 230 may include a mesa M' having contact holes 230a'. In this exemplary embodiment, the first conductive type semiconductor layer 225 is also exposed to surroundings of the mesa M'.

Referring to FIGS. 33A and 33B, a second contact layer 231 is formed on the second conductive type semiconductor layer 229. The second contact layer 231 is formed on the mesa M excluding a region corresponding to the bays 230a. The second contact layer 231 may include a transparent conductive oxide layer, such as ITO, or a reflective metal layer, such as Ag or Al, and may be composed of a single layer or multiple layers. The second contact layer 231 forms ohmic contact with the second conductive type semiconductor layer 229.

The second contact layer 231 may be formed after formation of the bays 230a, without being limited thereto. Alternatively, the second contact layer 231 may be formed before formation of the bays 230a.

Referring to FIGS. 34A and 34B, a first insulation layer 233 is formed to cover the second contact layer 231. The first insulation layer 233 may cover an outer side surface of the mesa M, and may also cover a sidewall of the mesa M exposed to the bays 230a. In this exemplary embodiment, the first insulation layer 233 has openings 233a exposing the first conductive type semiconductor layer 225 inside the bays 230a and openings 233b formed on the mesa M and exposing the second contact layer 231, and exposing a region between the mesa M and an edge of the first conductive type semiconductor layer 225. The openings 233b may be located near one side of the mesa M, without being limited thereto.

The first insulation layer 233 may be composed of a single layer or multiple layers of an insulation material such as silicon oxide or silicon nitride. Furthermore, the first insulation layer 233 may be composed of a distributed Bragg reflector formed by alternately stacking insulation layers having different indices of refraction. For example, the first insulation layer 233 may be formed by repeatedly stacking $SiO_2/TiO_2$ or $SiO_2/Nb_2O_5$ layers. In some exemplary embodiments, a distributed Bragg reflector having high reflectivity with respect to light traveling at various incidence angles may be formed by adjusting thickness of each of insulation layers constituting the first insulation layer 233.

Referring to FIGS. 35A and 35B, a first contact layer 235a is formed on the first insulation layer 233. The first contact layer 235a contacts the first conductive type semiconductor layer 225 disposed inside the bays 230a and exposed to the surroundings of the mesa M. Furthermore, the first contact layer 235a covers an upper side of the mesa M.

An interconnection layer 235b may be formed to be separated from the first contact layer 235a. As shown in FIG. 35A, the interconnection layer 235b may be surrounded by the first contact layer 235a. Furthermore, the interconnection layer 235b may be connected to the second contact layer 231 through the openings 233b of the first insulation layer 233. The first contact layer 235a and the interconnection layer 235b may be formed together using the same material through the same process, and may include, for example, a reflective metal layer.

Although the first contact layer 235a and the interconnection layer 235b are formed together in this exemplary embodiment, the interconnection layer 235b may also be omitted as in the above exemplary embodiments. However, when the interconnection layer 235b located at the same level as the first contact layer 235a is used, a process after formation of the first contact layer 235a can be further facilitated.

Referring to FIGS. 36A and 36B, a second insulation layer 237 is formed on the first contact layer 235a and the interconnection layer 235b. The second insulation layer 237 may be composed of a single layer or multiple layers of an insulation material such as silicon oxide or silicon nitride, and may be composed of a distributed Bragg reflector formed by alternately stacking insulation layers having different indices of refraction.

The second insulation layer 237 converse the first contact layer 235a and the interconnection layer 235b and has openings 237a, 237b exposing the first contact layer 235a and the interconnection layer 235b, respectively. Furthermore, the second insulation layer 237 covers the first contact layer 235a on the sidewall of the mesa M while covering an edge of the substrate 221 around the mesa M. Accordingly, the first contact layer 235a is covered and protected by the second insulation layer 237 in a region excluding the openings 237a, 237b.

Referring to FIGS. 37A and 37B, first and second electrode pads 239a, 239b are formed on the second insulation layer 237. The first electrode pad 239a is connected to the first contact layer 235a through the opening 237a and the second electrode pad 239b is connected to the interconnection layer 235b through the opening 237b and is electrically connected to the second contact layer 231.

The first electrode pad 239a and the second electrode pad 239b are separated from each other and each of the first and second electrode pads 239a, 239b may have a relatively wide area, for example, an area of less than half an area of the LED package to ⅓ the area of the LED package or more.

Referring to FIGS. 38A and 38B, roughened surfaces Rt and Rs are formed on an upper surface and a side surface of the growth substrate 221 and the substrate 221 is divided into individual LED packages.

The roughened surface Rt may be formed by wet etching or dry etching the upper surface of the growth substrate 221. For example, a mask pattern is formed using, for example, SiO$_2$, and is used as an etching mask to form the roughened surface through dry etching or wet etching.

On the other hand, the roughened surface Rs may be formed in a band shape on a side surface of the growth substrate 221 by dividing the growth substrate 221 into individual LED packages using a laser scribing technique such as stealth laser scribing. Such roughened surfaces may be formed at various locations on the side surface of the growth substrate by changing a focus of a stealth laser, and FIG. 38B shows three roughened surfaces formed in a band shape along the side surface of the substrate 221.

As a result, individual LED packages as shown in FIG. 28A are fabricated. In FIG. 28A, the LED package is shown by rotating the LED package of FIG. 38B. In some exemplary embodiments, before division into the individual LED packages, the first and second bumps 250a, 250b may be formed on the first and second electrode pads 239a and 239b, respectively, as shown in FIG. 29.

Although the above description is given of the mesa M having the bays 230a according to this exemplary embodiment, the semiconductor stack according to another exemplary embodiment may include a mesa M' having through holes 230a', as shown in FIG. 39, instead of the bays 230a.

In this exemplary embodiment, the openings 233b of the first insulation layer 233 formed to expose the second contact layer 231 are located near one side of the mesa M, as shown in FIG. 34. However, it should be understood that the openings 233b may be formed at various locations without being limited to a particular location. FIG. 40 to FIG. 44 show modifications of the LED package according to the fifth exemplary embodiment of the disclosed technology, in which the openings 233b are arranged in various ways.

Referring to FIGS. 40A and 40B, the first insulation layer 233 is formed after formation of the mesa M and the second contact layer 231, as described with reference to FIG. 31 to FIG. 33. As described with reference to FIG. 34, the first insulation layer 233 covers the second contact layer 231, and has openings 233a exposing the first conductive type semiconductor layer 225 inside the bays 230a and openings 233b exposing the second contact layer 231. In this exemplary embodiment, the openings 233b are arrange in a different manner than the openings shown in FIG. 34. Specifically, the openings 233b are arranged on partial regions of the mesa M divided by the bays 230a (three regions in FIG. 40A). In this modification, the openings 233b may be located near one side of the partial regions of the mesa M.

Referring to FIGS. 41A and 41B, a first contact layer 235a' and an interconnection layer 235b' are formed on the first insulation layer 233, as described with reference to FIG. 35. The interconnection layer 235b' is connected to the second contact layer 231 exposed through the openings 233b of FIG. 40A and connects the openings 233b to one another. In this modification, since the interconnection layer 235b' connects the openings 233b to one another, the interconnection layer 235b' is located on the partial regions of the mesa M and regions connecting these partial regions to one another, as shown in FIG. 41A, and thus has a different shape than the interconnection layer 235b shown in FIG. 35.

On the other hand, the first contact layer 235a' surrounds the interconnection layer 235b'. The first contact layer 235a' and the interconnection layer 235b' are formed together using the same material by the same process.

Referring to FIGS. 42A and 42B, a second insulation layer 237 is formed to cover the first contact layer 235a' and the interconnection layer 235b', as described with reference to FIG. 36. The second insulation layer 237 has an opening 237a' exposing the first contact layer 235a' and an opening 237b' exposing the interconnection layer 235b'. The opening 237b' has a similar shape to the interconnection layer 235b' and may have a smaller size than the interconnection layer 235b'. The second insulation layer 237 covers and protects the first contact layer 235a' in regions excluding the openings 237a', 237b'.

Referring to FIGS. 43A and 43B, a first electrode pad 239a' and a second electrode pad 239b' are formed on the second insulation layer 237, as described with reference to FIG. 37. The first electrode pad 239a' is connected to the first contact layer 235a' through the opening 237a', and the second electrode pad 239b' is connected to the interconnection layer 235b' through the opening 237b' and is electrically connected to the second contact layer 231.

Referring to FIGS. 44A and 44B, roughened surfaces Rt and Rs are formed on the growth substrate 221 and the substrate is divided into individual LED packages, as described with reference to FIG. 38.

According to the exemplary embodiments of the disclosed technology, the LED package can achieve more efficient current spreading on the second contact layer 231 by changing arrangement of the openings 233b formed through the first insulation layer 233.

As such, the exemplary embodiments of the disclosed technology provide wafer-level LED packages which can be directly formed on a circuit board for a module without using a conventional lead frame or printed circuit board. Accordingly, the LED package may have high efficiency and exhibit improved heat dissipation while reducing time and cost for fabrication of the blue or UV LED package. In addition, an LED module having the LED package mounted thereon may have high efficiency and exhibit improved heat dissipation.

Further, the LED package may include a plurality of light emitting cells connected in series to each other and arrays connected in reverse parallel to each other. Further, the plurality of light emitting cells may be connected to a bridge rectifier and may be used to form a bridge rectifier. Therefore, the LED module including the LED package may be operated by AC power without a separate AC/DC converter.

Although the disclosed technology has been illustrated with reference to some exemplary embodiments in conjunction with the drawings, it will be apparent to those skilled in the art that various modifications and various changes can be made to the disclosed technology. Further, it should be understood that some features of a certain embodiment may also be applied to other embodiment. Therefore, it should be understood that the embodiments are provided by way of illustration only and are given to provide various implementations of the disclosed technology to facilitate understanding of the disclosed technology to those skilled in the art. Thus, it is intended that the disclosed technology covers the modifications and variations provided they fall within the scope of the appended claims and their equivalents.

What is claimed is:

1. An ultraviolet light emitting diode (UV LED) package comprising:
    an upper semiconductor layer;
    a mesa disposed under the upper semiconductor layer, having an inclined side surface, and comprising an active layer and a lower semiconductor layer, the mesa including portions protruding from the upper semiconductor layer along a first direction perpendicular to a top surface of the upper semiconductor layer and separated by a region;
    a first insulation layer covering the mesa and having an opening exposing the upper semiconductor layer and structured to include an opening;
    a first contact layer contacting the upper semiconductor layer through the opening of the first insulation layer and including a first portion disposed on the first insulation layer to contact with the first insulation layer and fill a part of the region and a second portion disposed under a second contact layer;
    the second contact layer formed between the mesa and the first insulation layer and contacting the lower semiconductor layer;
    a first electrode pad and a second electrode pad disposed under the first contact layer and electrically connected to the first contact layer and second contact layer, respectively; and
    a second insulation layer located between the first contact layer and the first and second electrode pads and including a portion filled in a remaining part of the region, wherein the active layer emits UV light having a wavelength of 405 nm or less;
    an interconnection layer disposed to contact with the second contact layer through the opening of the first insulation layer and disposed at a same level as the second portion of the first contact layer; and
    wherein the first insulation layer and the second insulation layer are in contact with the upper semiconductor layer, and
    wherein the first portion of the first contact layer is disposed between the first insulation layer and the portion of the second insulation layer along a second direction perpendicular to the first direction.

2. The UV LED package of claim 1, wherein the upper semiconductor layer comprises a greater concentration of Al than a well layer of the active layer to allow light having a wavelength 10 nm or more shorter than peak wavelengths of light emitted from the active layer to pass therethrough.

3. The UV LED package of claim 2, wherein the active layer emits UV light having a wavelength of 365 nm or less.

4. The UV LED package of claim 1, further comprising:
    a growth substrate located on the first conductive type upper semiconductor layer.

5. The UV LED package of claim 4, wherein the growth substrate has a thickness of 150 μm or more.

6. The UV LED package of claim 5, wherein the growth substrate has a thickness of 300 μm or more.

7. The UV LED package of claim 5, wherein the growth substrate has a roughened surface on an upper surface thereof.

8. The UV LED package of claim 4, wherein the upper semiconductor layer has unevenness on an upper surface thereof.

9. The UV LED package of claim 4, wherein the upper semiconductor layer comprises an AlN layer having a thickness of 2 μm or more.

10. The UV LED package of claim 9, wherein the upper semiconductor layer further comprises a superlattice layer between the AlN layer and the active layer.

11. The UV LED package of claim 1, wherein the lower semiconductor layer comprises a layer having a greater Ga concentration or a smaller Al concentration than a well layer of the active layer in order to absorb light emitted from the active layer.

12. The UV LED package of claim 1, wherein the first insulation layer is a reflector formed by stacking insulation layers having different indices of refraction.

13. The UV LED package of claim 1, wherein the first contact layer comprises a reflective metal layer.

14. The UV LED package of claim 13, wherein the first contact layer contacts the upper semiconductor layer between the mesa and an edge of the upper semiconductor layer along a periphery of the mesa.

15. The UV LED package of claim 14, wherein the first contact layer further contacts the upper semiconductor layer through bays or through-holes formed in the mesa.

16. An ultraviolet light emitting diode (UV LED) module comprising
    a circuit board having first and second pads; and
    an UV LED package mounted on the circuit board, wherein the UV package comprises:
    an upper semiconductor layer;
    a mesa disposed under the upper semiconductor layer, having an inclined side surface, and comprising an active layer and a lower semiconductor layer, the mesa including portions protruding from the upper semiconductor layer along a first direction perpendicular to a top surface of the upper semiconductor layer and separated by a region;

a first insulation layer covering the mesa and having an opening exposing the upper semiconductor layer and structured to include an opening;

a first contact layer contacting the upper semiconductor layer through the opening of the first insulation layer and including a first portion disposed on the first insulation layer to contact with the first insulation layer and fill a part of the region and fill a part of the region and a second portion disposed over a second contact layer;

the second contact layer formed between the mesa and the first insulation layer and contacting the lower semiconductor layer;

a first electrode pad and a second electrode pad disposed under the first contact layer and electrically connected to the first contact layer and second contact layer, respectively; and a second insulation layer located between the first contact layer and the first and the second electrode pads and including a portion filled in a remaining part of the region;

an interconnection layer disposed to contact with the second contact layer through the opening of the first insulation layer and disposed at a same level as the second portion of the first contact layer; and wherein the first electrode pad and the second electrode pad of the UV LED package are electrically connected to the first pad and the second pad, respectively, and wherein the first insulation layer and the second insulation layer are in contact with the upper semiconductor layer, and wherein the first portion of the first contact layer is disposed between the first insulation layer and the portion of the second insulation layer along a second direction perpendicular to the first direction.

17. The UV LED module of claim 16, wherein the circuit board is a ceramic printed circuit board having a metal interconnection line embedded therein.

18. The UV LED module of claim 16, further comprising:
a first metal bump between the first pad and the first electrode pad; and
a second metal bump between the second pad and the second electrode pad.

19. The UV LED module of claim 18, wherein each of the first and second metal bumps has a single layer or a multilayer structure formed of a material selected from the group consisting of Sn, AuSn, Au, and NiSn.

20. The UV LED module of claim 16, further comprising:
a light guide part covering the UV LED package.

21. A light emitting diode (LED) package comprising:
a semiconductor stack including a first conductive type semiconductor layer and a mesa structure located between a first sidewall and a second sidewall of the mesa structure and including portions protruding from the first conductive type semiconductor layer along a first direction perpendicular to a top surface of the first conductive type semiconductor layer and including corresponding portions of a second conductive type semiconductor layer and an active layer interposed between the first and second conductive type semiconductor layers, wherein the first and second sidewalls of the mesa structure are outermost sidewalls of the mesa structure and the mesa structure is structured to expose the first conductive type semiconductor layer on an exterior contact region of the semiconductor stack located on a periphery of the mesa structure and to expose the first conductive type semiconductor layer on an interior contact region located between the portions of mesa structure;

a first electrical contact disposed to contact the first conductive type semiconductor layer on the exterior contact region of the semiconductor stack and to provide a first electrical contact path to the semiconductor stack, the first electrical contact including a first portion disposed to contact the first conductive type semiconductor layer at the interior contact region and a second portion disposed over a second electrical contact;

the second electrical contact disposed to contact the second conductive type semiconductor layer and to provide a second electrical contact path to the semiconductor stack;

an inner insulation layer formed on the exterior contact region of the semiconductor stack to cover the first and second sidewalls to protect the semiconductor stack from an external environment, the inner insulation layer disposed to cover the mesa and in contact with the first electrical contact at the interior contact region and structured to include an opening;

an outer insulation layer formed to cover a side surface of the inner insulation layer and including a portion disposed between portions of the mesa structure to contact the portion of the first electrical contact; and an interconnection layer disposed to contact with the second electrical contact layer through the opening of the inner insulation layer and disposed at a same level as the second portion of the first electrical contact, and wherein the inner insulation layer, the first electrical contact, and the outer insulation layer are located in the exterior contact region.

22. The LED package of claim 21, wherein the external sidewall of the semiconductor stack is inclined.

23. The LED package of claim 21, wherein the first electrical contact is disposed between the inner insulation layer and the outer insulation layer.

24. The LED package of claim 21, wherein the inner insulation layer includes a single layer including silicon oxide or silicon nitride.

25. The LED package of claim 21, wherein the inner insulation layer includes an optically reflective structure.

26. The LED package of claim 21, wherein the inner insulation layer includes a distributed Bragg reflector.

27. The LED package of claim 21, wherein the inner insulation layer includes layers of silicon oxide or silicon nitride.

28. The LED package of claim 21, wherein the inner insulation layer includes a silicon oxide layer and a distributed Bragg reflector.

29. The LED package of claim 21, wherein the inner insulation layer extends to cover the second electrical contact to protect the second electrical contact from an external environment.

30. The LED package of claim 21, wherein the outer insulation layer includes a single layer including silicon dioxide or silicon nitride.

31. The LED package of claim 21, wherein the outer insulation layer includes multiple layers.

32. The LED package of claim 21, wherein the outer insulation layer includes an optically reflective structure.

33. The LED package of claim 21, wherein the outer insulation layer includes a distributed Bragg reflector.

34. The LED package of claim 21, wherein the outer insulation layer extends to cover the first electrical contact and the second electrical contact to protect the first electrical contact and the second electrical contact from the external environment.

35. The LED package of claim 34, wherein the outer insulation layer includes phosphor materials.

36. The LED package of claim 35, wherein the first electrical contact and the second electrical contact are arranged on a first surface of the semiconductor stack and the outer insulation layer further extends to cover a second surface of the semiconductor stack opposite to the first surface.

37. The LED package of claim 21, further including:
a first bump electrically coupled to the first conductive type semiconductor layer by the first electrical contact;
a second bump electrically coupled to the second conductive type semiconductor layer by the second electrical contact; and
an additional insulation layer formed over the inner insulation layer and the outer insulation layer to cover side surfaces of the first and second bumps to protect the first and second bumps from an external environment.

38. The LED package of claim 37, wherein the additional insulation layer includes a polymer.

39. The LED package of claim 21, wherein the second conductive type semiconductor layer has a thickness smaller than that of the first conductive type semiconductor layer.

40. The LED package of claim 21, wherein the first conductive type semiconductor layer has a roughened surface.

41. A light emitting diode (LED) package comprising:
a semiconductor stack including a first conductive type semiconductor layer having a first surface and a second surface opposite to the first surface and a mesa structure including portions protruding from the first conductive type semiconductor layer along a first direction perpendicular to a top surface of the first conductive type semiconductor layer and including corresponding portions of an active layer formed on the first surface of the first conductive type semiconductor layer and a second conductive type semiconductor layer formed on the active layer, wherein the first conductive type semiconductor layer is disposed on a periphery of the mesa structure to provide an exterior contact region in which the first conductive type semiconductor layer is exposed by the active layer and the second conductive type semiconductor layer and the first conductive type semiconductor layer is structured to expose the first conductive type semiconductor layer on an interior contact region located between the portions of mesa structure;
a first insulation layer formed on a side of the semiconductor stack to cover a side surface of the semiconductor stack, the first insulation layer structured to include an opening;
a second insulation layer formed on the side of the semiconductor stack to cover a side surface of the first insulation layer, the second insulation layer covering the side surface of the semiconductor stack and including a portion disposed between the portions of the mesa structure; and
a third insulation layer formed on the side of the semiconductor stack to cover a side surface of the second insulation layer, the third insulation layer covering the side surface of the semiconductor stack,
a first electrical contact path disposed closer to the first surface of the first conductive type semiconductor layer than the second surface of the first conductive type semiconductor layer and electrically contacting with the first conductive type semiconductor layer, the first electrical contact path including a first portion disposed at the interior contact region to contact with the first insulation layer and the portion of the second insulation layer and a second portion disposed under the second conductive type semiconductor layer;
a second electrical contact path disposed closer to the first surface of the first conductive type semiconductor layer than the second surface of the first conductive type semiconductor layer and electrically contacting with the second conductive type semiconductor layer; and
an interconnection layer disposed to contact with the second electrical contact path through the opening of the first insulation layer and disposed at a same level as the second portion of the first electrical contact path, and
wherein the first insulation layer, the second insulation layer, and the third insulation layer are located in the exterior contact region.

42. The LED package of claim 41, wherein the side surface of the semiconductor stack is inclined.

43. The LED package of claim 41, wherein the first electrical contact path is provided between the first insulation layer and the second insulation layer.

44. The LED package of claim 41, wherein the first electrical contact path is provided on the sides of the semiconductor stack.

45. The LED package of claim 41, wherein the first insulation layer and the second insulation layer include a transparent insulation layer.

46. The LED package of claim 45, further comprising an optically reflective structure between the first and second insulation layers.

47. The LED package of claim 41, wherein the first insulation layer includes a transparent insulation layer and the second insulation layer includes an optically reflective structure.

48. The LED package of claim 47, wherein the optically reflective structure includes a distributed Bragg reflector.

49. The LED package of claim 47, wherein the optically reflective structure includes a distributed Bragg reflector reflecting light having wavelength corresponding to one of blue light, green light, or red light.

50. The LED package of claim 41, wherein the third insulation layer extends to cover the first electrical contact path and the second electrical contact path to protect the first electrical contact path and the second electrical contact path from the external environment.

51. The LED package of claim 41, wherein the third insulation layer includes phosphor material.

52. The LED package of claim 41, wherein the third insulation layer is free of phosphors.

53. The LED package of claim 52, further comprising an additional insulation layer formed on the side of the semiconductor stack to cover a side surface of the third insulation layer, the additional layer covering the side surface of the semiconductor stack.

54. The LED package of claim 53, wherein the additional insulation layer includes phosphor material.

55. The LED package of claim 41, further including a wavelength convertor arranged on the second surface of the first conductive type semiconductor layer and including phosphor material.

56. The LED package of claim 41, wherein the second conductive type semiconductor layer has a thickness smaller than that of the first conductive type semiconductor layer.

57. The LED package of claim 41, wherein the first surface of the first conductive type semiconductor layer has a roughness.

* * * * *